(12) United States Patent
Fuhrmann et al.

(10) Patent No.: US 8,440,840 B2
(45) Date of Patent: *May 14, 2013

(54) DYE INCLUDING AN ANCHORING GROUP IN ITS MOLECULAR STRUCTURE

(75) Inventors: Gerda Fuhrmann, Stuttgart (DE);
Gabriele Nelles, Stuttgart (DE);
Ameneh Bamedi Zilai, Stuttgart (DE);
Akio Yasuda, Tokyo (JP)

(73) Assignee: Sony Corporation, Tokyo (JP)

( * ) Notice: Subject to any disclaimer, the term of this patent is extended or adjusted under 35 U.S.C. 154(b) by 300 days.

This patent is subject to a terminal disclaimer.

(21) Appl. No.: 12/738,703

(22) PCT Filed: Oct. 27, 2008

(86) PCT No.: PCT/EP2008/009075
§ 371 (c)(1),
(2), (4) Date: Apr. 23, 2010

(87) PCT Pub. No.: WO2009/053108
PCT Pub. Date: Apr. 30, 2009

(65) Prior Publication Data
US 2010/0212737 A1  Aug. 26, 2010

(30) Foreign Application Priority Data

Oct. 25, 2007 (EP) .................................... 07020925
Apr. 23, 2008 (EP) .................................... 08007856

(51) Int. Cl.
| | |
|---|---|
| *C07F 9/02* | (2006.01) |
| *C07F 9/547* | (2006.01) |
| *C07D 209/02* | (2006.01) |
| *C07D 209/04* | (2006.01) |
| *C07D 209/12* | (2006.01) |
| *C07D 209/14* | (2006.01) |
| *C07D 209/18* | (2006.01) |
| *C08K 5/00* | (2006.01) |

(52) U.S. Cl.
USPC ........... 548/414; 548/455; 548/469; 548/494; 548/503; 548/509; 106/506; 568/381

(58) Field of Classification Search ................... 548/414, 548/455, 469, 494, 503, 509; 106/506; 568/381
See application file for complete search history.

(56) References Cited

U.S. PATENT DOCUMENTS

| | | | |
|---|---|---|---|
| 6,335,481 B1 | 1/2002 | Watanabe | |
| 6,403,807 B1 * | 6/2002 | Singh et al. .................... | 548/455 |
| 2003/0152827 A1 | 8/2003 | Ikeda et al. | |
| 2004/0099306 A1 | 5/2004 | Hara et al. | |
| 2006/0130249 A1 | 6/2006 | Ikeda et al. | |
| 2010/0300521 A1 * | 12/2010 | Fuhrmann et al. ............ | 136/256 |

FOREIGN PATENT DOCUMENTS

| | | |
|---|---|---|
| EP | 1 311 001 | 5/2003 |
| EP | 1 628 356 | 2/2006 |

OTHER PUBLICATIONS

Hara, Kohjiro et al., "Oligothiophene-Containing Coumarin Dyes for Efficient Dye-Sensitized Solar Cells", J. Phys. Chem. B, vol. 109, No. 32, pp. 15476-15482, XP002465986, ISSN: 1089-5647, Jul. 27, 2005.

Hara, Kohjiro et al., "Novel Conjugated Organic Dyes for Efficient Dye-Sensitized Solar Cells", Advanced Functional Materials, vol. 15, No. 2, pp. 246-252, XP001225432, ISSN: 1616-301X, Feb. 2, 2005.

Hara, Kohjiro et al., "Design of new coumarin dyes having thiophene moieties for highly efficient organic-dye-sensitized solar cells", New J. Chem., vol. 27, No. 5, pp. 783-785, XP008023573, ISSN: 1144-0546, Jan. 1, 2003.

Reis, L.V. et al., "New Synthetic Approach to Aminosquarylium Cyanine Dyes" Synlett, No. X, pp. 1-4, XP002499262, ISSN:0936-5214, Jan. 1, 2002.

U.S. Appl. No. 12/739,573, filed Apr. 23, 2010, Fuhrmann et al.
U.S. Appl. No. 13/123,344, filed Apr. 8, 2011, Fuhrmann et al.
Office Action dated Aug. 1, 2012 issued in corresponding EP Application No. 08 840 975.0.
Kohjiro Hara et al. "Molecular Design of Coumarin Dyes for Efficient Dye-Sensitized Solar Cells", J. Phys. Chem. B 2003, 107, pp. 597-606.

* cited by examiner

*Primary Examiner* — Nathan M Nutter
(74) *Attorney, Agent, or Firm* — Oblon, Spivak, McClelland, Maier & Neustadt, L.L.P.

(57) ABSTRACT

A dye including an anchoring group in its molecular structure, said anchoring group allowing a covalent coupling of said dye to a surface, for example a surface of a nanoporous semiconductor layer, said anchoring group being represented by formula 1 wherein attachment of said anchoring group within said molecular structure of said dye is at the terminal carbon marked with an asterisk in above formula, wherein G is selected from —COOH, —SO3H, —PO3H2, —BO2H2, —SH, —OH, —NH2, preferably —COOH, wherein A is selected from the group comprising H, —CN, —NO2, —COOR, —COSR, —COR, —CSR, —NCS, —CF3, —CONR2-OCF3, C6H5-mFm, wherein m=1-5, R being H or any straight or branched alkyl chain of general formula —CnH2n+I, n=O-12, preferably 0-4, or any substituted or non-substituted phenyl or biphenyl.

(1)

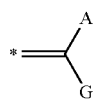

15 Claims, 20 Drawing Sheets

DYE INCLUDING AN ANCHORING GROUP IN ITS MOLECULAR STRUCTURE

The present invention relates to a dye including an anchoring group in its structure, to a method of synthesis of such dye, to an electronic device comprising such dye, and to uses of such dye.

The dye-sensitised solar cell (DSSC) (B. O'Regan and M. Grätzel, Nature 353 (1991) 737; WO 91/16719 [A]) is a photovoltaic device that offers high energy-conversion efficiencies at low cost. In contrast to the silicon-based systems, where the semiconductor assumes both the task of light absorption and charge carrier transport, in DSSCs these functions are separated. Light is absorbed by a sensitizer dye which is anchored to the surface of a semiconductor such as nanocrystalline $TiO_2$. The charge separation takes place at the interface via photo-induced electron injection from the dye into the conduction band of the semiconductor. The dye molecule is regenerated from a counter electrode via a redox couple in the electrolyte. The redox couple is regenerated in turn at the counter-electrode the circuit being completed by electron transport through the external load.

The efficiency of a DSSC is determined by the number of collected and injected photons, and thus by the light absorbed by the dye sensitizer. For high efficiencies, the ideal sensitizer should absorb efficiently over a broad range of solar spectrum. In addition, for efficient electron injection it must be able to adsorb (by chemisorption) onto the semiconductor surface. Upon photo-excitation it should inject electrons into the conduction band of the semiconductor with a quantum yield of unity. To minimize energy losses during electron transfer, the energy level of its excited state should be well matched with the lower bound of the conduction band of the semiconductor. Its redox potential should be well matched with that of the redox couple so that the dye regeneration via electron donation, is possible.

The best photovoltaic performance has so far been achieved with carboxyl groups containing polypyridyl complexes of ruthenium (known as red-dye and black-dye).[1] The photoexcitation of a Ru-complex results in an intramolecular metal-to-ligand charge-transfer (MLCT) transition. The photoexcited electrons located in the bipyridyl ligands can be very efficiently injected in the conduction band of the semiconductor via the carboxyl-anchor groups. This process has been shown to be very fast. [2] In contrast, for these complexes the recombination process between the injected electrons in $TiO_2$ and the dye-cations is a slow process. The slow recombination is considered to be a result of the large separation between semiconductor and the $R^{3+}$ by the bipyridyl ligands. Thus, the molecular design of these Ru-complexes is successful in an efficient charge separation and thus, high energy conversion efficiency. However, the energy conversion efficiency of the DSSC is limited by the light-harvesting capacity of these Ru-dyes to absorb the sunlight. The photo-active region of the photovoltaic device is reduced to the visible part of the solar spectrum, and within that, to the shorter wavelength region. The photons of the longer wavelength region are not harvested and cannot be converted to electrical energy.

To improve the overall light to electricity conversion efficiency of a solar cell the photo-response has to be extended in the longer wavelength region of the solar spectrum. Thus, new dyes with absorption bands above 600 nm are required. The synthetic modification of the commonly employed ruthenium complexes towards this goal is limited.

It is therefore desirable to develop new organic dyes which have several advantages as photo-sensitizers: a) they have intense absorption (high extinction coefficients 10-100 higher than Ru-complexes), such that little material is needed for harvesting lot of light; b) their physical properties are amenable to being modified/tuned by chemical structural modification; c) they are cheaper since they don't contain metals, such as ruthenium.

However, to achieve as high efficiencies with organic dyes as achieved with polypyridyl Ru-complexes, sophisticated molecular design as described above for the Ru-complexes is required. Although, many organic dyes such as coumarin, merocyanine and polyene dyes have already been developed for DSSCs, most dyes reported so far absorb light in the same range as the commonly used red-dye (below 600 nm).[3] Thus, photons of the longer wavelength region are still lost to photoconversion.

Accordingly, it was an object of the present invention to provide for new dyes to be used in dye-sensitized solar cells. Moreover, it was an object of the present invention to provide for easy accessible, stable and soluble functional materials with intense absorption in the visible and long wavelength region of the solar spectrum. Moreover, it was an object of the present invention to provide for photostable dyes which have intense absorption with absorption coefficients $>10^5$ L mol$^{-1}$ cm$^{-1}$ in the visible and IR-region of the solar spectrum. It was also an object of the present invention to provide for dyes which may be combined with other dyes so as to cover a broad range of the solar spectrum and thereby collect light over a broad range thereof. Moreover, it was an object of the present invention to provide for dyes whose bandgap and energy levels can be tuned and which can be efficiently chemisorbed to the nanoporous surface of a photoactive layer. It was also an object of the present invention to provide for an improved dye to be used in dye-sensitized solar cells.

Noticeable is the fact that there are some organic dyes with good efficiencies reported that have an acrylic acid group attached. [5] However, as said before, they absorb light only in the range of the red dye. The dyes reported in the present application are capable to absorb the light also in the longer wavelength region.

All these objects are solved by a dye including an anchoring group, said anchoring group in its molecular structure allowing a covalent coupling of said dye to a surface, for example a surface of a nanoporous semiconductor layer, said anchoring group being represented by formula 1

(formula 1)

wherein attachment of said anchoring group within said molecular structure of said dye is at the terminal carbon marked with an asterisk in above formula, wherein
G is selected from —COOH, —SO$_3$H, —PO$_3$H$_2$, —BO$_2$H$_2$, —SH, —OH, —NH$_2$, preferably —COOH, wherein A is selected from the group comprising H, —CN, —NO$_2$, —COOR, —COSR, —COR, —CSR, —NCS, —CF$_3$, —CONR$_2$, —OCF$_3$, C$_6$H$_{5-m}$F$_m$, wherein m=1-5,
R being H or any straight or branched alkyl chain of general formula —C$_n$H$_{2n+1}$, n=0-12, preferably 0-4, or any substituted or non-substituted phenyl or biphenyl.

In one embodiment, the dye according to the present invention is represented by formula 2

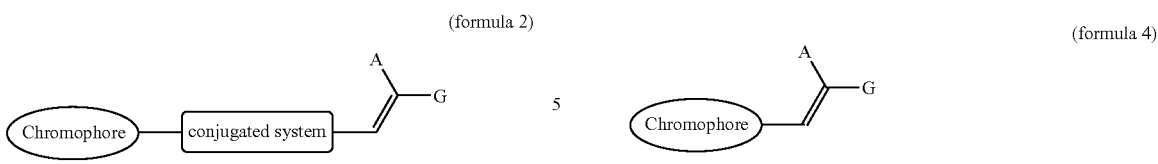

(formula 2)

wherein said chromophore is a molecule that is able to absorb in the wavelength range of visible and/or IR light, preferably in the range from 300-1200 nm or a subrange thereof, e.g. one or several of the ranges 300-580 nm, 580-850 nm, 850-1200 nm, more preferably 580-850 nm, including organic chromophores and metal complexes and wherein G and A are as defined above.

Preferably, said conjugated system is represented by a moiety shown in formula 3

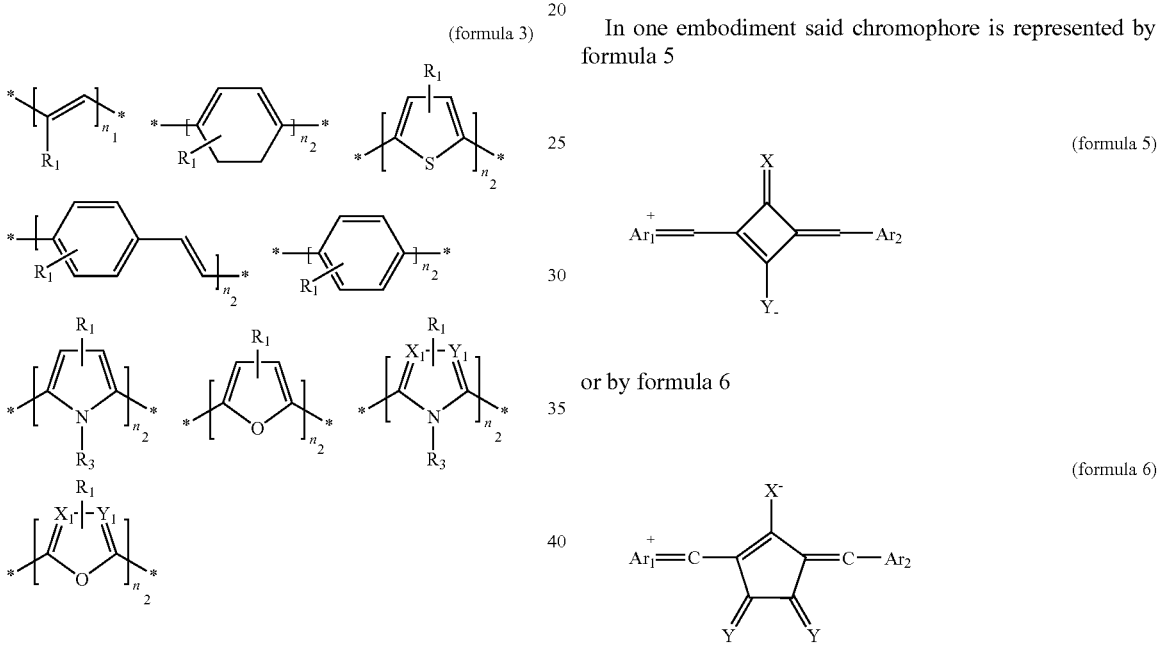

(formula 3)

or a combination of any of the moieties represented by formula 3, wherein, $n_1$ and $n_2$=0-12, preferably $n_1$=0-3 and $n_2$=1-7, wherein $R_3$ is selected from H, $-(CH_2)_n CH_3$, $-(CH_2)_n-COOR$, $-(CH_2)_n-OR$, $-(CH_2)_n-SR$, $-(CH_2)_n-NR_2$, $-((CH_2)_p-O)_n-CH_3$, p=1-4, n=0-12, and $R_1$ is selected from halogen, such as Cl, Br, F, I, or $NO_2$, $NH_2$, CN, $SO_3H$, OH, H, $-(CH_2)_n CH_3$, $-(CH_2)_n-COOR$, $-(CH_2)_n-OR$, $-(CH_2)_n-SR$, $-(CH_2)_n-NR_2$, $-((CH_2)_p-O)_n-CH_3$, p=1-4, n=0-12, R being H, any straight or branched alkyl chain of general formula $-C_n H_{2n+1}$, n=0-12, preferably 0-4, or any substituted or non-substituted phenyl or biphenyl, and wherein $X_1$ and $Y_1$, at each occurrence, are independently selected from O, S, NR.

In another embodiment the dye according to the present invention is represented by formula 4

(formula 4)

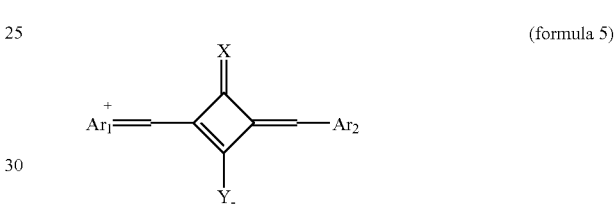

wherein said chromophore is a molecule that is able to absorb in the wavelength range of visible and/or IR light, preferably in the range from 300-1200 nm or a subrange thereof, including organic chromophores and metal complexes and wherein G and A are as defined in above.

In one embodiment said chromophore is a squarylium dye derivative or a croconium dye derivative, said squarylium dye derivative and said croconium dye derivative each having aromatic ring systems $Ar_1$ and $Ar_2$ attached to a squaric acid or croconic acid derivative.

In one embodiment said chromophore is represented by formula 5

(formula 5)

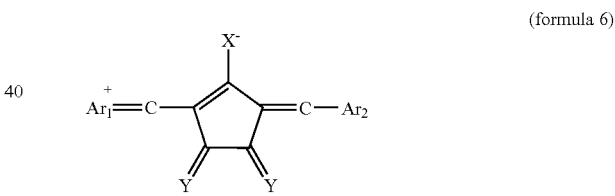

or by formula 6

(formula 6)

wherein X and Y, at each occurrence, are independently selected from O, S, NR, $C(CN)_2$, and wherein $Ar_1$ and $Ar_2$ are the same or different and, at each occurrence, are independently selected from the group comprising aromatic and heteroaromatic systems as shown in formula 7 and any combination of said aromatic and heteroaromatic systems shown in formula 7, (formula 7)

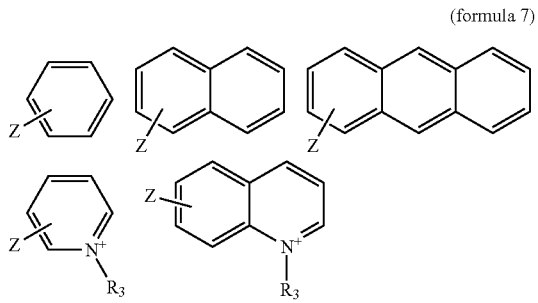

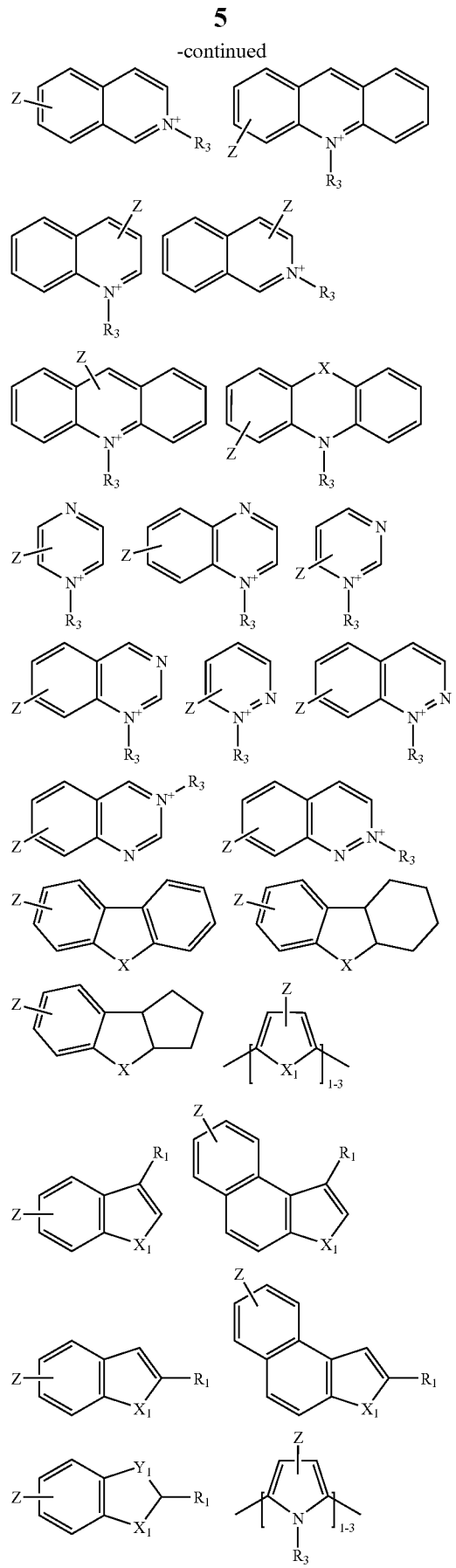
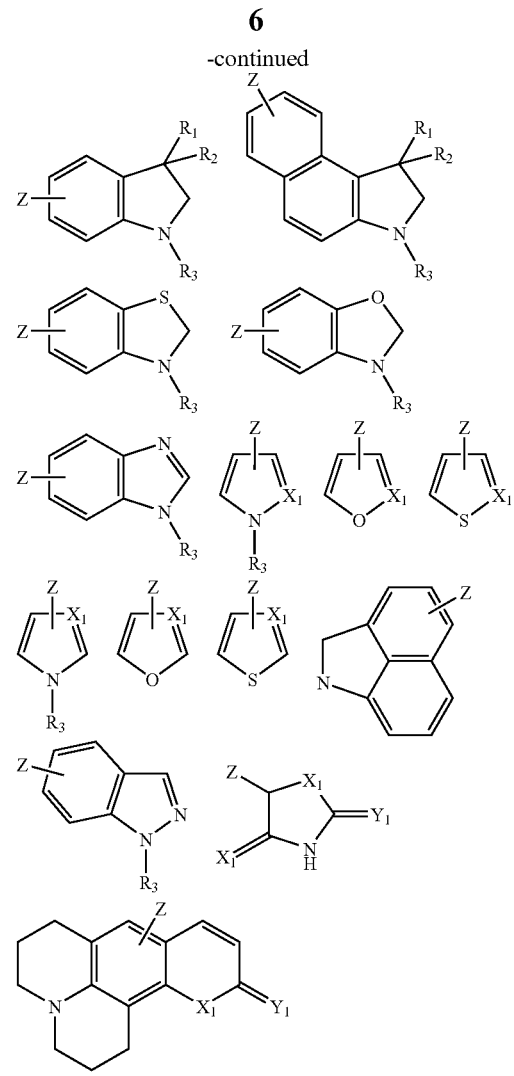

wherein $R_1$ and $R_2$ are the same or different and are, at each occurrence, independently selected from the group as defined for R in claim 2, wherein $R_3$ is as defined in claim 2, wherein $X_1$ and $Y_1$ are the same or different and are, at each occurrence, independently a $CH_2$ group or selected from C, O, S, NR, and wherein Z is one or more moieties which, at each occurrence, is independently selected from H, or halogen, such as Cl, Br, F, I, or $NO_2$, $NH_2$, CN, $SO_3H$, OH, H, $—(CH_2)_n CH_3$, $—(CH_2)_n—COOR$, $—(CH_2)_n—OR$, $—(CH_2)_n—SR$, $—(CH_2)_n—NR_2$, $—((CH_2)_p—O)_n—CH_3$, or any aromatic and heteroaromatic system, preferably represented by formula 8

(formula 8)

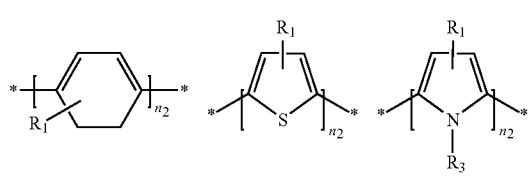

-continued

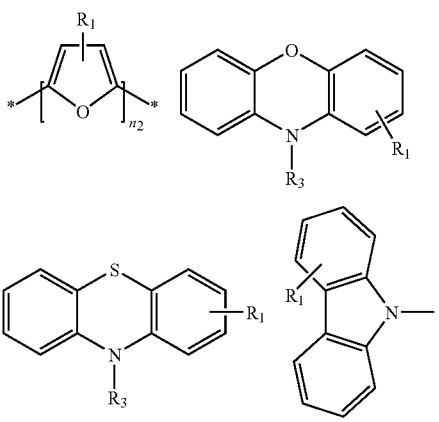

wherein p=1-4, n=0-12, wherein, $n_2$=0-12, preferentially $n_2$=1-7, wherein $R_3$ is as defined in claim 2

H, —$(CH_2)_n CH_3$, —$(CH_2)_n$—COOR, —$(CH_2)_n$—OR, —$(CH_2)_n$—SR,

—$(CH_2)_n$—$NR_2$, —$((CH_2)_p$—O$)_n$—$CH_3$, wherein $R_1$ is as defined in claim 2 selected from halogen, such as Cl, Br, F, I, or $NO_2$, $NH_2$, CN, $SO_3H$, OH, H, —$(CH_2)_n CH_3$, —$(CH_2)_n$—COOR, —$(CH_2)_n$—OR, —$(CH_2)_n$—SR, —$(CH_2)_n$—$NR_2$, —$((CH_2)_p$—O$)_n$—$CH_3$, R being H or p=1-4, any straight or branched alkyl chain of general formula —$C_n H_{2n+1}$, n=0-12, preferably 0-4, or any substituted or non-substituted phenyl or biphenyl.

In one embodiment said chromophore is a metal complex represented by the general formula 9

$$LLM(X)_p \quad \text{(formula 9)}$$

M being Ruthenium Ru, Osmium Os, or Iridium Ir, preferably ruthenium

X being independently selected from Cl, Br, I, CN, —NCS, preferably —NCS with p being an integer 0-4, preferably 2 or 3 and L and L' being organic heterocyclic ligands containing nitrogen atoms which are linked by N-atoms to the respective metal M, and wherein either one of L and L' or both L and L' are linked to the anchoring group(s) or the conjugated system(s) by any of the C-atoms within said ligands, wherein, preferably said ligands L and L' are independently, at each occurrence, mono- or polycyclic, condensed rings or such rings covalently bonded to each other.

Preferably, said ligands L and L' are independently, at each occurrence, selected from the group comprising (formula 10)

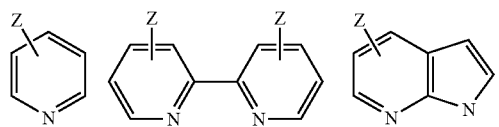

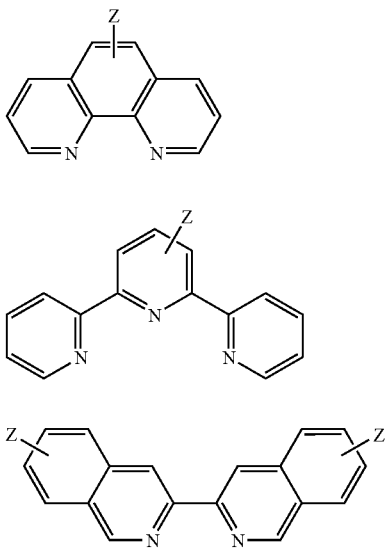

wherein Z is as defined in claim 3.

In another embodiment said chromophore is a metal complex represented by the general formula 11

$$L''M' \quad \text{(formula 11)}$$

M' being Palladium Pd, Platinum Pt or Nickel Ni, preferably Pd and L" being an organic heterocyclic ligand containing nitrogen atoms which are linked by N-atoms to the respective metal M' and to the anchoring group(s) or the conjugated system(s) by any of the C-atoms within said ligand.

Preferably, said ligand L" is selected from the group comprising (formula 12)

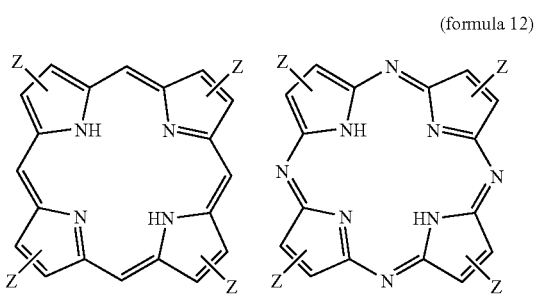

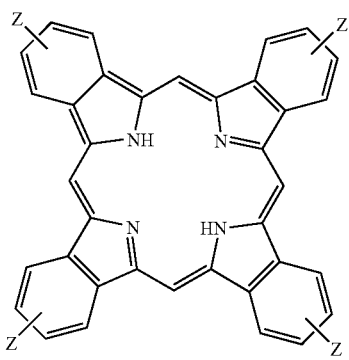

-continued

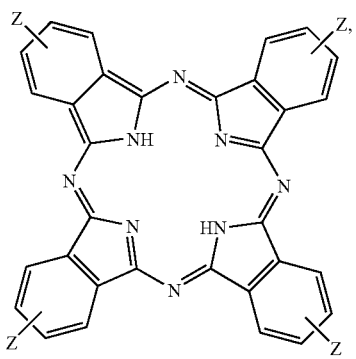

wherein Z is as defined in claim 3.

In yet another embodiment said chromophore is a semi-squarylium dye derivative or a semi-croconium dye derivative, said semi-squarylium dye derivative and said semi-croconium dye derivative each having exactly one aromatic ring system $Ar_1$ attached to a squaric acid or croconic acid derivative.

Preferably, said chromophore is represented by formula 13

(formula 13)

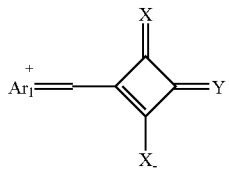

or by formula 14

(formula 14)

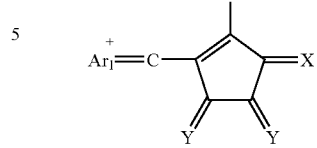

Ar1, X and Y being as defined in claim 3.

In yet a further embodiment said chromophore is represented by one of the structures shown in formula 15

(formula 15)

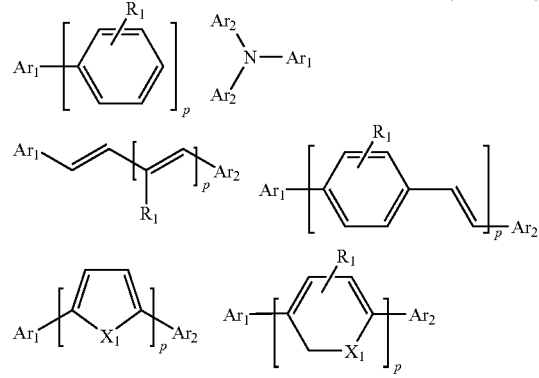

with p being 0-4, preferably 0-2
$R_1$, $Ar_1$ and $Ar_2$ as defined in claim 3, and
wherein $X_1$ is $CH_2$-group or selected from O, S, NR.

In a preferred embodiment the dye according to the present invention is
represented by formula 16

(formula 16)

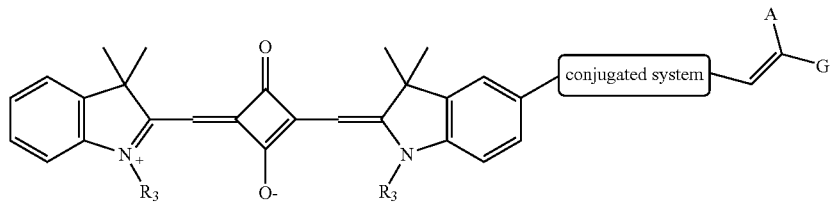

A, G being as defined in claim 1, $R_3$ being one of the structures as defined in claim 2, and said conjugated system being as defined in claim 2.

Preferably, the dye according to the present invention is represented by formula 17

(formula 17)

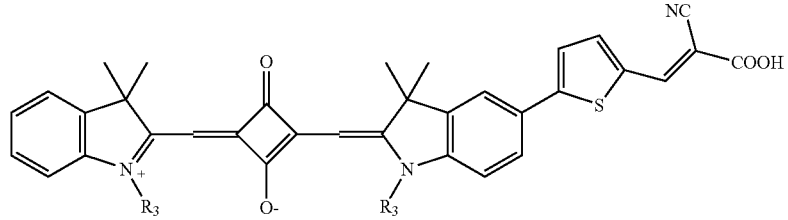

i.e. wherein said conjugated system is a thiophene, G is a —COOH-group and A is a —CN-group.

In another embodiment the dye according to the present invention is represented by formula 18

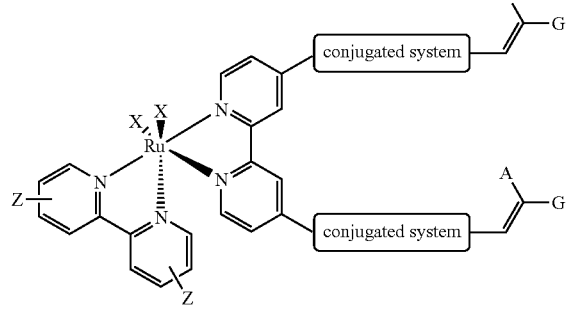

(formula 18)

i.e. wherein the chromophore is a Ruthenium bis(bipyridyl) complex,

L being a Z-substituted bipyridine, Z being as defined in claim 3, M being Ru, and said conjugated system is as defined in claim 2.

In one embodiment the dye according to the present invention is represented by formula 19

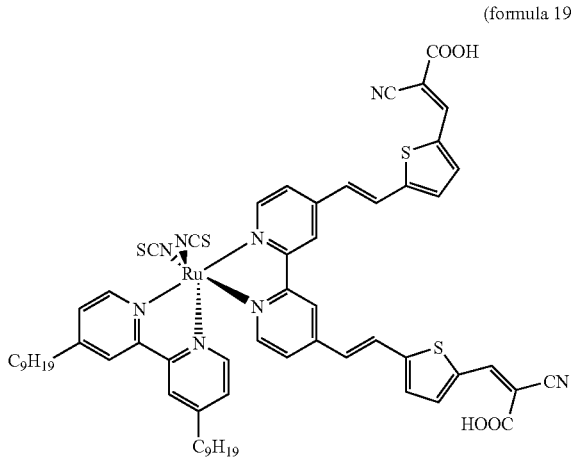

(formula 19)

L being 4,4'-dinonyl-2,2'-bipyridine

Z being an alkylgroup (nonyl); X being isothiocyanato —NCS, the conjugated system a combination of structures shown in claim 2, namely a vinylthiophene, G being a —COOH-group, A being a —CN-group.

In one embodiment the dye according to the present invention is represented by formula 20

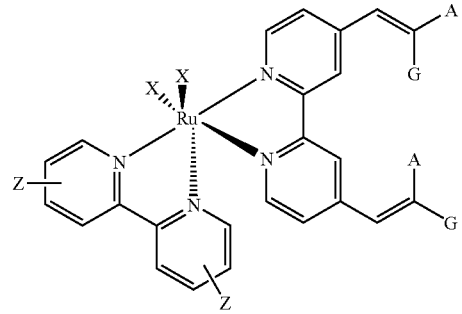

(formula 20)

i.e. wherein the chromophore is a Ruthenium bis(bipyridyl) complex, X being as defined in claim 4, L being a Z-substituted bipyridine, M being Ru, Z being as defined in claim 3, and wherein the anchoring group is as defined in claim 1, and being directly attached to the chromophore, wherein, preferably, said dye is represented by formula 21

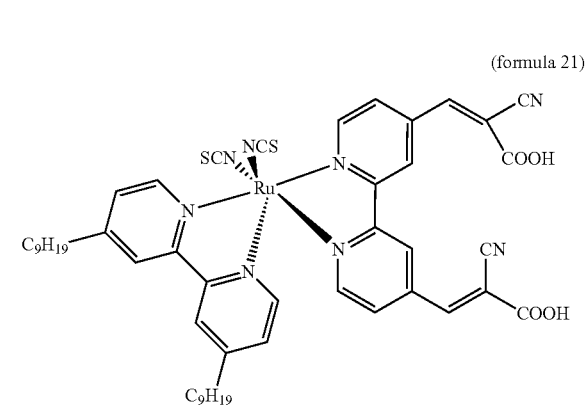

(formula 21)

L being 4,4'-dinonyl-2,2'-bipyridine

Z being an alkylgroup (nonyl); X being isothiocanato —NCS, G being a —COOH-group, A being a —CN-group.

The objects of the present invention are also solved by a method of synthesis of a chromophore as defined in any of claims 1-3, wherein $Ar_1$ and $Ar_2$ are the same and are as defined in claim 3, said method comprising:

reacting 2 equivalents of $[Ar_1-CH_3]^+Hal^-$, wherein $Hal^- = I^-$, $Br^-$, $Cl^-$, $NCS^-$ or $SCN^-$, or 2 equivalents of $[Ar_1=CH^2]$, with 1 equivalent of a squaric acid derivative or croconic acid derivative according to any of schemes 1-4

(scheme 1)

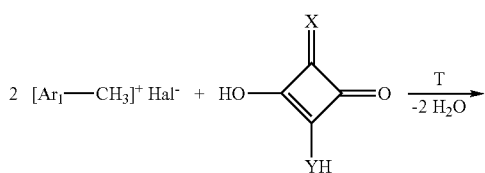

-continued

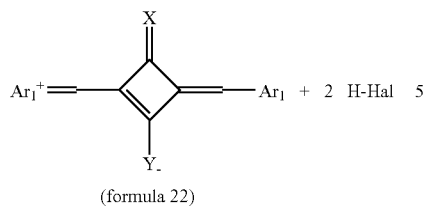

(formula 22)

(scheme 2)

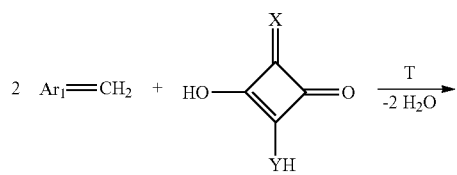

(formula 22)

(scheme 3)

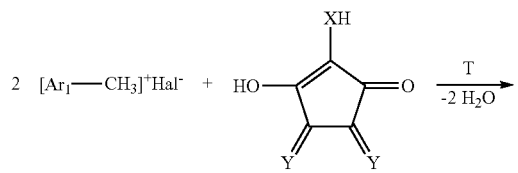

(formula 23)

(scheme 4)

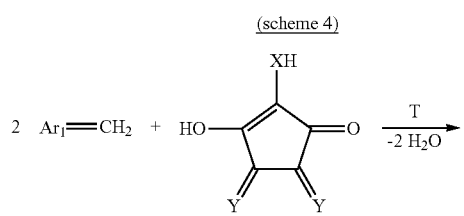

-continued

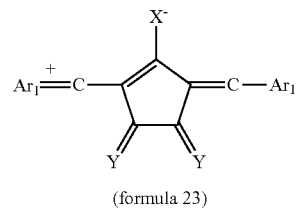

(formula 23)

X and Y being as defined in claim 3, to yield a squarylium or croconium dye according to formula 22 or 23, as defined in any of schemes 1-4.

The objects of the present invention are also solved by a method of synthesis of a chromophore as defined in any of claims 1-3, said chromophore having $Ar_1$ and $Ar_2$ as aromatic systems in its structure, wherein $Ar_1$ and $Ar_2$ are different and are as defined in claim 3, said method at least comprising:

a) formation of a chloro or alkyl ester of a squaric or croconic acid derivative substituted with one aromatic system $Ar_1$, $Ar_1$ being as defined in claim 3, as represented by one of schemes 5-8

(scheme 5)

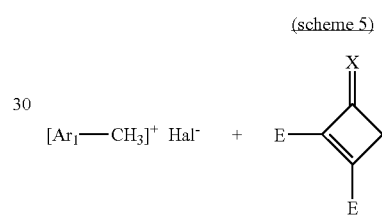

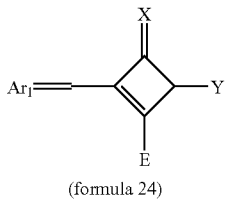

(formula 24)

(scheme 6)

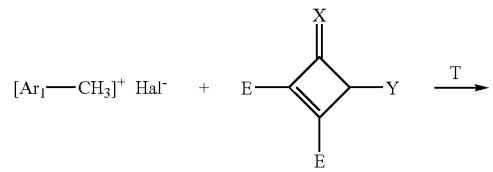

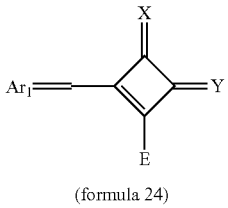

(formula 24)

(scheme 7)

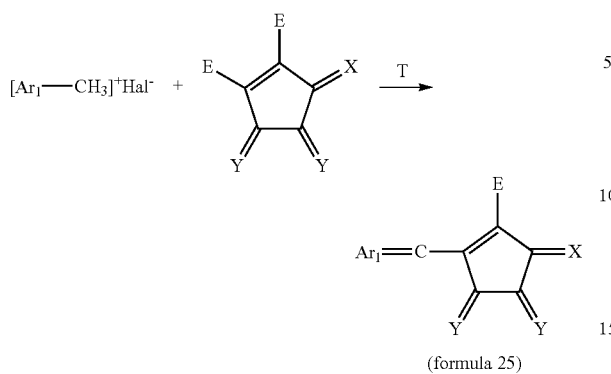

(formula 25)

(scheme 8)

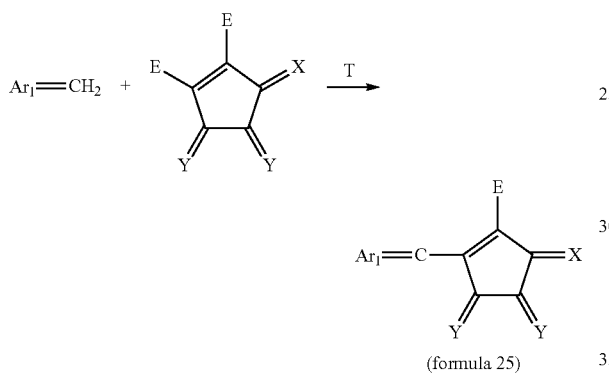

(formula 25)

X, Y, Ar$_1$, Ar$_2$ being as defined in claim 6, Hal$^-$ being I$^-$, Cl$^-$, Br$^-$, NCS$^-$ or SCN$^-$, and
E being Cl or an alkoxy group, preferably, ethoxy, propoxy, iso-propoxy, butoxy group
b) condensation of the product of step a) with
[Ar$_2$—CH$_3$]$^+$Hal$^-$, wherein Hal$^-$=I$^-$, Br$^-$, Cl$^-$, CN$^-$, NCS$^-$ or SCN$^-$,
or
with [Ar$_2$=CH$_2$],
according to one of schemes 9-12

(scheme 9)

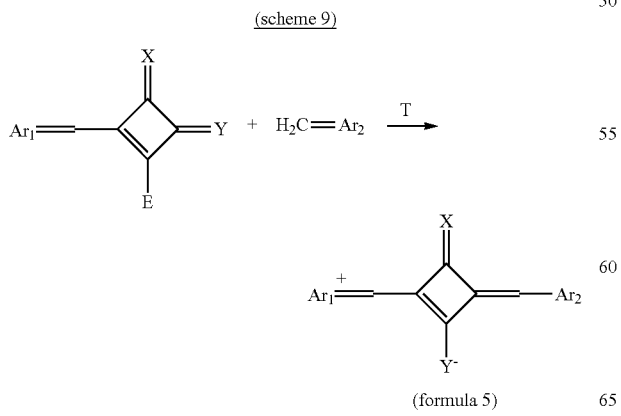

(formula 5)

(scheme 10)

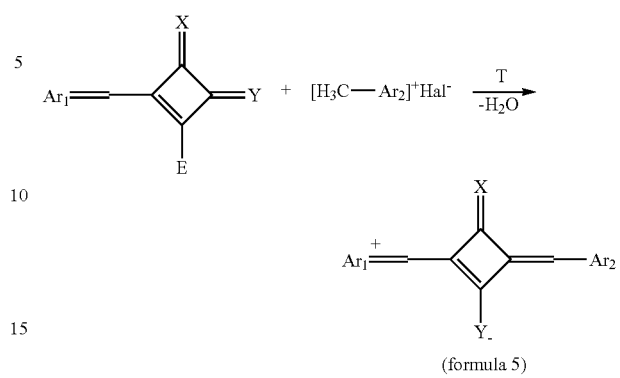

(formula 5)

(scheme 11)

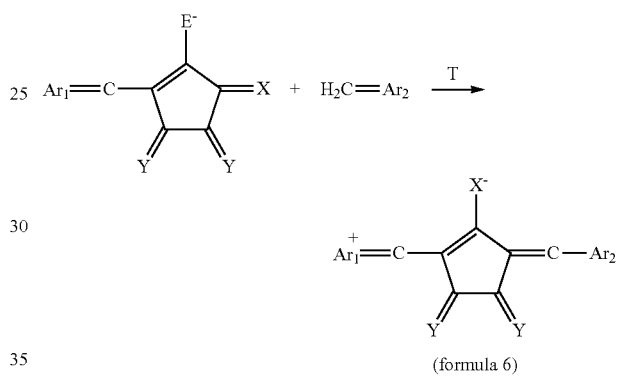

(formula 6)

(scheme 12)

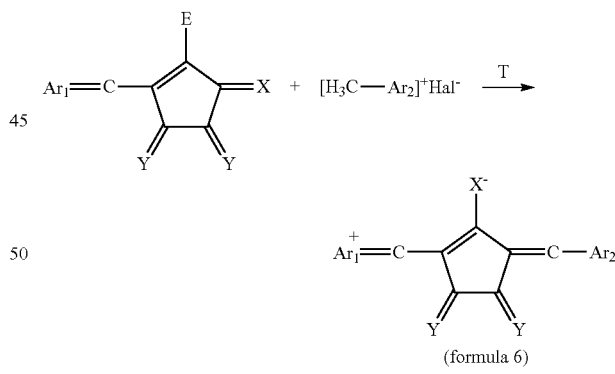

(formula 6)

to yield a squarylium dye or croconium dye having Ar$_1$ and Ar$_2$ which are different from each other.

The objects of the present invention are also solved by a method of synthesis of a dye according to any of claims 1-13, comprising the following steps:

a) coupling a chromophore as defined in any of claims 1 and 3-13 and a conjugated system as defined in any of claims 1-2, preferably under transition metal catalysis, b) introduction of a carboxyaldehyde moiety into said conjugated system, c) transforming said carboxyaldehyde moiety into an anchoring group by reacting the product of step b) with A-CH$_2$-G, wherein A and G are as defined in claim 1, said chromophore being as defined in any of claims 1 and 3-13, said conjugated system being as defined in any of claims 1-2 and said anchoring group being as defined in claim 1, wherein, preferably, step a) is the coupling of a halogenated chromophore and a metalated conjugated system as represented by the scheme

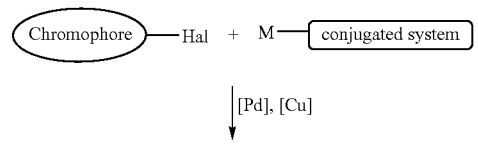

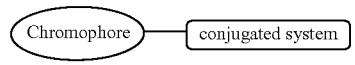

or is the coupling of a metalated chromophore and a halogenated conjugated system, as represented by the scheme

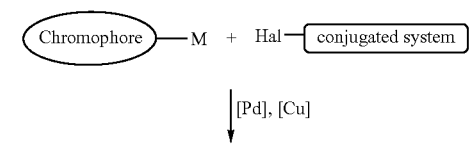

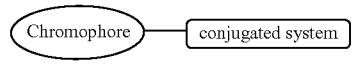

wherein

Hal=Br, I, Cl, Tosyl

M=Sn(alkyl)$_3$, B(OR)$_2$, MgHal, ZnR$_2$, R being in this case an alkyl group, preferably a C$_1$-C$_{12}$ alkyl, and b) is the introduction of carboxyaldehyde moiety into said conjugated system

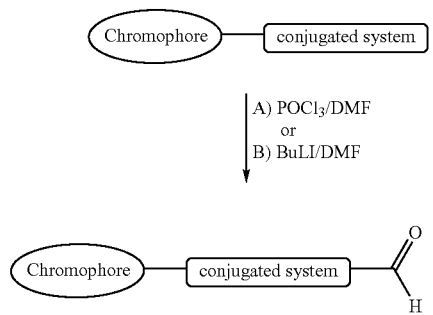

and c) is the condensation reaction of the product of step b), with a reagent of general formula A-CH$_2$-G, as represented by the scheme

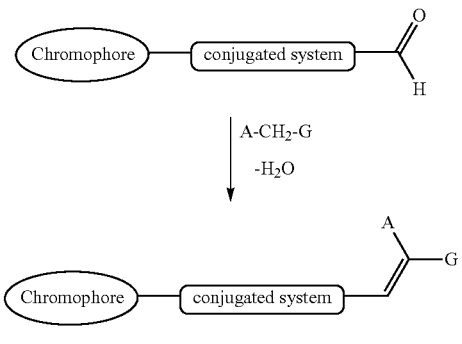

The objects of the present invention are also solved by a method of synthesis of a dye according to any of claims 1-13 comprising the following steps:

a) introduction of an anchoring group as defined in claim 1, wherein G=Gp, Gp being selected from —COOR, —SO$_3$R, —PO$_3$R$_2$, —BO$_2$R$_2$, —SR, —OR, —NR$_2$, R being any straight or branched alkyl chain of general formula —C$_n$H$_{2n+1}$, n=1-12, into a functionalized conjugated system, b) coupling a chromophore and the product of step a), preferably under transition metal catalysis, said chromophore being as defined in any of claims 1 and 3-13 and said conjugated system being as defined in claim 2, said anchoring group being as defined in claim 1, c) deprotection of Gp to G, wherein G is as defined in claim 1, wherein, preferably, said functionalized conjugated system is a metalated conjugated system, and step a) is the introduction of said anchoring group into said functionalized conjugated system, b) is the coupling of a halogenated chromophore and the product from step a, and steps a) and b) are represented by the scheme

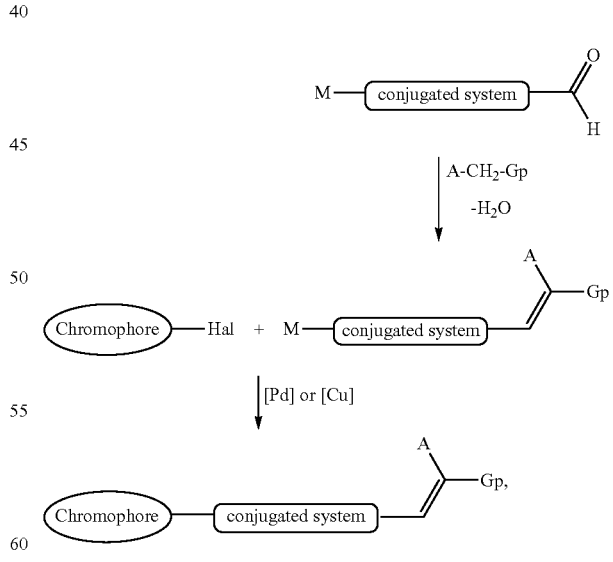

or said conjugated system is a halogenated conjugated system, and step b) is the coupling of a metalated chromophore and the product from step a), and steps a) and b) are represented by the scheme

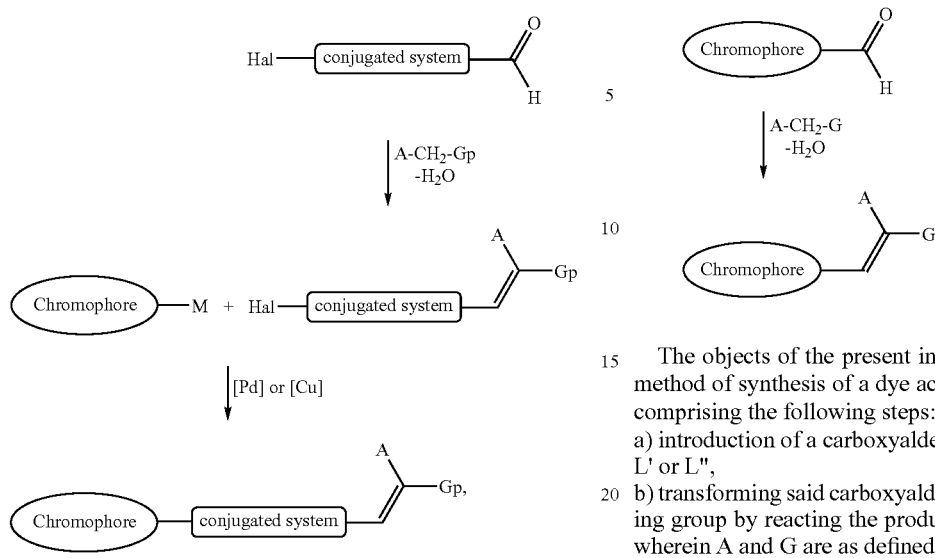

and wherein step c) involves the deprotection of Gp to G, G being defined as in claim 1, wherein, more preferably, step c) occurs by acid or base hydrolysis, as represented by the scheme

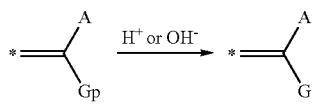

The objects of the present invention are also solved by a method of synthesis of a dye according to any of claims 1, 3-9, 14 and 15 comprising the following steps:

a) introduction of a carboxyaldehyde moiety into a chromophore, b) transforming said carboxyaldehyde moiety into an anchoring group by reacting the product of step a) with A-CH$_2$-G, wherein A and G are as defined in claim 1, said chromophore being as defined in any of claims 1, 3-9, 14 and15, and said anchoring group being as defined in claim 1, wherein, preferably, step a)

is the introduction of a carboxyaldehyde moiety into a chromophore, as represented by the scheme

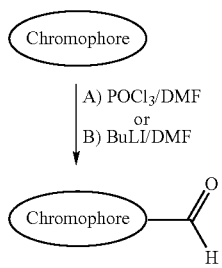

and b) is the condensation reaction of the product of step a), with a reagent of general formula A-CH$_2$-G, as represented by the scheme The objects of the present invention are also solved by a method of synthesis of a dye according to any of claims 4-8 comprising the following steps:

a) introduction of a carboxyaldehyde moiety into a ligand L, L' or L", b) transforming said carboxyaldehyde moiety into an anchoring group by reacting the product of step a) with A-CH$_2$-G, wherein A and G are as defined in claim 1, said ligand L, L' and L" being as defined in any of claims 4-8, and said anchoring group being as defined in claim 1 and c) reacting the product of step b) with a metal M, M being as defined in any of claims 4 and 7.

The objects of the present invention are also solved by an electronic device comprising a dye as defined above, wherein, preferably said device is a solar cell, more preferably a dye-sensitized solar cell. Examples of electronic devices comprising a dye in accordance with the present invention include energy supply devices for portable electronic devices and displays, such as solar cell panels for or incorporated in mobile phones, notebooks, laptops, portable audio-tape players, MP3-players, remote controls, e-cards, e-books, e-readers, portable CD players, portable DVD players, cameras, digicams, GPS devices, portable sensors, displays integrated in electronic devices. Examples of electronic devices in accordance with the present invention also include portable solar chargers for batteries of any of the aforementioned devices. Moreover, electronic devices in accordance with the present invention include smart windows, on-roof applications, especially in areas where a grid connection is not possible, e.g. camping cars, boats. If the energy supply device is a solar cell panel, such panel is preferably a dye sensitized solar cell panel (DSSC panel) (see also FIG. 11).

In a preferred embodiment in the dye-sensitized solar cell, said dye is chemisorbed to a photoactive semiconductor layer.

In one embodiment the device according to the present invention, further comprises at least one other dye, wherein, preferably, said at least one other dye is a dye as defined above, wherein, more preferably said at least one other dye is red-dye or black-dye or a combination of the two.

In one embodiment the electronic device according to the present invention is a chromogenic sensor, wherein preferably, said dye is present in solution or wherein said dye is present in a film.

The objects of the present invention are also solved by the use of a dye as defined above as sensitizer in a dye-sensitized solar cell, preferably together with at least one other dye, wherein, more preferably, said at least one other dye is a dye as defined in any of claims 1-15, even more preferably red-dye or black-dye or a combination of the two.

The objects of the present invention are also solved by the use of a dye as defined above as a sensor, wherein the spectral properties of said dye depend on the presence, absence or quantity of analyte present and change in accordance there-with, wherein, preferably, said sensor is for detecting the presence, absence or quantity of solvents, such as ethanol, methanol and acetonitrile.

The term "anchoring group", as used herein, is meant to refer to any functional group that allows a covalent coupling (chemisorption) of the entity to which such anchoring group belongs, to a surface, for example the surface of a nanoporous semiconductor layer within a solar cell.

A "chromophore" is an entity within a molecular structure that is responsible for the light absorption, in the present case squarylium and croconium dyes, semi-squarylium or semi-croconium dyes, aromatic and heteroaromatic systems bridged by (poly-)enes, styrene, or other aromatic or heteroaromatic rings, secondary or tertiary amines with aromatic or heteroaromatic systems attached, (poly-)phenylenes mono-endcapped with an aromatic system or metal organic complexes, such as polypyridyl ruthenium, osmium, iridium complexes or palladium, platinum, nickel porphyrine and phtalocyanine derivatives.

A "conjugated system" is a molecule having alternating double bonds and single bonds between its atom centers. The simplest example of a conjugated system is butadiene wherein there are two double bonds separated by a single bond.

The term "molecular structure", as used herein, refers to the structure of a molecule. For example, the "molecular structure of a dye" is the structure of the molecule of said dye. An "anchoring group" that is included in the molecular structure of a dye forms part of said molecular structure.

A dye is referred to as being "chemisorbed" to a layer or surface, if the dye is covalently coupled thereto.

Term "red-dye" and "black-dye" refers to commonly used dyes for dye-sensitized solar cells which are cis-bis(isothiocyanato)bis(2,2'-bipyridyl-4,4'-dicarboxylato)-ruthenium (II) bis-tetrabutylammonium (in literature also known as Ruthenium 535-bisTBA, N719 or B2) and tris(isothiocyanato)-ruthenium(II)-2,2':6',2''-terpyridine-4,4',4''-tricarboxylic acid, tris-tertrabutylammonium salt (also known as Ruthenium 620-1H3TBA, Ruthenium 620 or N-749).

The term "a dye including an anchoring group in its molecular structure" as used herein, is meant to refer both to a scenario where only one anchoring group is present within the structure and a scenario wherein several anchoring groups are present.

The term "covalent coupling", as used herein, is used interchangeably with the term "chemisorption".

In formula 1, the letter "G" refers to a group which preferably is an acidic group in the sense that such group has a proton that can be dissociated from such group. Preferably, G is selected from COOH, $SO_3H$, $PO_3H_2$, $BO_2H_2$, SH, OH, $NH_2$. A is selected from the group comprising H, —CN, —$NO_2$, —COOR, —COSR, —COR, —CSR, —NCS, —$CF_3$, —$CONR_2$, —$OCF_3$, $C_6H_{5-m}F_m$, wherein m=1-5.

The term "a molecule that is able to absorb in the wavelength range of visible and/or IR light" as used herein, is meant to refer to a molecule that is able to absorb light in only one or several parts of the entire range indicated or over the total range. For example a molecule may only absorb in the range of from 500-700 nm, whereas another molecule may absorb in the range of from 750-1000 nm, whereas a third molecule may absorb over the range of from 300-1200 nm. All these scenarios are meant to be encompassed by such wording.

With reference to formula 3 which exemplifies the "conjugated system" in accordance with the present invention, the term "a combination of the moieties are represented by formula 3" is used. This is meant to encompass any molecule wherein one or several of the structures given in formula 3 are covalently linked to each other to also produce a "conjugated system". A "functionalized conjugated system", as used herein, is meant to refer to a conjugated system which has been endowed with a chemical functionality that allows such conjugated system to react with other molecules. Examples for such functionalized conjugated system are a metallated conjugated system having an aldehyde group into which functionalized conjugated system an anchoring group may be introduced.

In formula 2 and 4, a conjugated system and an anchoring group, respectively, are attached to a chromophore. Such attachment may occur at any position within the chromophore, and it may be via a C-atom or an N-atom within said chromophore. The term "protected dye", as used herein, is a dye wherein the anchoring group is protected by an appropriate protecting group. In preferred embodiments, such term refers to the dye represented by formula 2 but in which the anchoring groups are protected by appropriate protecting groups. In a further reaction the anchoring groups may be activated by deprotecting them. Appropriate protecting groups are known to a person skilled in the art and may be identified by him without undue experimentation.

Sometimes, in this application, reference is made to the terms "$Ar_1$" and "$Ar_2$" which represent aromatic and heteroaromatic systems. Whilst these $Ar_1$ and $Ar_2$ are, according to the present invention, indeed exemplified by the systems shown below, it is clear to someone skilled in the art that, once these systems are attached to a squaric acid or croconic acid derivative, as shown in formulae 5-6, 13-14, or aromatic systems as shown in formula 15, they might gain or lose a positive charge which is delocalized over the entire molecule. This is due to the zwitter-ionic character of the dye molecules and the possible mesomeric structures of such conjugated systems. An example of this is shown below:

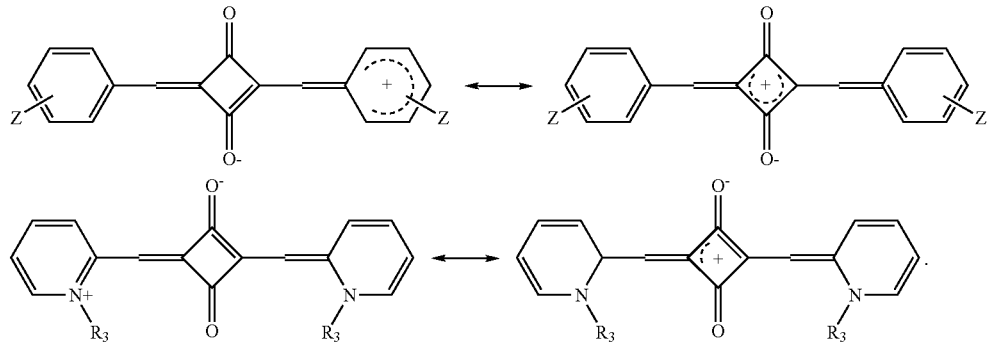

In the synthesis scheme according to the present invention, wherein Ar₁ and Ar₂ are the same, reactions are performed with [Ar₁—CH₃] or with [Ar₁=CH₂]. In these, the attachment of the —CH₃-group or the =CH₂-group may be at any position in the respective aromatic system Ar₁, which may be exemplarily shown as follows:

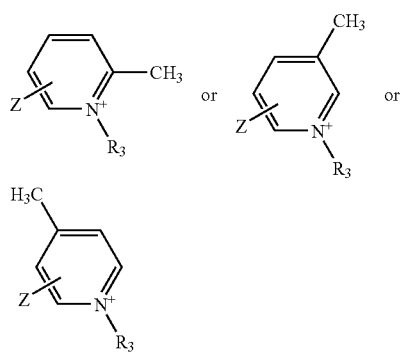

A "chromogenic sensor" as used herein, refers to a composition or compound the spectral-characteristics of which are dependent on the environment or the presence or absence or quantity present of an analyte. Accordingly, the spectral characteristics, such as the color will change, if an analyte is present or absent, as the case may be.

The term "substituted phenyl/biphenyl" is meant to refer to any phenyl/biphenyl wherein a hydrogen has been replaced by a substituent, such as a halogen, $NO_2$, $NH_2$, OH or other suitable functional groups. Such substituents have for example been defined above as Z or $R_1$, which substituents may also be substitutents at a phenyl or biphenyl.

The present inventors have surprisingly found that if one endows organic dyes, such as squarylium dyes and croconium dyes or metal organic complexes, such as polypyridyl ruthenium or osmium complexes, with an anchoring group(s), these dyes are very well suited to be used in dye sensitized solar cells and sensor devices. The inventors have devised methods of synthesis for producing such dyes, and these dyes effectively adsorb on nanoporous semiconductor layers, such as $TiO_2$, they are active sensitizers in the visible, but also in the red/IR region of the solar spectrum which is a region where the standard red- and black-dye are not active. Moreover, the dyes according to the present invention show high quantum efficiency at an absorption maximum similar to that of the standard red-dye. If one therefore combines the dyes of the present invention with other dyes, such as standard red dye or standard black dye, a broad range of the solar spectrum may be harvested. That makes the dyes of the present invention very promising to be used together with other dyes, such as standard red dye or standard black dye or further dyes according to the present invention with absorption maxima at different wavelengths. A dye sensitized solar cell comprising a dye according to the present invention, and, in addition thereto, one or more further dyes, is herein also referred to as a multiple-dyes sensitized solar cell (M-DSSC). Preferably, said one or more further dyes is also a dye according to the present invention.

Further, organic dyes have high absorption coefficients. This means it needs less amount of dye to absorb the same amount of light. Less amount of one dye on a surface enables the use of more dyes with different absorption properties, ideally being a mixture of dyes absorbing the whole range of the sun spectrum.

Moreover, in the dyes according to the present invention, the anchoring group consists of a group represented by the general formula

which is directly or optionally bridged by a conjugated system to the main core of the dye, also herein being referred to as the chromophore. The present invention also encompasses dyes wherein the chromophore (or main core of the dye) has more than one anchoring group attached, and, optionally, also more than one conjugated system. Such structures are also meant to be encompassed by the formulae given in the claims, more specifically claims 1-15. Without wishing to be bound by any theory, the present inventors believe that this kind of anchoring group influences the electron density distribution in such way that after photo-excitation a fast electron injection occurs. The dye is directly attached to the semiconductor surface, such as the $TiO_2$ surface via the group G of the anchoring group. At the same time, the A-group of the anchoring group shown above, having an electron acceptor character is believed to have a positive effect on electron injection from the dye to the semiconductor. Again, without wishing to be restricted to any specific mechanisms, the present inventors believe, and molecular orbital calculations support their assumption. that in the ground state, the electron density is localized on the chromophore or dye moiety, far away from the semiconductor surface. After photo-excitation, effective charge separation and electron fast migration from the dye-moiety next to the anchoring group via the conjugated system if present, otherwise directly, takes place. This process is promoted by the acceptor character of the A-group of the anchoring group. The electron distribution changes in such a way that the electron density becomes highest in the proximity of anchor group. The electron transfer from here to the conduction band of the semiconductor is therefore fast. This hypothesized intramolecular electron density relocation induced by photo-excitation is similar to the intra-molecular metal-ligand-charge-transfer in standard red dye.

In standard red dye the anchoring group is carboxylic acid group which is attached to the bipyridine ligand. Instead, by attaching to a ligand the anchoring group being defined in claim 1, the inventors believe that the electron injection from the photo-excited dye into the conduction band of the semiconductor is even faster.

The chromophore can be an organic dye, such as a squarylium or croconium acid derivative, or a metal organic dye, such as ruthenium polypyridyl complexes, and is responsible for the light absorption abilities of the entire dye molecule. The energy levels (HOMO/LUMO) of an organic dye can systematically be tuned by chemical structure modification in such a manner that they match with the other components of the DSSC: The energy level of the excited state of the dye (LUMO) with the conduction band of the semiconductor and the ground state energy level of the dye (HOMO) with the redox potential of the redox pair. If a conjugated system is present, its role is to allow the fast electron flow through the system and thus, the distribution relocation after photo-excitation. Further, an extended π-conjugation results in an additional red-shift of the absorption.

In the following, reference is made to the figures, wherein,

FIG. 1 shows an example of a synthesis scheme of one embodiment of a dye according to the present invention, wherein a halogenated chromophore is reacted with a metalated conjugated system, and thereafter the anchoring group is introduced, FIG. 2 shows an example of a synthesis scheme of one embodiment of dye according to the present invention, wherein a metalated chromophore and a halogenated conjugated system is first coupled, and thereafter the anchoring group is introduced, FIG. 3 shows an example of a synthesis scheme of one embodiment of a protected dye according to the present invention, wherein first an anchoring group is introduced into a metalated conjugated system, and thereafter the metalated conjugated system is reacted with a halogenated chromophore, FIG. 4 shows an example of a synthesis scheme of one embodiment of a protected dye according to the present invention, wherein first an anchoring group is introduced into a halogenated conjugated system, and thereafter the halogenated conjugated system is reacted with a metalated chromophore, FIG. 5 shows the deprotection of the anchoring group introduced in any of the schemes according to FIGS. 3-4, to produce a dye according to the present invention, FIG. 6 shows a synthesis scheme of a dye in accordance with the present invention having an acrylic acid moiety as anchoring group directly attached to the chromophore being represented by general formula 4, FIG. 7 shows the energy levels of dye-sensitized solar cells including the energy levels of different squarilium dyes for comparison, FIG. 8 shows the respective dyes of FIG. 7, and FIG. 9 shows the electron distribution of a dye in accordance with the present invention in the ground and excited state; molecular modeling was performed, calculations are based on density functional theory using materials studio software from Accelrys, FIG. 10 shows the structure of different sensitizer dyes: 5=sensitizer dye with anchoring group according to claim 1; 11, 14, 15, 20=sensitizer dyes from the class of symmetrical squarylium dyes prepared according to the present invention; 17, 19=asymmetrical squarylium dyes prepared according to the present invention; 21, 22=organic dyes from the class of the merocyanine dyes; 23=standard black dye and 24=standard red dye which are the conventional sensitizers used in DSSC.

FIG. 11 shows embodiments of electronic devices in accordance with the present invention wherein energy supply devices, such as solar cell panels, have been incorporated.

FIG. 12a shows the UV-Vis spectra of sensitizer dye 5, standard black dye 23, and standard red dye 24.

Figure 12A:
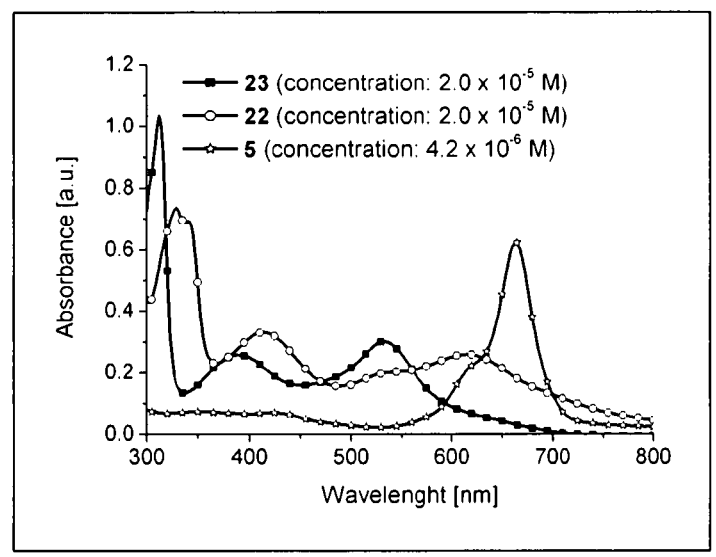
FIG. 12b shows the IPCE curve of dye 5 and dye 17.
FIG. 12c shows the IPCE curve of dye 5, dye 23, and a mixture of the two dyes.
FIG. 12d shows the IPCE curve of dye 5, dye 21, and a mixture of the two dyes.
FIG. 12e shows the IPCE curve of dye 5, dye 22, and a mixture of the two dyes.
Figure 12B:
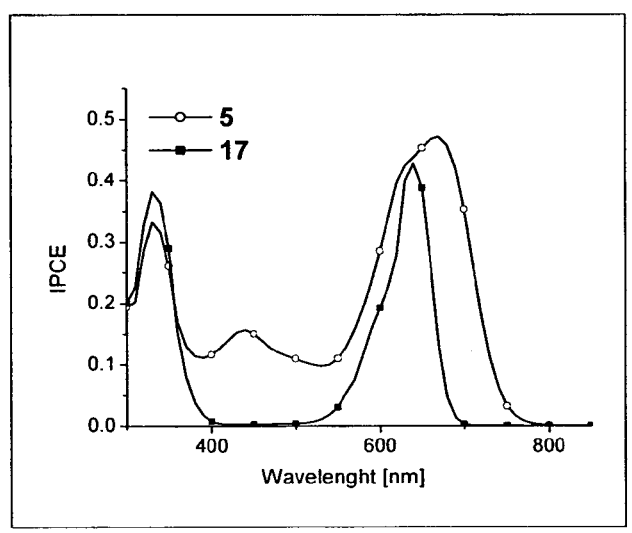
Figure 12C:
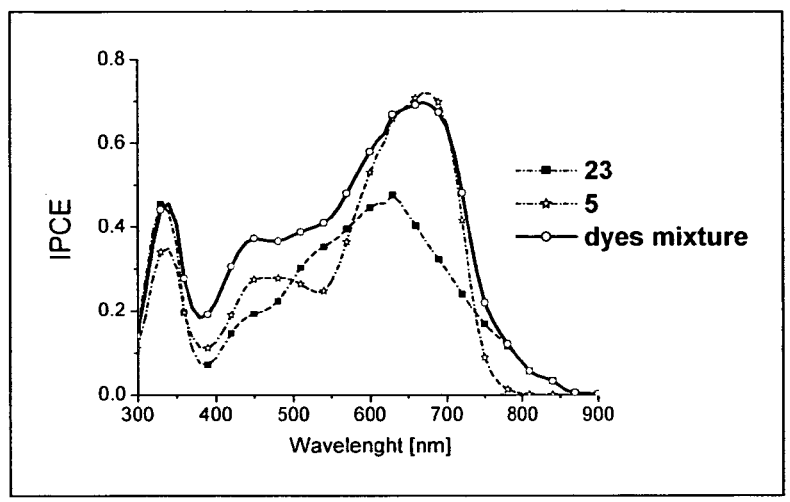
Figure 12D:
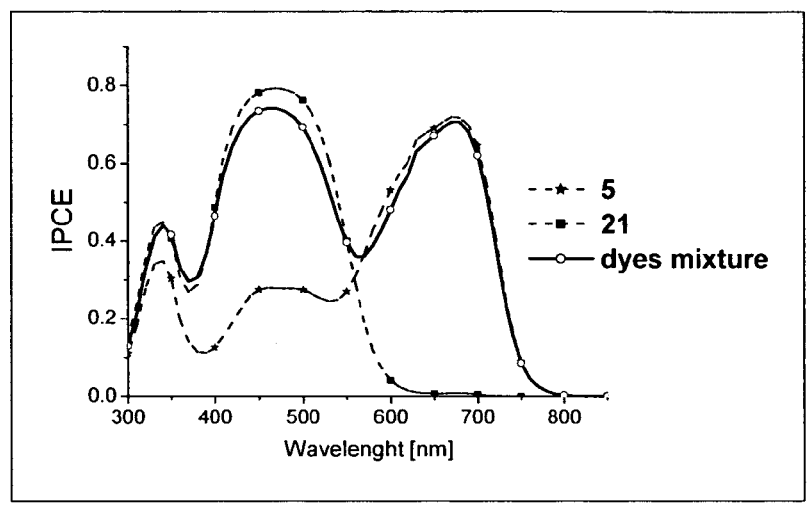
Figure 12E:
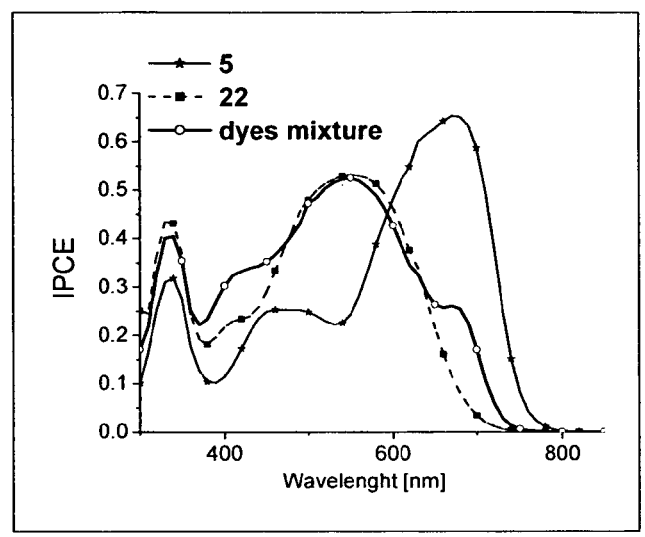
Figure 12F:
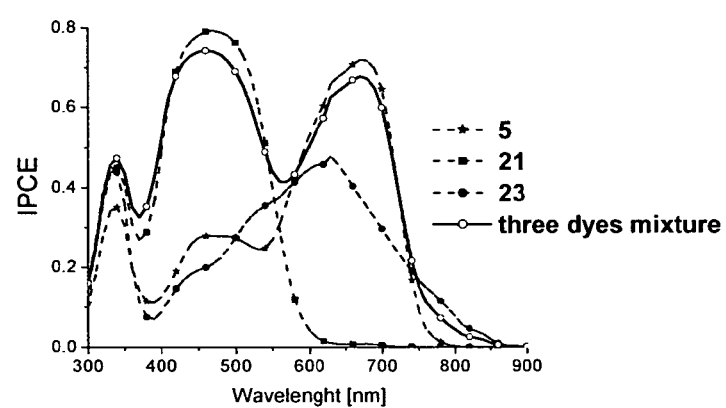

FIG. 12f shows the IPCE curve of dye 5, dye 21, dye 23, and a mixture of the three dyes.

Figure 12G:
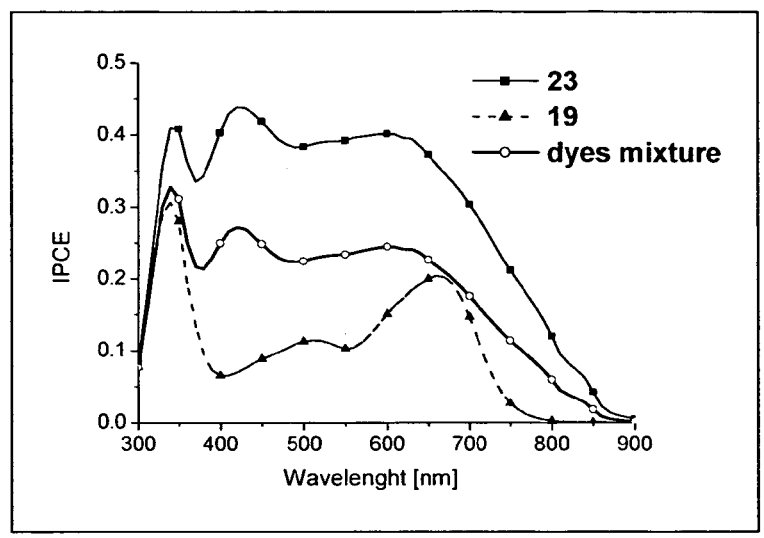

FIG. 12g shows the IPCE curve of dye 23, dye 19, and a mixture of the two dyes.

Figure 12H:
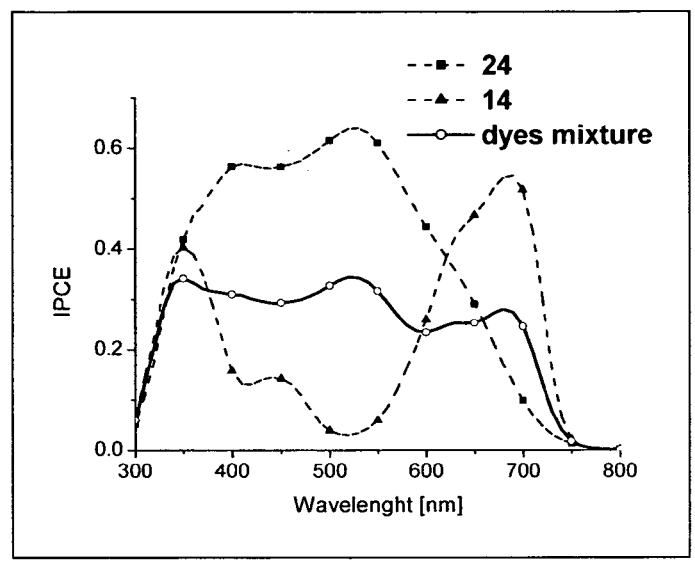

FIG. 12h shows the IPCE curve of dye 24, dye 14, and a mixture of the two dyes.

Figure 12I:
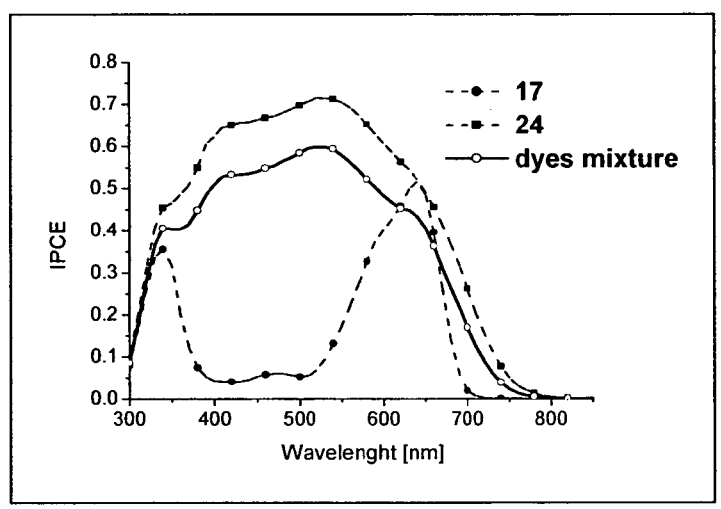

FIG. 12i shows the IPCE curve of dye 17, dye 24, and a mixture of the two dyes.

BRIEF DESCRIPTION OF THE PREFERRED EMBODIMENTS

The structure of the dyes should include the following anchor group

(formula 1)

The dyes may have the following structure

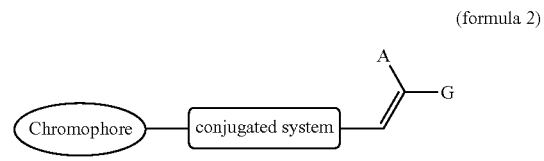

(formula 2)

Preferred examples of the conjugated system are

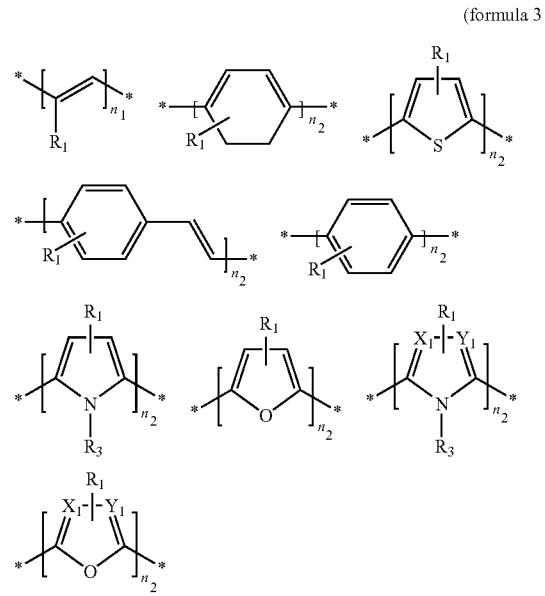

(formula 3)

$R_1$, $n_1$ and $n_2$ being as defined above.

Alternatively, the dyes may have the following structure

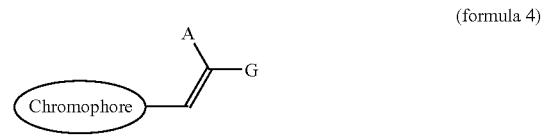

(formula 4)

A, G and chromophore being as defined above.

In either case, preferably the chromophore is a squarylium or croconium dye represented by formula 5

(formula 5)
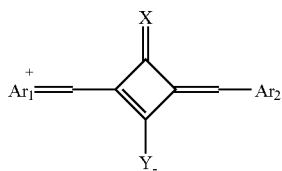
or by formula 6
(formula 6)
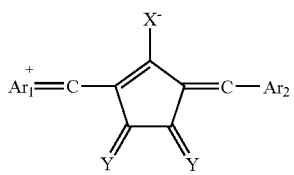
X, Y, Ar₁ and Ar₂ being as defined above, with Ar1 and Ar2 being preferably
(formula 7)
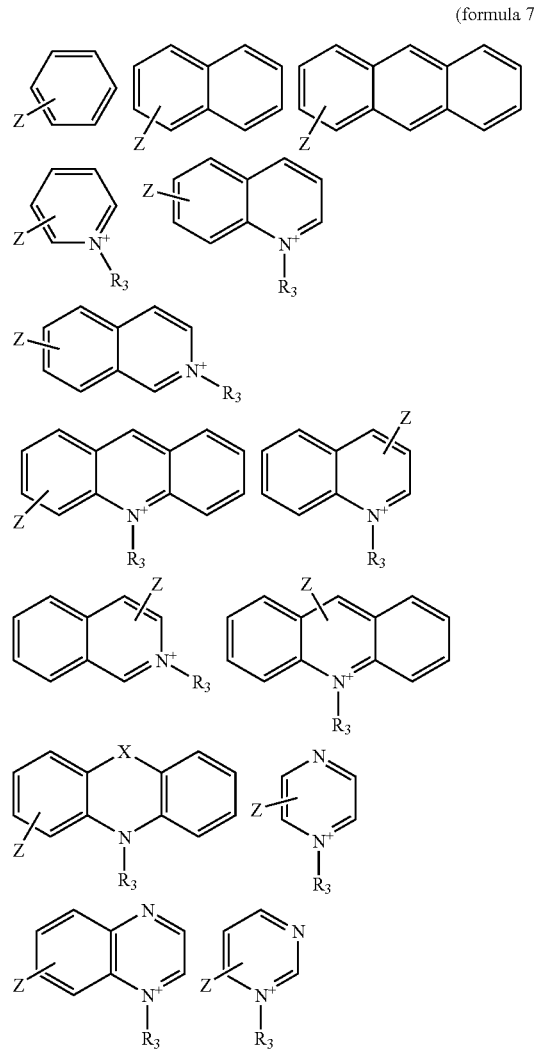
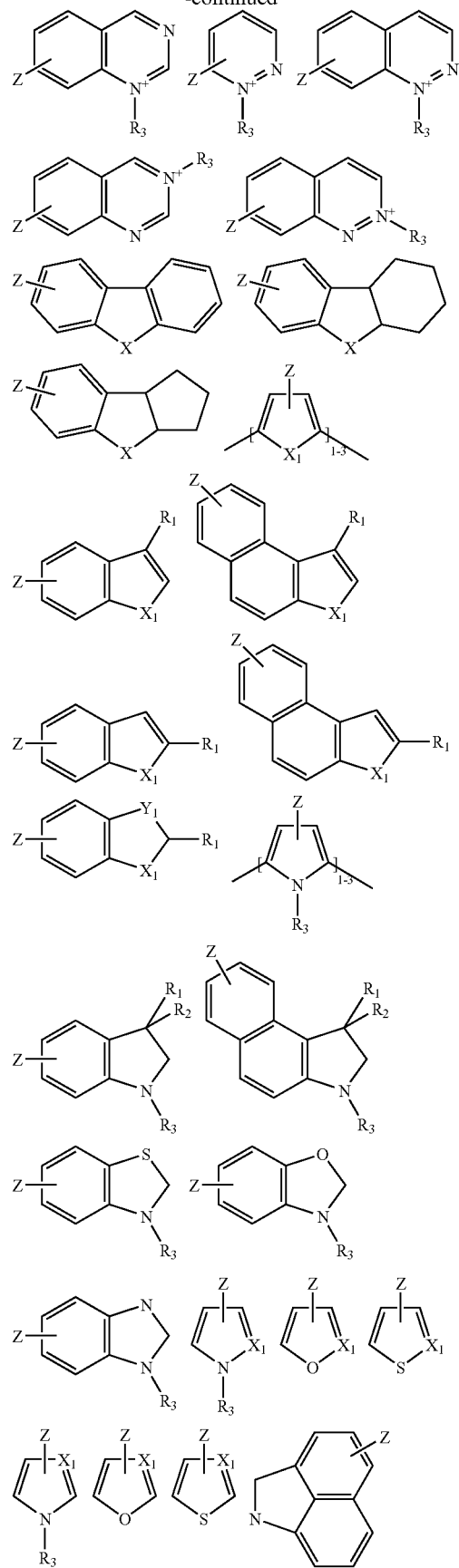

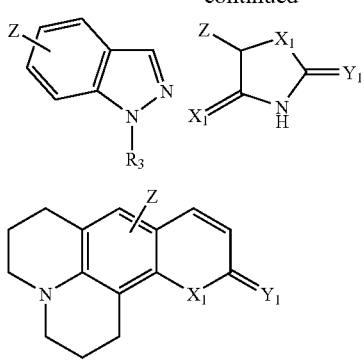

$R_1, R_2, R_3, Z, X_1, Y_1$ being as defined above, with Z being preferably one or more moieties which, at each occurrence, is independently selected from H, or halogen, such as Cl, Br, F, I, or $NO_2$, $NH_2$, CN, $SO_3H$, OH, H, —$(CH_2)_nCH_3$, —$(CH_2)_n$—COOR, —$(CH_2)_n$—OR, —$(CH_2)_n$—SR, —$(CH_2)_n$—$NR_2$, —$((CH_2)_p$—$O)_n$—$CH_3$, or any aromatic and heteroaromatic system, preferably represented by formula 8

(formula 8)

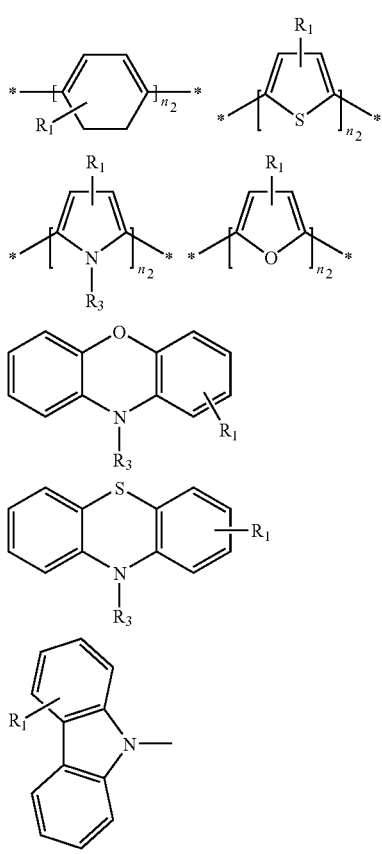

In one embodiment, the chromophore is a Ruthenium, Osmium or Iridium complex of formula 9

$LLM(X)_p$ (formula 9)

With L, L' being organic heterocyclic ligands containing N-atoms, such as (formula 10)

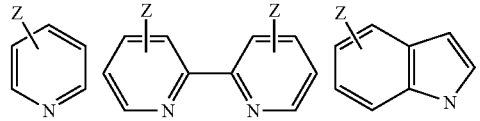

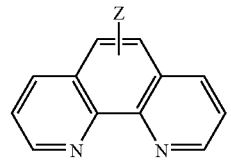

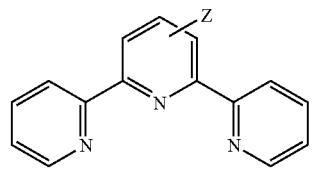

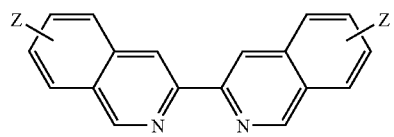

In another embodiment, the chromophore is a palladium, platinum or nickel metal complex of formula 11

$L''M'$ (formula 11)

With L" preferably being (formula 12)

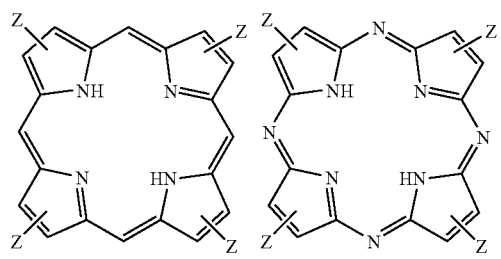

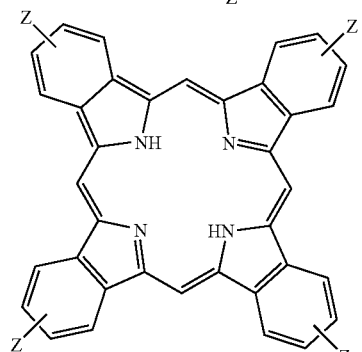

-continued

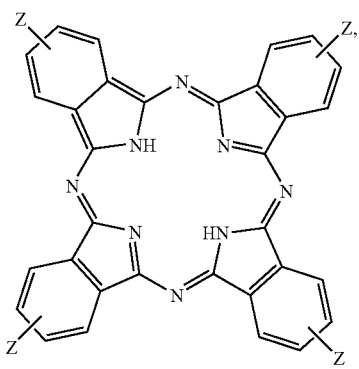

In another embodiment, the chromophore is a semi-squarylim or semi-croconium dye (formula 13)

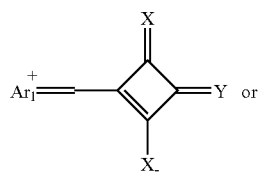

(formula 14)

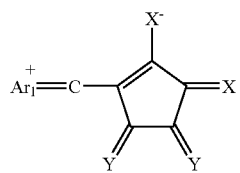

In another embodiment, the chromophore is a) a (poly-)phenylenes mono-endcapped with an aromatic system, or b) a secondary or tertiary amines substituted with aromatic or heteroaromatic unit, or c)-f) aromatic and heteroaromatic systems bridged by (poly-)enes, (poly-)styrene, or other (poly-)aromatic or heteroaromatic rings, as presented by formula 15.

(formula 15)

a)
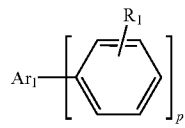

b)
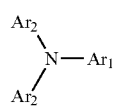

c)
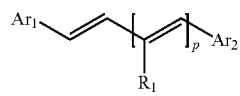

d)
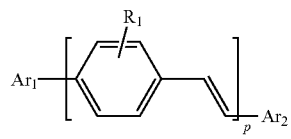

e)
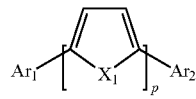

f)
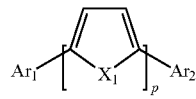

Preferably, the dye includes a chromophore which is a indole-based squarylium dye and (formula 16)

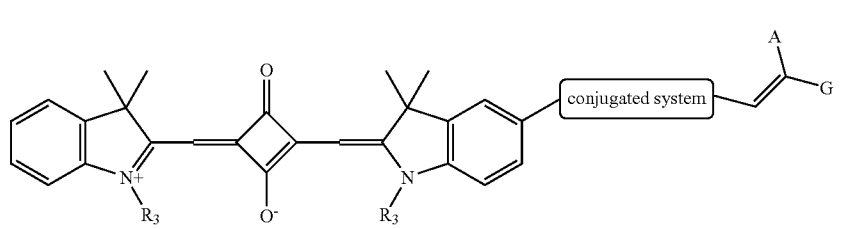

wherein Ar1 and Ar2 being an indole aromatic system attached to a squaric acid. The anchoring group being attached to the chromophore via a conjugated system.

A, G being as defined in claim 1

In one embodiment, the dye has following structure

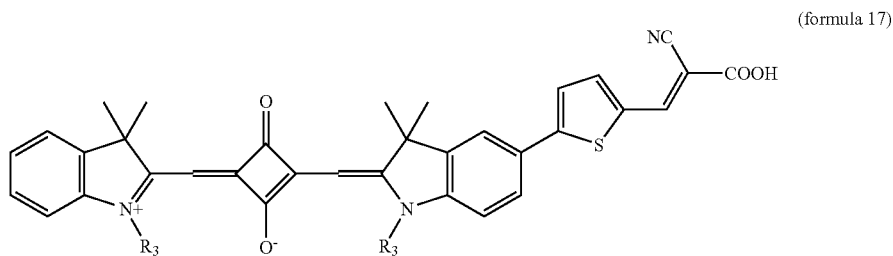

(formula 17)

With the conjugated system being a thiophene, G being carboxylic acid —COOH and A being a cyano group —CN In one embodiment, the dye includes a chromophore which is a Ruthenium bis(bipyridyl) complex

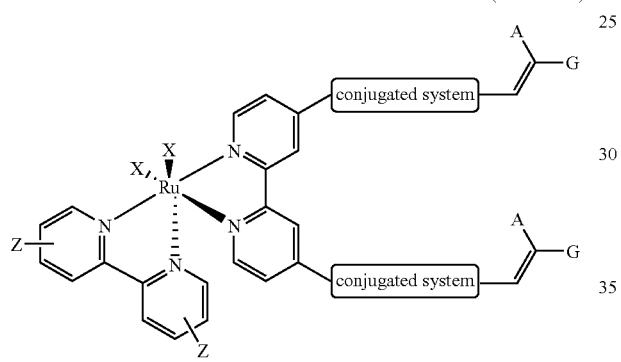

(formula 18)

L being a Z-substituted bipyridine, M being Ru

In one embodiment, the dye has following structure

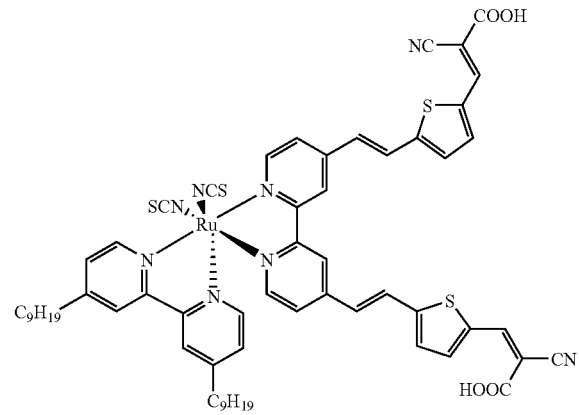

(formula 19)

In one embodiment, the dye includes a chromophore which is a Ruthenium bis(bipyridyl) complex and the anchoring group is directly attached to the chromophore

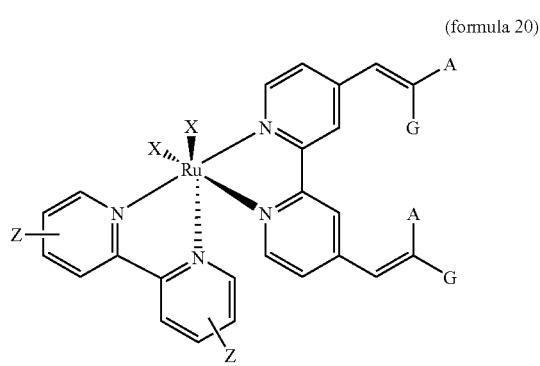

(formula 20)

the anchoring group being as defined in claim 1

In one embodiment, the dye has following structure

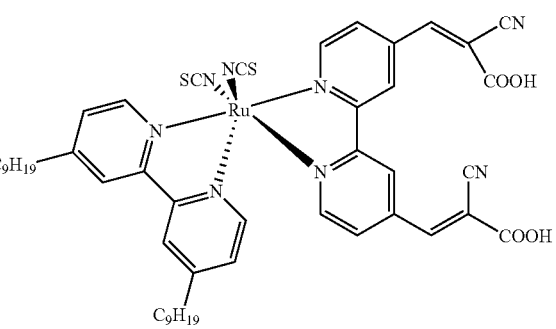

(formula 21)

The chromophores based on squarylium or croconium dye can be synthesized as follows:

2 equivalents of $[Ar_1—CH_3]^+Hal^-$, wherein $Hal^-=I^-$, $Br^-$, $Cl^-$, $NCS^-$ or $SCN^-$, or 2 equivalents of $[Ar_1=CH_2]$, are reacted with 1 equivalent of a squaric acid derivative or croconic acid derivative according to any of schemes 1-4

(scheme 1)

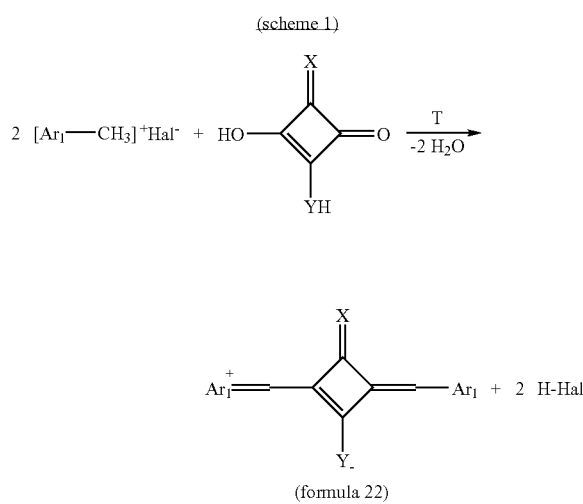

(formula 22)

(scheme 2)

(formula 22)

(scheme 3)

(formula 23)

(scheme 4)

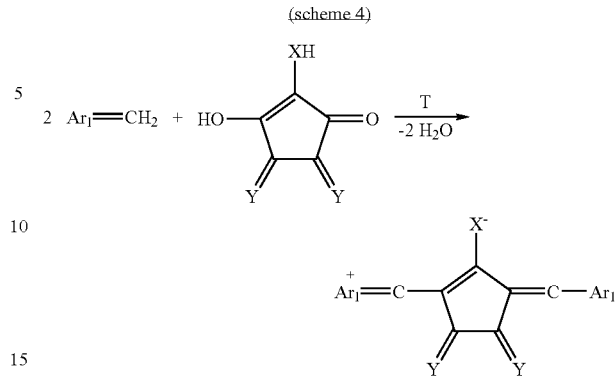

(formula 23)

wherein $Ar_1$ and $Ar_2$, X and Y are the same and are as defined in claim 3.

Alternatively, the chromophores based on squarylium or croconium dye can be synthesized as follows:

$Ar_1$ and $Ar_2$ are different and are as defined in claim 3, said method at least comprising:

a) formation of a chloro or alkyl ester of a squaric or croconic acid derivative substituted with one aromatic system $Ar_1$, $Ar_1$ being as defined in claim 3, as represented by one of schemes 5-8

(scheme 5)

(formula 24)

(scheme 6)

(formula 24)

(scheme 7)

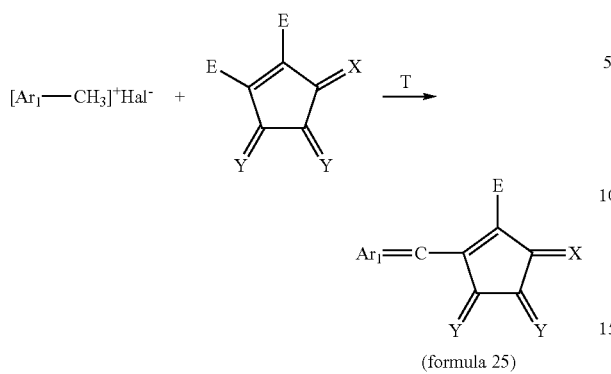

(formula 25)

(scheme 10)

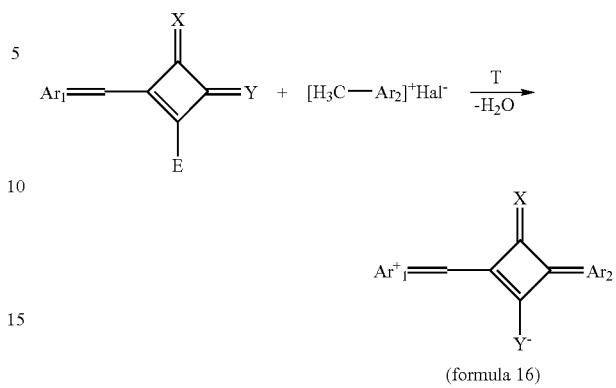

(formula 16)

(scheme 8)

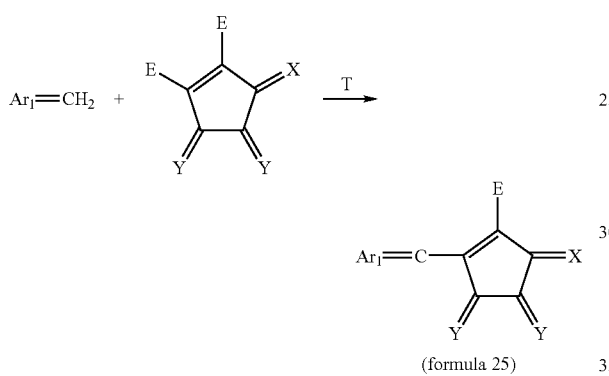

(formula 25)

(scheme 11)

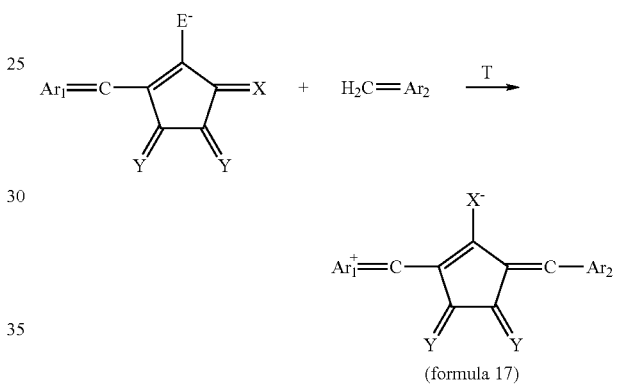

(formula 17)

X, Y, Ar$_1$, Ar$_2$ being as defined in claim 3, Hal$^-$ being I$^-$, Cl$^-$, Br$^-$, NCS$^-$ or SCN$^-$,
and
E being Cl or an alkoxy group, preferably, ethoxy, propoxy, iso-propoxy, butoxy group
b) condensation of the product of step a) with
[Ar$_2$—CH$_3$]$^+$Hal$^-$, wherein Hal$^-$=I$^-$, Br$^-$, Cl$^-$, CN$^-$, NCS$^-$ or SCN$^-$,
or
with [Ar$_2$=CH$_2$],
according to one of schemes 9-12

(scheme 12)

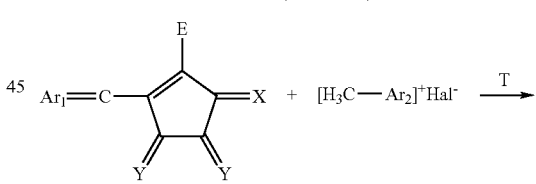

(formula 17)

(scheme 9)

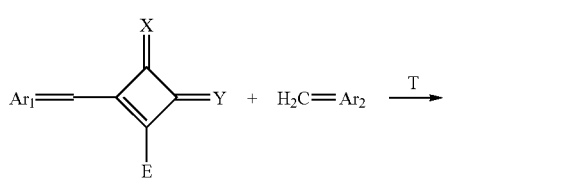

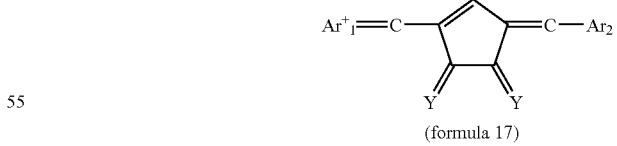

(formula 16)

to yield a squarylium dye or croconium dye having Ar$_1$ and Ar$_2$ which are different from each other.

Further, in case X and/or Y in the squaric and croconic acid moiety of the squarylium dye or croconium dye (formula 5 and 6 and formula 22 and 23) is O, a reaction to the respective derivatives with X and/or Y being at least one S, NH, C(CN)$_2$ is possible.

Reactions are exemplary shown below for squarylium dye derivatives:

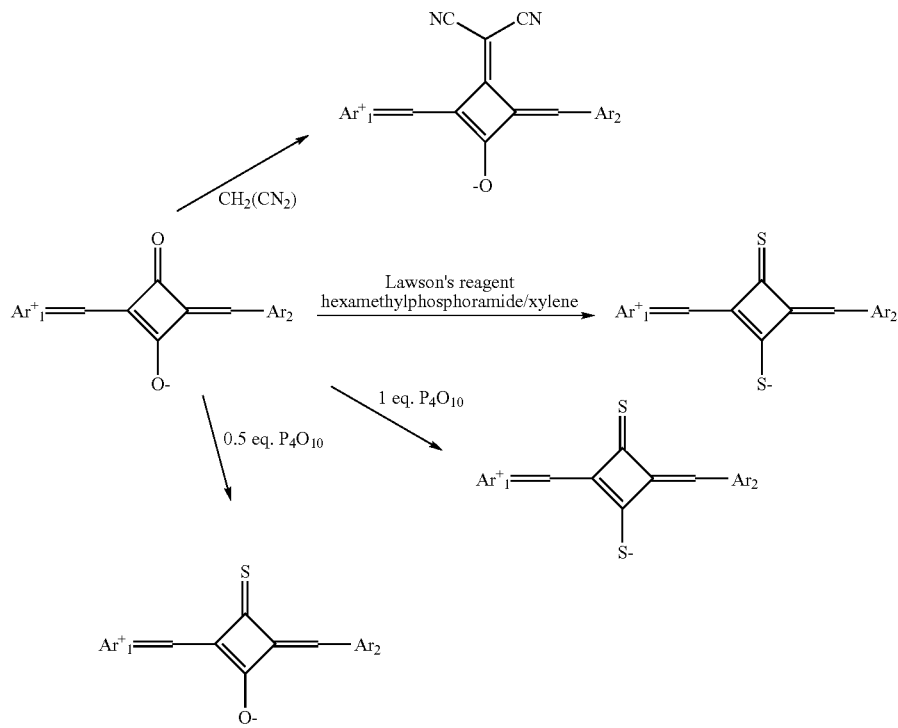

The dyes expressed by general formula 2 can be synthesized by following routes:
1)
step a) coupling of a halogenated chromophore and a metalated conjugated system as represented by the scheme

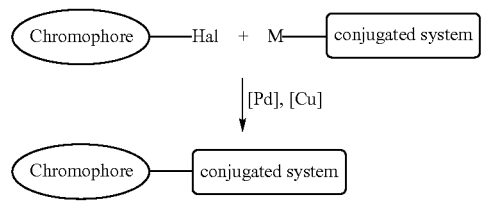

or
is the coupling of a metalated chromophore and a halogenated conjugated system, as represented by the scheme

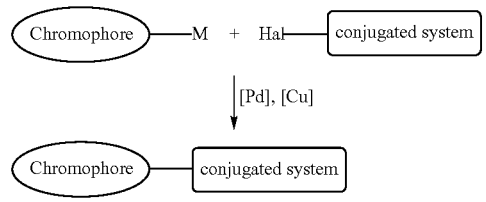

wherein
Hal=Br, I, Cl, Tosyl
M=Sn(alkyl)$_3$, B(OR)$_2$, MgHal, ZnR$_2$, R being in this case an alkyl group, Step b) introduction of carboxyaldehyde moiety into said conjugated system

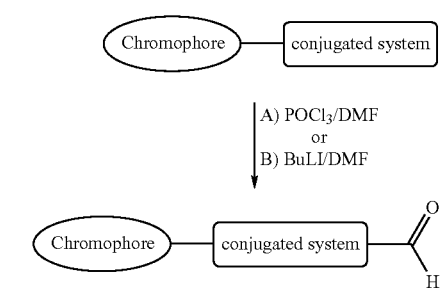

Step c) condensation reaction of the product of step b), with a reagent of general formula A-CH$_2$-G, as represented by the scheme

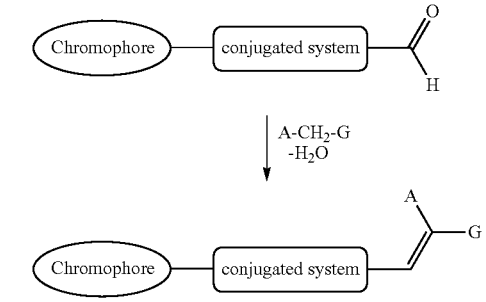

2) synthesis via a "protected dye"

A "protected dye" is a dye according to any of claims 1-15, wherein said group G in the anchoring group is protected and represented by general formula Gp Gp being —COOR, —SO$_3$R, —PO$_3$R$_2$, —BO$_2$R$_2$, —SR, —OR, —NR$_2$, R being any straight or branched alkyl chain of general formula C$_n$H$_{2n+1}$, n=1-12.

This protection of the acidic group is in some cases necessary when performing a transition metal coupling reaction, otherwise undesired by-reactions will occur.

In case functionalized conjugated system is a metalated conjugated system step a) is the introduction of said anchoring group into said functionalized metalated conjugated system, followed by step b) coupling of a halogenated chromophore and the product from step a, and steps a) and b) are represented by the scheme

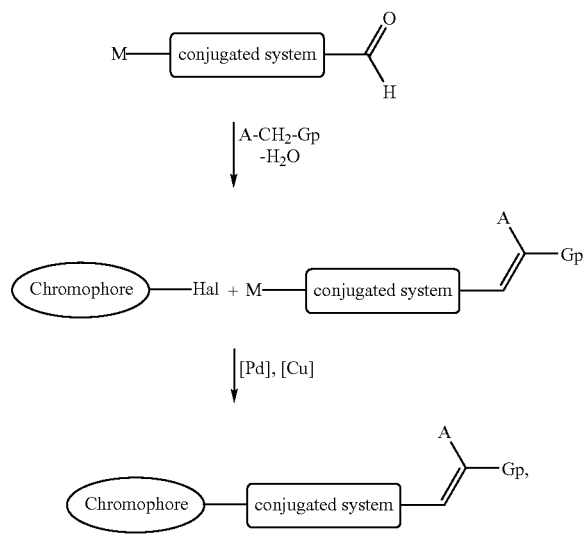

Or, in case conjugated system is a halogenated conjugated system, and step b) is the coupling of a metalated chromophore and the product from step a), steps a) and b) are represented by the scheme

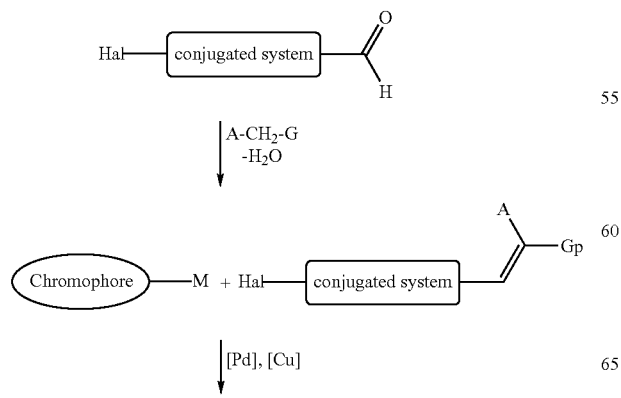

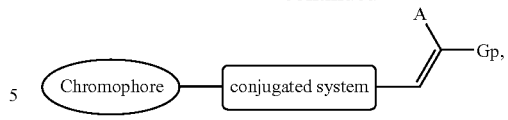

step c) is the deprotection of Gp to G, G being defined as in claim 1

The dyes expressed by general formula 4 can be synthesized by following routes:

step a) introduction of carboxyaldehyde moiety into a chromophore

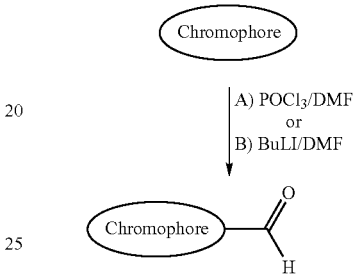

and b) condensation reaction of the product of step a), with a reagent of general formula A-CH$_2$-G, as represented by the scheme

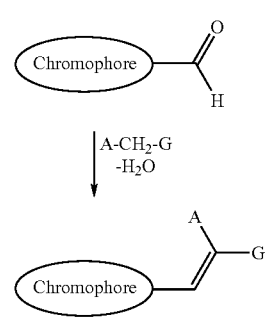

Moreover reference is made to the following examples which are given to illustrate, not to limit the present invention.

EXAMPLES

Hereinafter, examples for the synthesis, characterization and application of the dyes in DSSC as sensitizers and as molecular chromogenic sensors for solvents, such as methanol, e.g. in fuel cells, will be described.

Example 1

Figure 1:
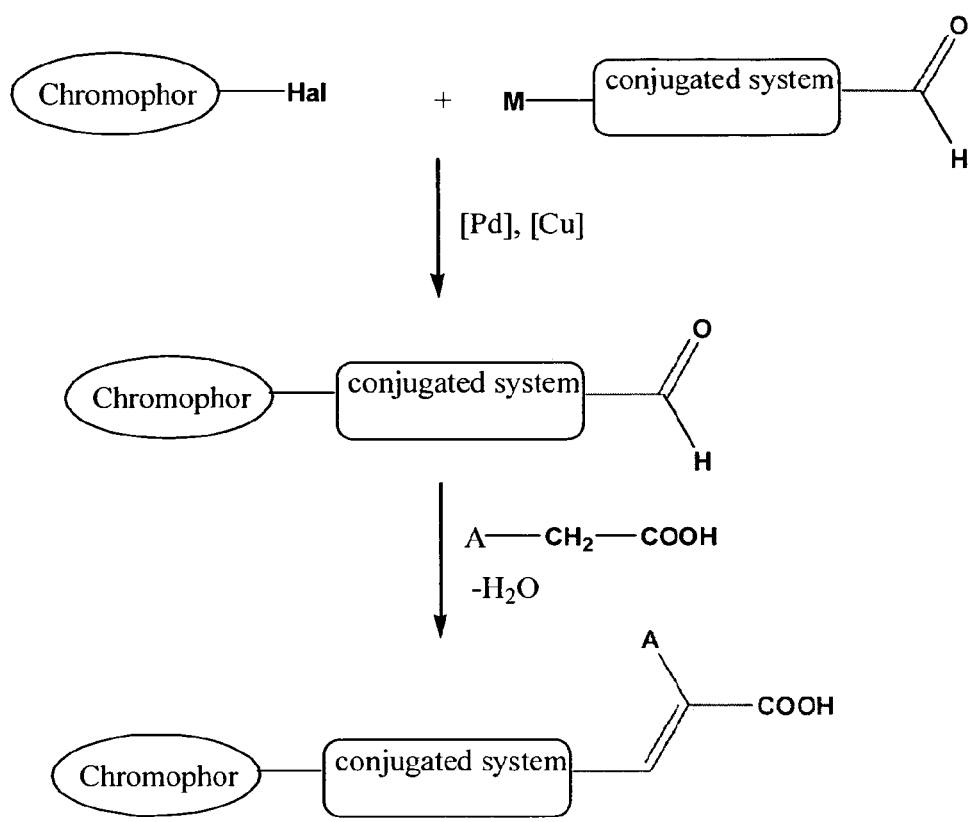
Figure 2:
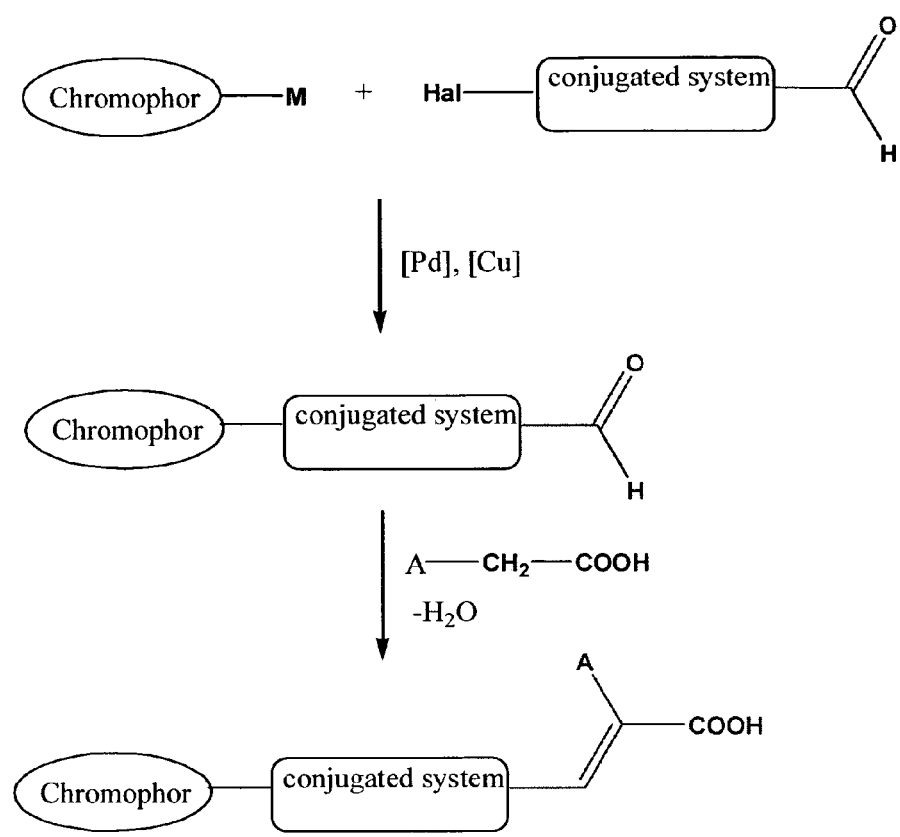
Figure 3:
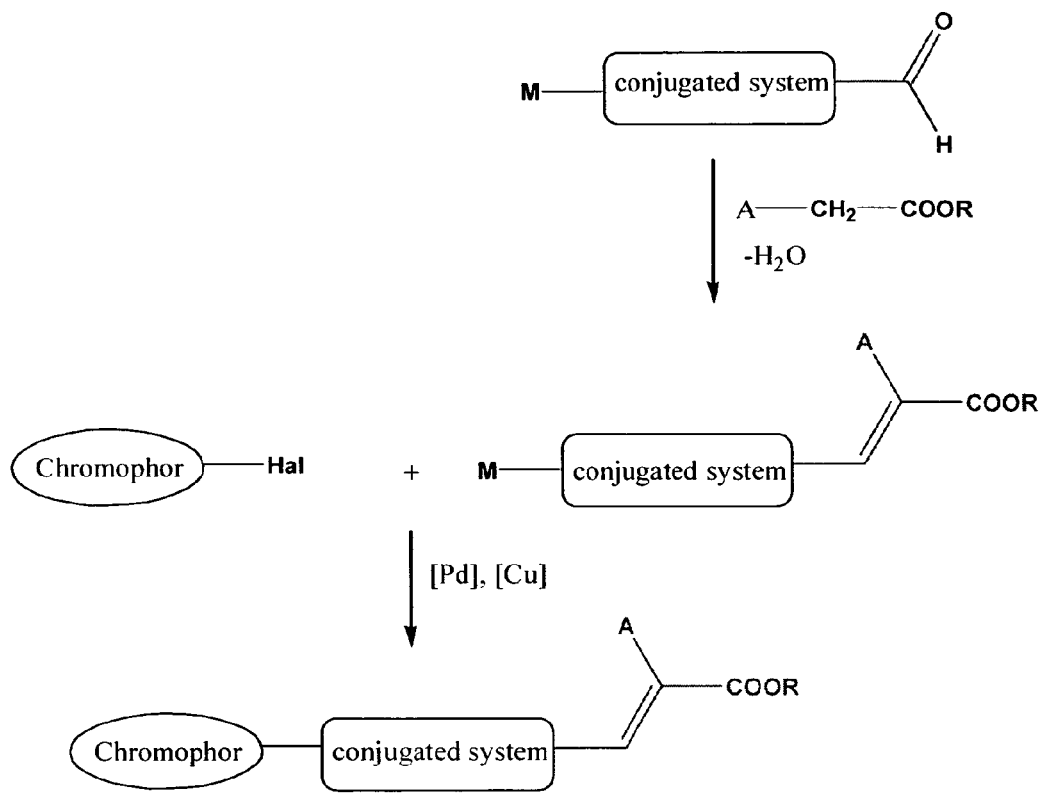
Figure 4:
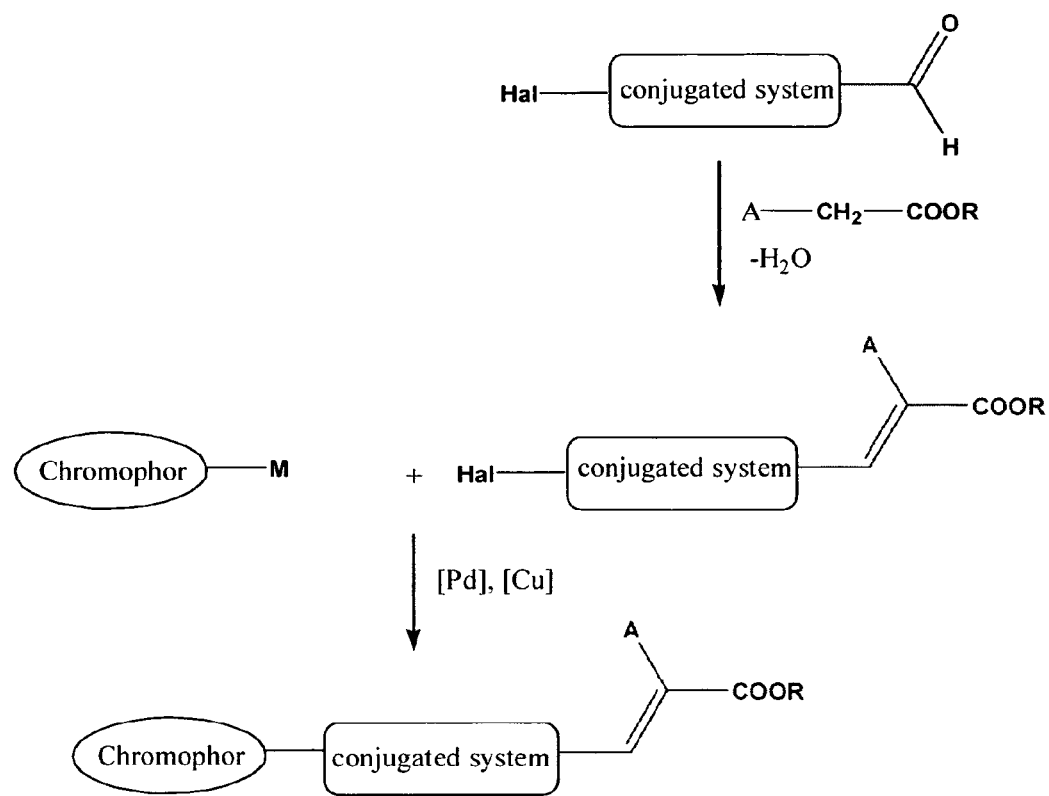
Figure 5:
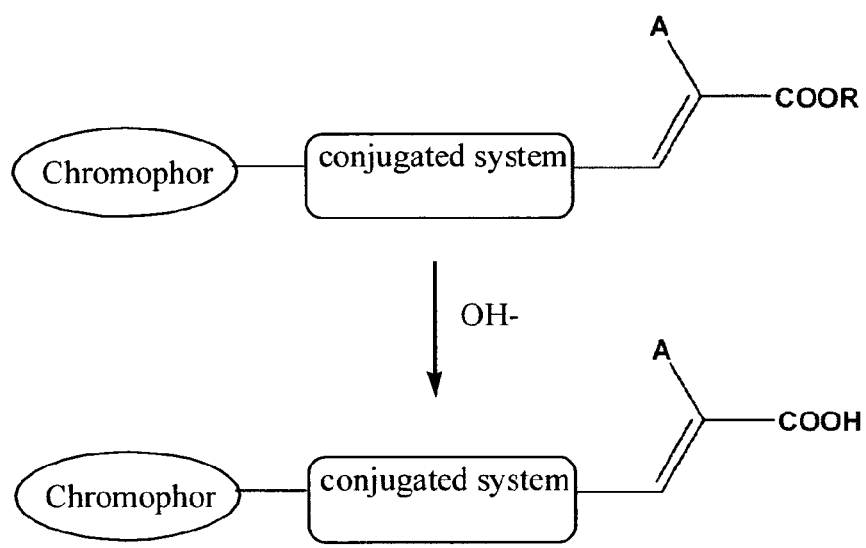
Figure 6:
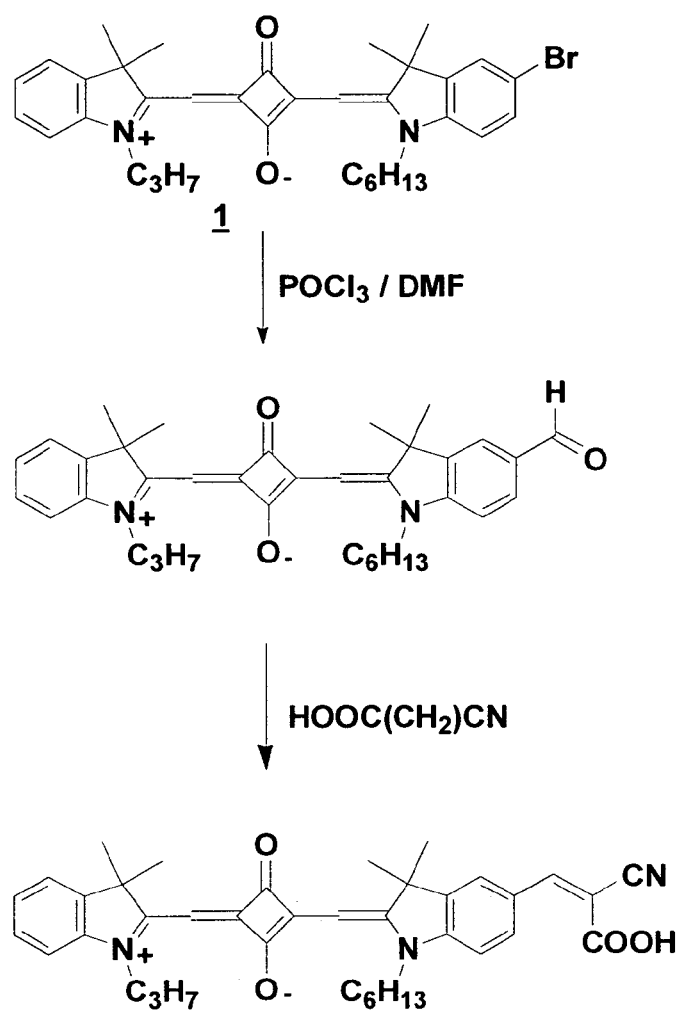

Synthesis Scheme of Dye being Described in Claim 1-2 Having Acrylic Acid Moiety Attached to Squarylium Dye Via a Thiophene as Conjugated System This is an example of the general synthesis scheme depicted in FIG. 1 by synthetic route described in claim 24, route 1

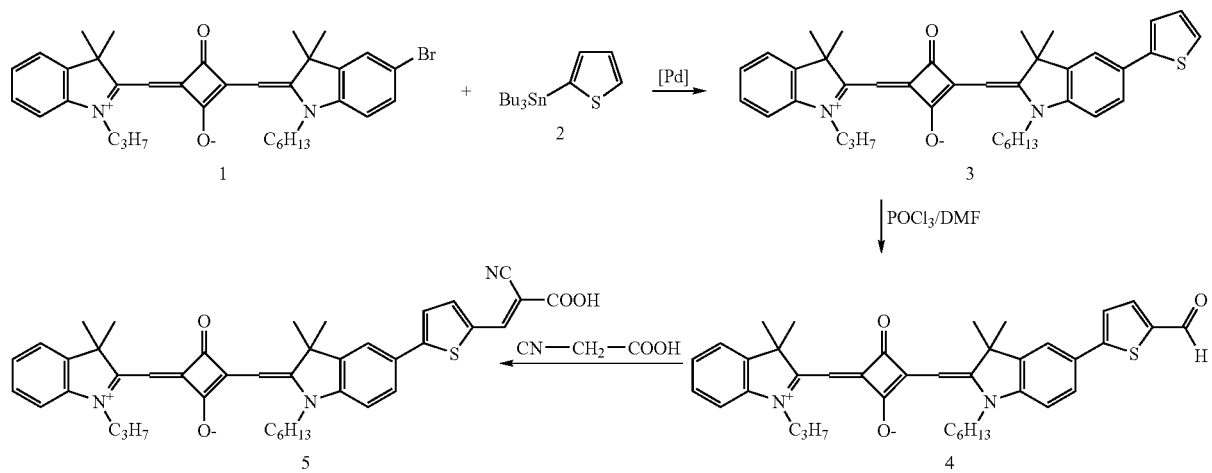

1 is halogenated chromophore
2 is metalated conjugated system
step a) Reaction of 1 and 2 by palladium mediated Stille coupling results in formation of compound 3; step b) The carboxylaldehyde moiety is introduced to compound 3 by Vilsmaier-Haak reaction; And step c) transformed by reaction of 4 with cyano-acetic acid to the targeted 5.

Step a) Under inert atmosphere, to a mixture of chromophore 1, 1 mol % catalysator $Pd(PPh_3)_4$, 1 equivalent of CsF in toluene, 1.2 equivalent of tributylstannyl-thiophene were added. The reaction mixture was stirred at 120° C. for 12 h. After cooling to room temperature, dichloromethane was added. The white salt ($Bu_3SnF$) formed during the reaction was filtered off and the solvent removed under reduced pressure. Purification of the crude product was performed by column chromatography on silica gel with (2/8) dichloromethane/ethylacetate to give the pure thiophene derived squarylium dye 3.

Analytical Data for 3

$C_{39}H_{44}N_2O_2S$ (604.84)

1H NMR (400 MHz, MeOD): δ=7.71 (s, 1H, arH), 7.62 (d, 1H, arH), 7.43 (d, 1I-1, arH), 7.39-7.34 (m, 3H, arH), 7.25-7.18 (m, 3H, arH), 7.08 (t, 1H, arH), 5.83 (d, 1H, H-7), 5.98 (s, 1H, =CH—), 5.94 (s, 1H, =CH—), 4.09 (q, 4H, N—CH2), 1.81-1.23 (m, 8H, CH2-Hex), 1.74 (s, 6H, CH3), 1.21 (t, 6H, CH3-Et), 1.24 1.72 (brs, 12H, CH3), 1.06 (t, 6H, CH3-Hex or CH3-Propyl), 0.91 (t, 6H, CH3-Hex or CH3-Propyl)

ESI MS m/z=605.3 [M+].

UV/VIS (acetonitrile): λmax=636 nm.

Step b) Under inert atmosphere, compound 3 is dissolved in anhydrous DMF. 1 equivalent of POCl3 is slowly added and the mixture stirred at 70° C. for 4 hours. The mixture is allowed to cool down to room temperature, ice and water are added and aqueous NaOH for neutralisation. The mixture is extracted with dichloromethane and the solvent removed under reduced pressure. The crude product is purified by column chromatography on silica gel with (2/8) acetone/ethylacetate to give the pure compound 4.

Analytical Data for 4

$C_{40}H_{44}N_2O_3S$ (632.85)

1H NMR (400 MHz, CDCl3): δ=9.89 (s, 1H, H-aldehyde), 7.76 (d, 1H, arH), 7.64 (m, 2H, arH), 7.42-7.32 (m, 4I-1, arH), 7.19 (t, 1H, arH), 7.05 (d, 1H, arH), 6.97 (s, 1H, arH), 5.98 (s, 1H, =CH—), 5.34 (s, 1H, =CH—), 4.02 (brs, 2H, N—CH2), 3.95 (brs, 2H, N—CH2), 1.81-1.23 (m, 8H, CH2-Hex), 1.74 (s, 6I-1, CH3), 1.21 (t, 6H, CH3-Et), 1.24 1.72 (brs, 12H, CH3), 1.06 (t, 6H, CH3-Hex or CH3-Propyl), 0.91 (t, 6H, CH3-Hex or CH3-Propyl)

ESI MS m/z=633.4 [M+].

UV/VIS (acetonitrile): λmax=654 nm.

Step c) A mixture of compound 4 and acrylic acid in acetonitrile are heated in the presence of small amount of piperidine to 80° C. for 12 hours. After cooling, the solvent is removed under reduced pressure and the crude product is purified by column chromatography on silica gel with (5/5) acetone/ethylacetate to give the dye 5 as a bluish green powder.

Analytical Data for 5

$C_{40}H_{44}N_2O_3S$ (632.85)

1H NMR (400 MHz, CDCl3): δ=8.18 (s, 1H, =CH—), 7.79 (d, 1H, arH), 7.31 (d, 1H, arH), 7.42-7.32 (m, 4H, arH), 7.19 (dd, 1H, arH), 7.01 (d, 1H, arH), 6.95 (s, 1H, arH), 5.98 (s, 1H, =CH—), 5.34 (s, 1H, =CH—), 4.02 (brs, 21-1, N—CH2), 3.95 (brs, 2H, N—CH2), 1.81-1.23 (m, 8H, CH2-Hex), 1.74 (s, 61-1, CH3), 1.21 (t, 6H, CH3-Et), 1.24 1.72 (brs, 12H, CH3), 1.06 (t, 6H, CH3-Hex or CH3-Propyl), 0.91 (t, 6H, CH3-Hex or CH3-Propyl)

ESI MS m/z=700.3 [M+].

UV/VIS (acetonitrile): λmax=659 nm.

Halogenated chromophore 1 which represents a general structure 5 can be prepared by two different routes.

Route 1).

Step a)

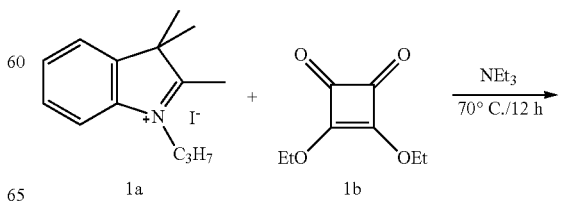

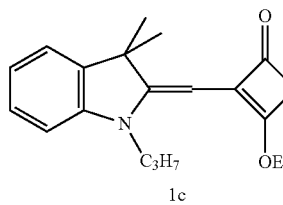
1c

A mixture of 1a, diethylester derivative of squaric acid 1b, triethylamine in ethanol was heated to 70° C. for 12 h. The solvent was removed and the crude product was purified by column chromatography on silica gel with dichloromethane as eluent. The pure semisquaric acid derivative 1c was isolated as orange solid.

Step b)

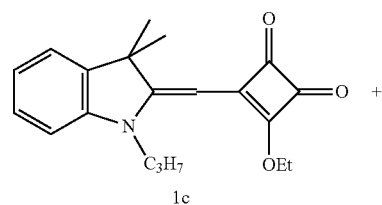
1c

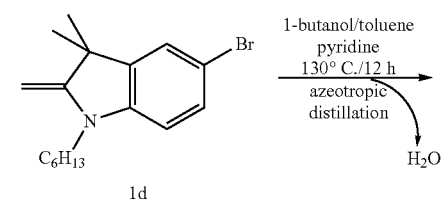
1d

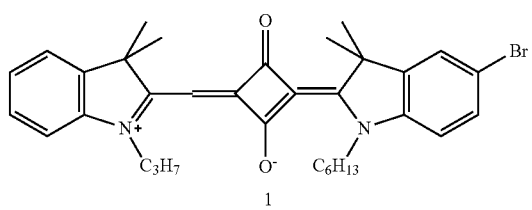
1

Substituted semisquaric acid derivative 1c was reacted with 1 equivalent of 1d in a 1:1 mixture of 1-butanol/toluene in the presence of pyridine. Under reflux (130° C.), the reaction generated water that was removed by azeotropic distillation. After 1 h reaction time, formation of squarylium dye was indicated by the appearance of a blue-green colour. After 12 h at 130° C., the reaction mixture was allowed to cool to room temperature and the solvent removed under reduced pressure. The crude product was purified by column chromatography on silica gel with dichloromethane/ethylacetate as eluent. The pure product 1 was isolated as green solid.

Route 2) In this case in step a) a brominated semisquaric acid derivative is produced.

Step a)
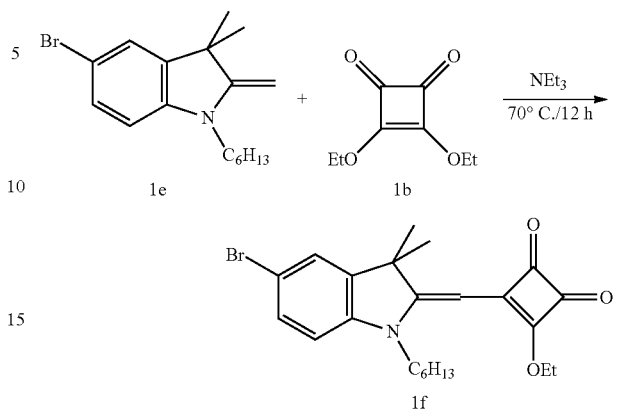
1f

A mixture of 1e, diethylester derivative of squaric acid 1b, triethylamine in ethanol was heated to 70° C. for 12 h. The solvent was removed and the crude product was purified by column chromatography on silica gel with dichloromethane as eluent. The pure brominated semisquaric acid derivative 1f was isolated as orange solid.

Step b)

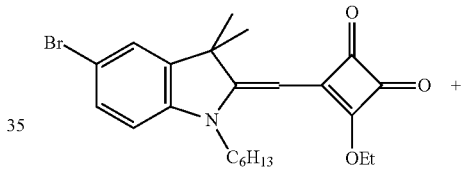
1c

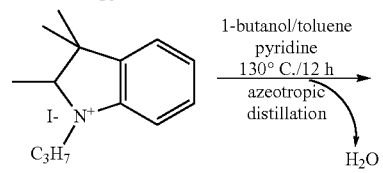
1a

1

Substituted semisquaric acid derivative 1c was reacted with 1 equivalent of 1a in a 1:1 mixture of 1-butanol/toluene in the presence of pyridine. Under reflux (130° C.), the reaction generated water that was removed by azeotropic distillation. Already after 20 minutes reaction time, formation of squarylium dye was indicated by the appearance of a blue-green colour. After 12 h at 130° C., the reaction mixture was allowed to cool to room temperature and the solvent removed under reduced pressure. The crude product was purified by column chromatography on silica gel with dichloromethane/ethylacetate as eluent. The pure product 1 was isolated as green solid.

Example 2

Synthesis of a Dye Being Described in Claims 1, 2 and 12 Having a Cyano Acrylic Acid Moiety Directly Attached Via a Vinylthiophene Moiety to a bis(bipyridine)Ru Chromophore

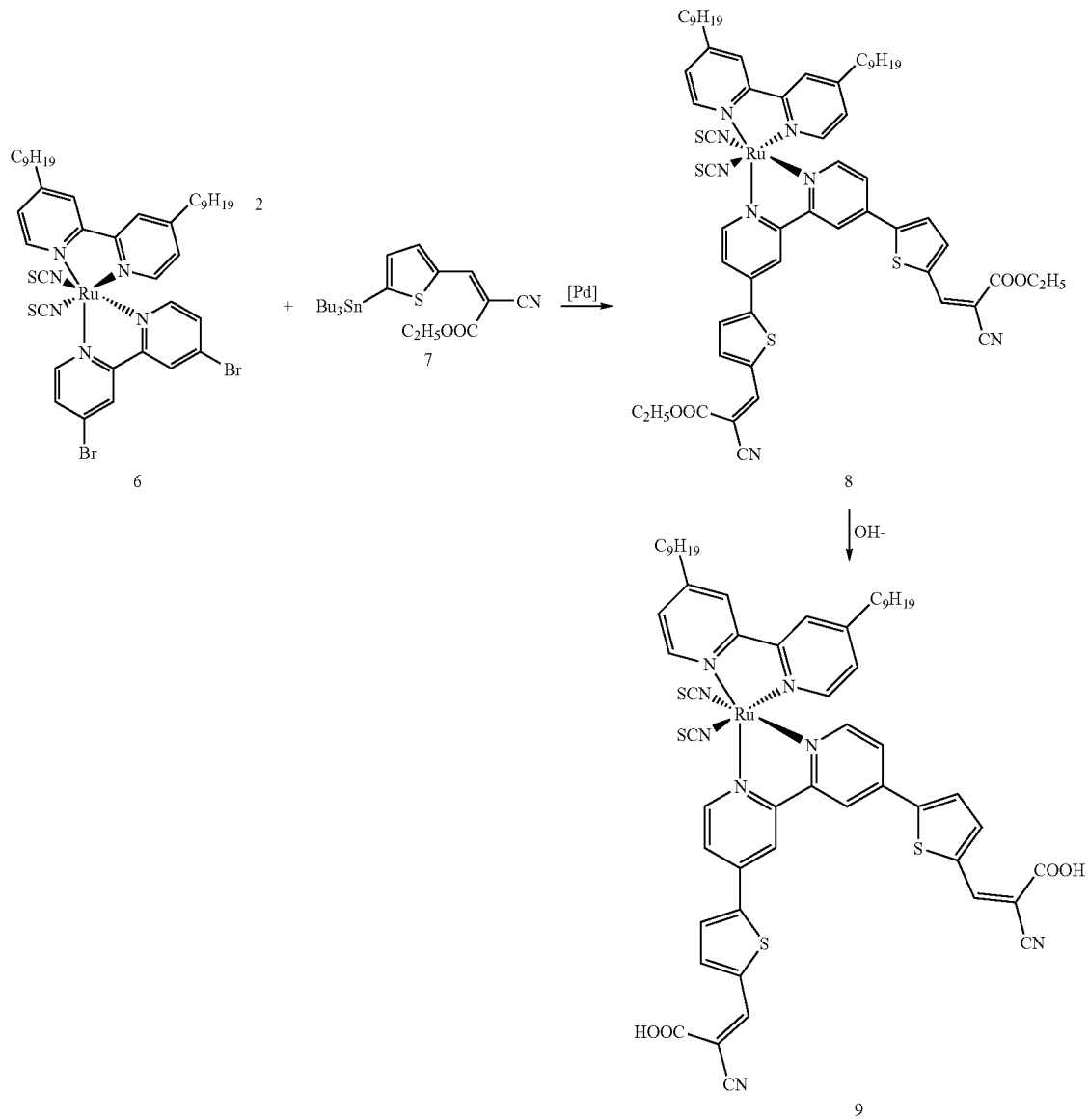

6 is halogenated chromophore 7 is metalated conjugated system with attached protected anchoring group A detail synthesis of the metalated conjugated system with attached protected anchoring group 7 is given below

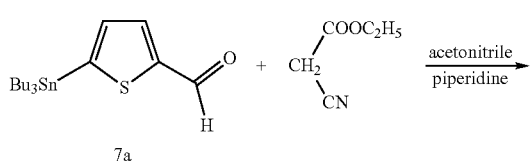

-continued

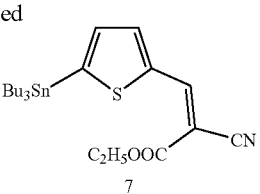

A mixture of compound 7a and cyano acetic acid ethylester in acetonitrile are heated in the presence of small amount of piperidine to 80° C. for 12 hours. After cooling the solvent is removed under reduced pressure. After purification of the crude product by chromatography on silica gel with dichloromethane/ethylacetate as eluent, the pure product 7 is isolated as yellow solid.

Example 3

Molecular Modelling—Theoretical Calculations of Dye 5 Having Acrylic Acid Moiety Attached to Squarylium Dye Via a Thiophene as Conjugated System Molecular modeling was performed by using Materials Studio 4.0 DMol3 software based on density functional theory. This dye exhibits physical properties shown in the figures below and are expected to lead to an improved performance of the dye in a dye-sensitized solar cell. This is because of the given structure of the dye in formula 1.

Figure 7:
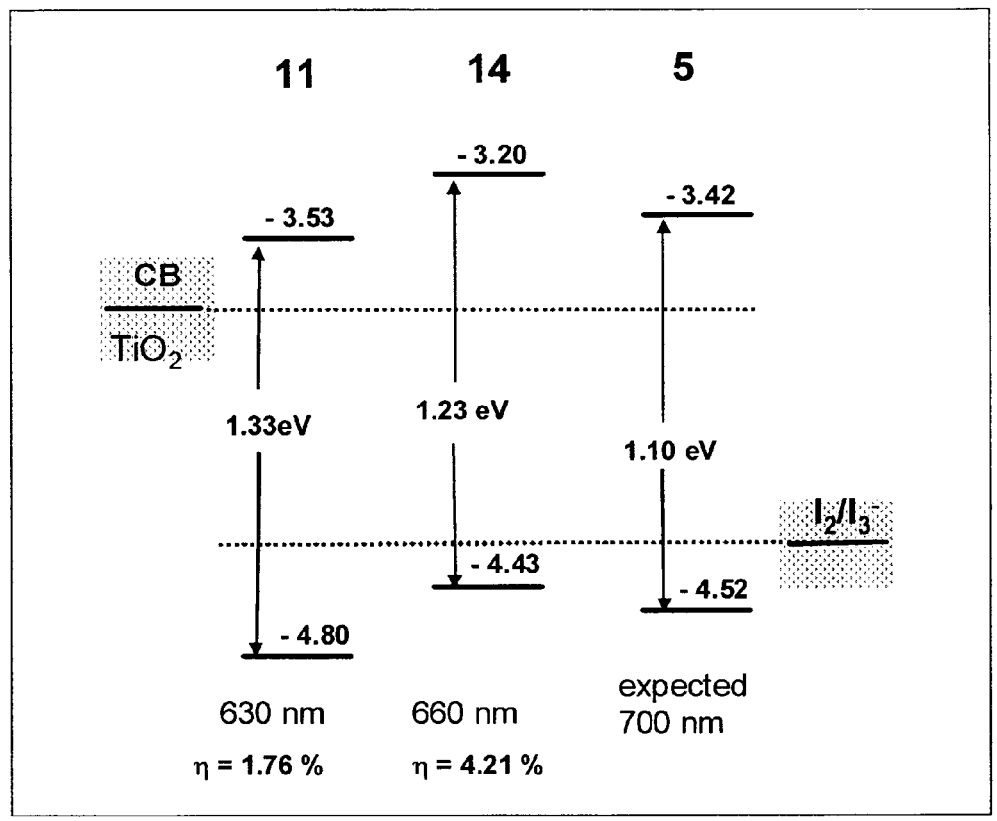
Figure 8:
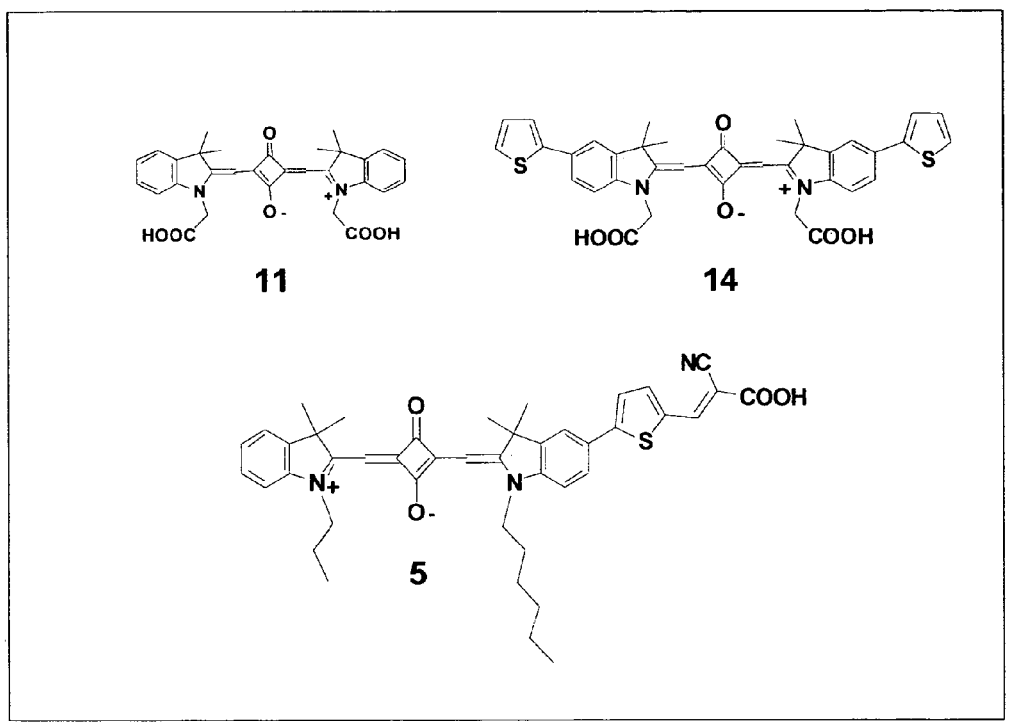

FIG. 7 shows energy levels of DSSC including for comparison the energy levels of different squarylium dyes. The structure of the dyes is given in FIG. 8. Squarylium dye 11 and 14 have an absorption at 630 nm and 660 nm, respectively and efficiency of the DSSC of 1.76% and 4.21%. Based on the calculations we expect better performance of the DSSC prepared with 5 as sensitizer.

The calculations predict for the sensitizer dye 5
Lower band-gap and absorption at around 700 nm.
well matched energy levels to semiconductor and redox pair These properties are strongly related with the nature of the chromophore and conjugated system.

Figure 9:
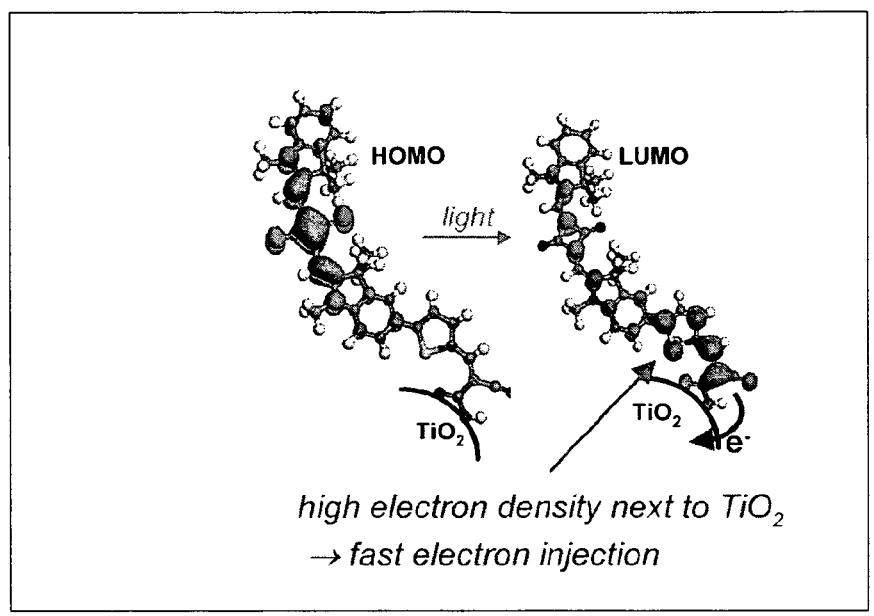

FIG. 9 shows the electron distribution of the sensitizer dye 5 in ground and excited state. The nature of the anchor group allows an intramolecular relocation of the electron density by photoexcitation. On the left the molecule in ground state shows the electron density is highest on the chromophore, far away from the semiconductor surface. On the right side the LUMO of the molecule is depicted. This is correlated with the electron distribution of the molecule after photoexcitation. After photoexcitation, the electron density is very high in the vicinity of the anchoring group that allows the direct coupling with the nanoporous semiconductor. The present inventors believe that this situation enables a very fast electron injection.

Hence, overall, in the present application, dyes are disclosed which are stable and are characterized by a strong absorption and emission in the visible and IR region of the solar spectrum, and they are useful as sensitizers in DSSCs for these regions. In combination with the standard red-dye or other organic dyes, they are able to collect the solar light over a broad range of the solar spectrum. The present inventors describe a molecular design of these dyes for improved performance in dye-sensitized solar cells. The anchoring group is believed to be responsible for the efficient adsorption of the dye-sensitizer onto the nanoporous semiconductor surface and consist of an acrylic acid moiety which is optionally bridged by a conjugated system to the main core of the dye. This kind of anchoring group is believed to enable a photo-excitation induced intramolecular electron density relocation in organic dyes resulting in better performance of the sensitizer in a photovoltaic device.

Synthesis of Chromophores which are Squarylium Dyes Being Described in Claim 3 with General Structure of Formula 5 are Given Below

Example 4

Synthesis of Symmetrical Squarylium Dye 10

2,4-Bis[(1-(acetic acid ethyl ester-1-yl)-3,3-dimethyl-2,3-dihydroindole-2-ylidene)methyl]-cyclobutenediylium-1,3-diolate Indole derivative 10a was reacted with 0.5 equivalent of squaric acid in a 1:1 mixture of 1-butanol/toluene in the presence of pyridine. Under reflux, the reaction generates water that was removed by azeotropic distillation by using a Dean-Stark trap. After 1 h reaction time, the appearance of a green-blue colour could be observed evidencing the formation of the squarylium dye. The reaction was monitored by TLC and after 12 h no further change in conversion was observed. After cooling at room temperature, dichloromethane was added and the reaction mixture filtered off. The solvent was removed under reduced pressure. The crude product was purified by column chromatography on silica gel with (5/5) dichloromethane/ethylacetate to give the product 10 as green solid.

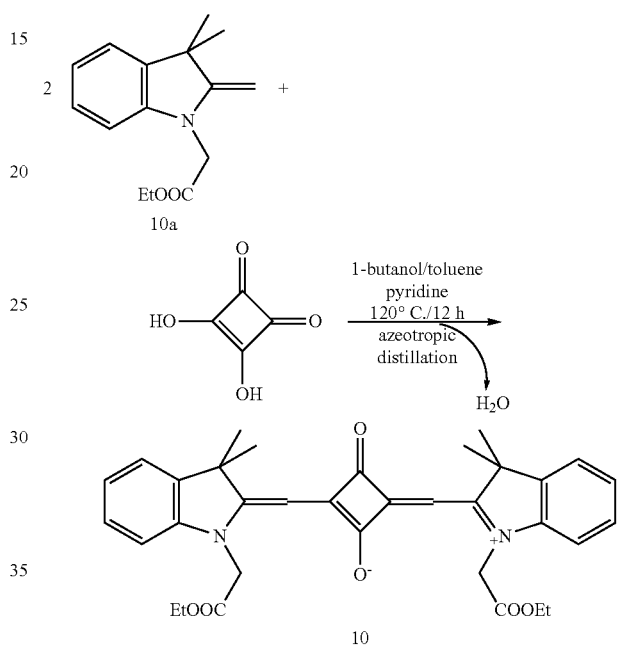

Analytical Data for 10
$C_{34}H_{36}N_2O_6$ (568.26)
$^1$H NMR (400 MHz, CDCl$_3$): δ=7.29 (d, 2H, H-4), 7.22 (m, 2H, H-6), 7.09 (dd, 2H, H-5), 5.83 (d, 2H, H-7), 5.78 (s, 2H, =CH—), 4.68 (brs, 4H, N—CH$_2$), 4.10 (q, 4H, CH$_2$-Et), 1.72 (brs, 12H, CH$_3$), 1.21 (t, 6H, CH$_3$-Et)
MALDI-TOF MS m/z=567.9 [M$^+$].
UV/VIS (dichloromethane): $\lambda_{max}$=629 nm.

Example 5

Synthesis of Symmetrical Squarylium Dye 11

2,4-Bis[(1-(acetic acid-1-yl)-3,3-dimethyl-2,3-dihydroindole-2-ylidene)methyl]cyclobutene-diylium-1,3-diolate To a solution of squarylium dye 10 in ethanol 10%-aqueous NaOH was added. The reaction mixture was refluxed. As indicated by TLC reaction control, after 45 minutes a complete deprotection of the carboxy-group was achieved. After cooling, 1M HCl was added to the reaction mixture until the precipitation of a blue solid was observed. The solid was isolated by centrifugation and washed several times with diethylether. Additional purification of the product was performed by column chromatography on silica gel with (9/1) ethylacetate/methanol. Squarylium dye 11 was isolated as a blue-green solid.

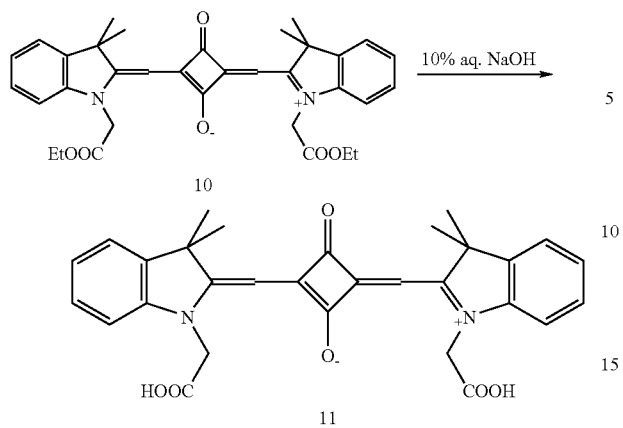

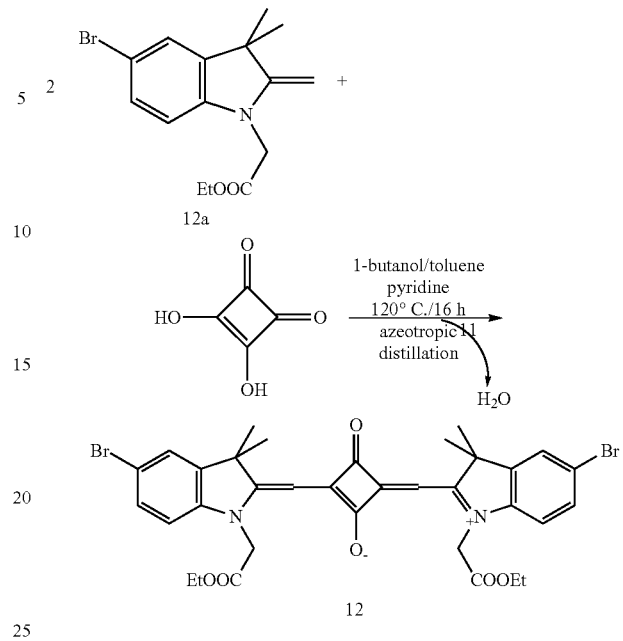

Analytical Data for 11

C$_{30}$H$_{28}$N$_2$O$_6$ (512.55)

$^1$H NMR (400 MHz, DMSO): δ=7.53 (d, 2H, H-4), 7.32, 7.17 (m, 6H, H-5,6,7), 5.65 (s, 2H, =CH—), 4.96 (brs, 4H, N—CH$_2$), 1.69 (s, 12H, CH$_3$).

UV/VIS (ethanol): λ$_{max}$(ε)=632 nm (8.66×10$^5$).

Example 6

Synthesis of Symmetrical Squarylium Dye 12

2,4-Bis[1-(acetic acid ethyl ester-1-yl)-5-bromo-3,3-dimethyl-2,3-dihydroindole-2-ylidene)methyl]-cyclobutenediylium-1,3-diolate Brominated indoline 12a was reacted with 0.5 equivalent of squaric acid in a 1:1 mixture of 1-butanol/toluene in the presence of pyridine. Under reflux, the reaction generated water that was removed by azeotropic distillation by using a Dean-Stark trap. After 1 h reaction time, formation of squarylium dye was indicated by the appearance of a bluish colour. After 16 h at 120° C., the reaction mixture was allowed to cool to room temperature and the solvent removed under reduced pressure. The crude product was purified by column chromatography on silica gel with (4/6) dichloromethane/ethylacetate. Product 12 was isolated as green solid.

Analytical Data for 12:

C$_{34}$H$_{34}$Br$_2$N$_2$O$_6$ (726.4)

$^1$H NMR (400 MHz, CDCl$_3$): δ=7.49 (s, 2H, H-4), 7.46 (d, 2H, H-6), 6.79 (d, 2H, H-7), 5.89 (s, 2H, =CH—), 4.72 (brs, 4H, N—CH$_2$), 4.14 (q, 4H, CH$_2$-Et), 1.79 (brs, 12H, CH$_3$), 1.28 (t, 6H, CH$_3$-Et)

ESI MS m/z=726.0 [M$^+$].

UV/VIS (dichloromethane): λ$_{max}$=639 nm.

Example 7

Synthesis of Symmetrical Squarylium Dye 13

2,4-Bis[1-(acetic acid ethyl ester-1-yl)-3,3-dimethyl-5-(thien-2-yl) 2,3-dihydroindole-2-ylidene)methyl]-cyclobutenediylium-1,3-diolate

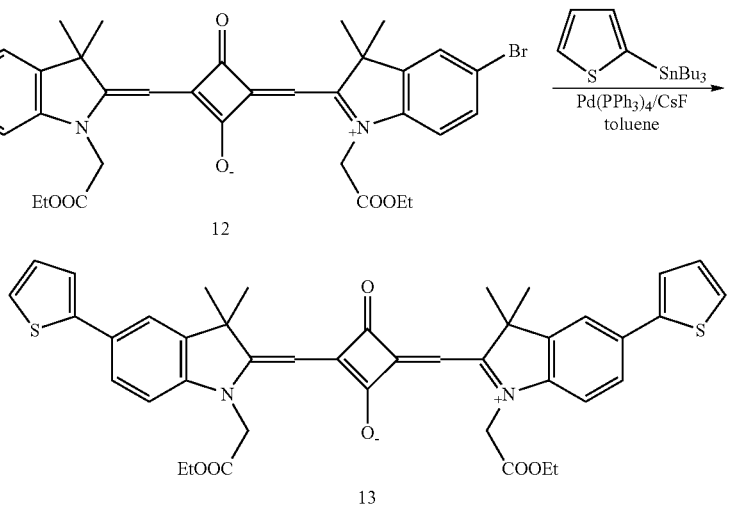

Introduction of the thiophene-unit to the squarylium dye framework was achieved by palladium catalyzed Stille coupling reaction. Under inert atmosphere, to a mixture of brominated squarylium dye 12, Pd(PPh$_3$)$_4$, 2 equivalents of CsF in toluene, thienyl-stannane was added. The reaction mixture was stirred at 120° C. for 12 h. After cooling to room temperature, dichloromethane was added. The white salt (Bu$_3$SnF) formed during the reaction was filtered off and the solvent removed under reduced pressure. Purification of the crude product was performed by column chromatography on silica gel with (2/8) dichloromethane/ethylacetate to give the pure thiophene derived squarylium dye 13 as green solid.

Analytical Data for 13

C$_{42}$H$_{49}$N$_2$O$_6$S$_2$ (732.23)

$^1$H NMR (400 MHz, CDCl$_3$): δ=7.49 (m, 4H, H-4,6), 7.24 (m, 4H, H-3,5-Th), 7.04 (m, 2H, H-4-Th), 6.86 (d, 2H, H-7), 5.94 (s, 2H, =CH—), 4.82 (brs, 4H, N—CH$_2$), 4.22 (q, 4H, CH$_2$-Et), 1.75 (brs, 12H, CH$_3$), 1.24 (t, 6H, CH$_3$-Et)

MALDI-TOF MS m/z=732.2 [M$^+$].

UV/VIS (dichloromethane): λ$_{max}$=666 nm.

Example 8

Synthesis of Symmetrical Squarylium Dye 14

2,4-Bis[1-(acetic acid-1-yl)-3,3-dimethyl-5-(thien-2-yl) 2,3-dihydroindole-2-ylidene)methyl]-cyclobutenediylium-1,3-diolate To a solution of squarylium dye 13 in ethanol aqueous NaOH was added. The mixture was stirred at 40° C. and the reaction was permanently monitored by TLC. After 3 h complete conversion was achieved. After cooling, water and 1M HCl was added. Ethanol was removed under reduced pressure and the reaction mixture kept for 8 h at 4° C. in fridge. The blue precipitate was isolated by centrifugation and washed several times with diethylether. Additional purification of the product was performed by column chromatography on silica gel with (7/3) ethylacetate/methanol. Squarylium dye 14 was isolated as a blue-green solid.

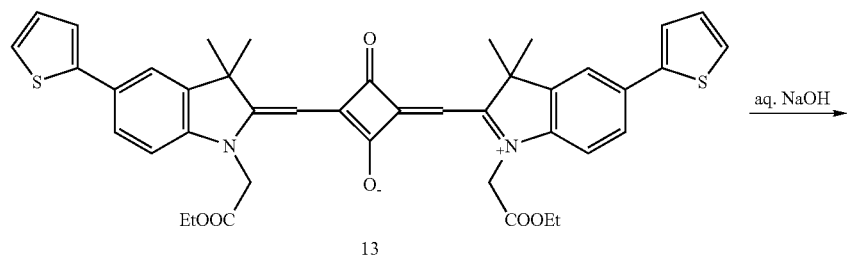

13

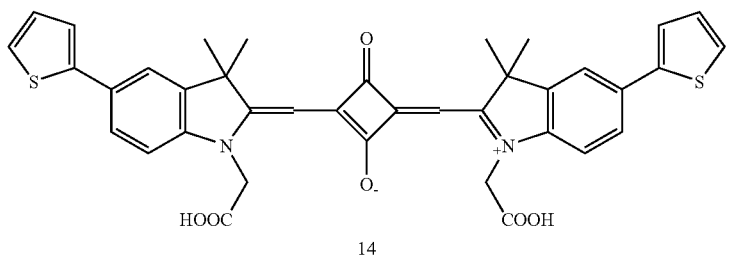

14

Analytical Data for 14

$C_{38}H_{38}N_2O_6S_2$ (676.8)

$^1H$ NMR (400 MHz, $CDCl_3$): δ=7.58 (m, 4H, H-4,6), 7.31 (m, 4H, H-3,5-Th), 7.11 (m, 2H, H-4-Th), 6.93 (d, 2H, H-7), 6.02 (brs, 2H, =CH—), 4.89 (brs, 4H, N—$CH_2$), 4.29 (q, 4H, $CH_2$-Et), 1.82 (brs, 12H, $CH_3$), 1.33 (t, 6H, $CH_3$-Et)

MALDI-TOF MS m/z=587.2 [$M^+$-2$CO_2$]; 631.2 [$M^+$-$CO_2$]; 676.2 [$M^+$]

UV/VIS (ethanol): $\lambda_{max}$ (ε)=665 nm (3.46×10$^5$)

Example 9

Synthesis of Symmetrical Squarylium Dye 15

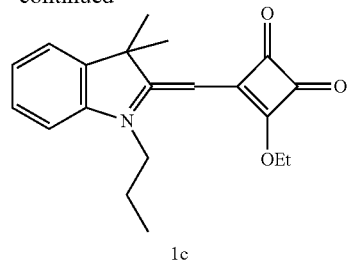

A mixture of 1a, diethylester diethylester derivative of squaric acid 1b, triethylamine in ethanol was heated to 70° C.

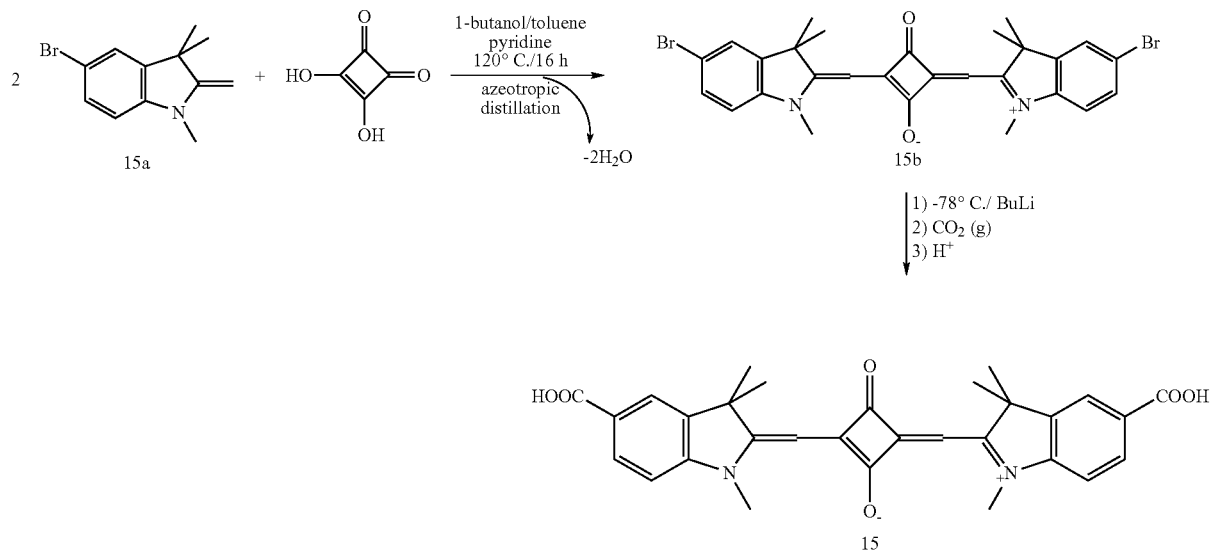

Example 10

Synthesis of Asymmetrical Dye 16

Step a 3-(3,3-Dimethyl-1-propyl-1,3-dihydro-indol-2-ylidenemethyl)-4-ethoxy-cyclobut-3-ene-1,2-dione 1c for 12 h. The solvent was removed and the crude product was purified by column chromatography on silica gel with dichloromethane as eluent. The pure product 1c was isolated as orange solid.

Step b

2-[(3,3-dimethyl-1-propyl-2,3-dihydroindole-2-ylidene)methyl]-4-[(1-(acetic acid ethyl ester-1-yl)-3,3-dimethyl-1,3-dihydroindole-2-ylidene)methyl]-cyclobutenediylium-1,3-diolate 16

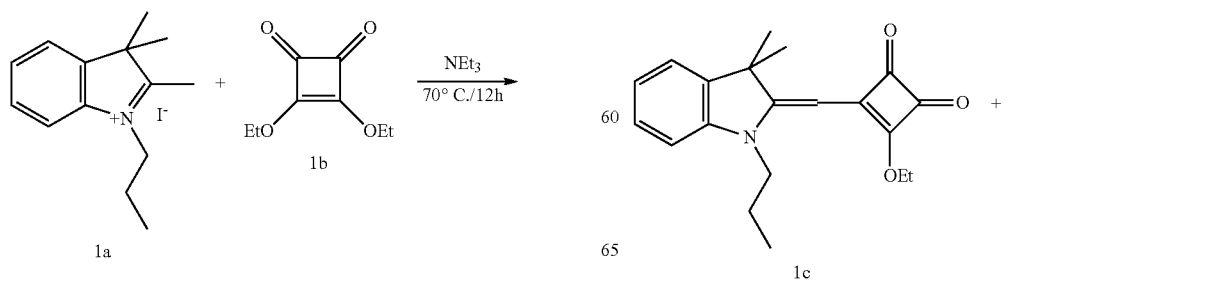

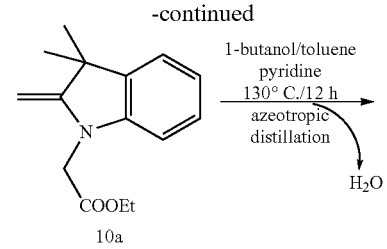

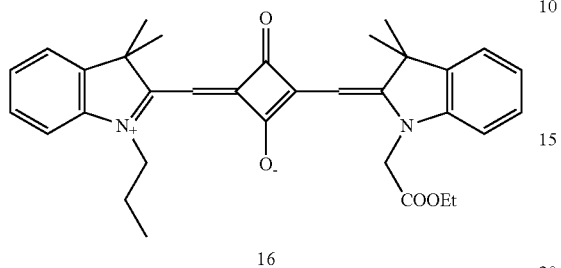

16

Substituted semisquaric acid derivative 1c was reacted with 1 equivalent of 10a in a 1:1 mixture of 1-butanol/toluene in the presence of pyridine. Under reflux (130° C.), the reaction generated water which was removed by azeotropic distillation by using a Dean-Stark trap. After 1 h reaction time, formation of squarylium dye was indicated by the appearance of a blue-green colour. After 12 h at 120° C., the reaction mixture was allowed to cool to room temperature and the solvent removed under reduced pressure. The crude product was purified by column chromatography on silica gel with (1:1) dichloromethane/ethylacetate as eluent. The pure product 16 was isolated as green solid.

Example 11

Synthesis of Asymmetrical Dye 17

2-[(3,3-dimethyl-1-propyl-2,3-dihydroindole-2-ylidene)methyl]-4-[(1-(acetic acid-1-yl)-3,3-dimethyl-1,3-dihydroindole-2-ylidene)methyl]-cyclobutenediylium-1,3-diolate

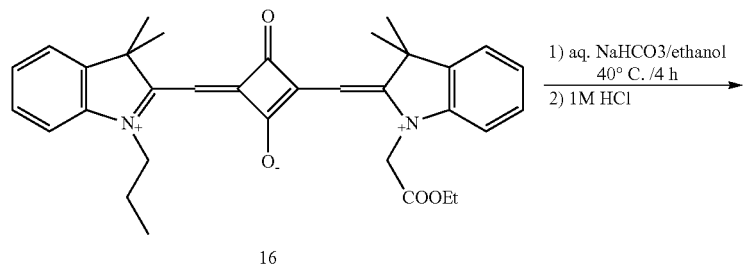

To a solution of squarylium dye 16 in ethanol, aqueous NaHCO$_3$ was added. The mixture was stirred at 40° C. and the reaction was permanently monitored by TLC. After 4 h complete conversion was achieved. After cooling, water and 1M HCl was added. Ethanol was removed under reduced pressure and the reaction mixture kept for 8 h at 4° C. in fridge. The green precipitate was isolated by centrifugation and washed several times with diethylether. The pure asymmetric squarylium dye 17 was isolated.

Example 12

Synthesis Scheme of Asymmetrical Dye 18

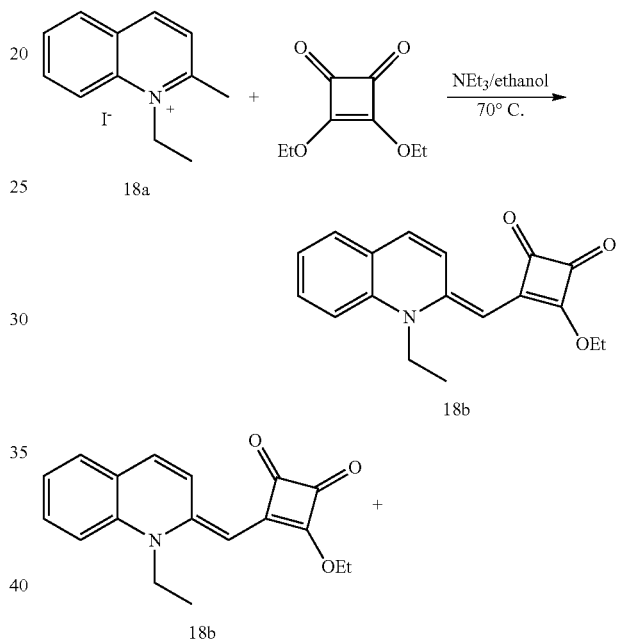

Example 13

Synthesis Scheme of Asymmetrical Dye 19

Example 14

UV-Vis of a ethanol solution of sensitizer dye 5 and for comparison standard black dye 23 and standard red dye 24 (see FIG. 12a).

The absorption of compound 5 is strongly red shifted with maximum at 664 nm. Compared to the Ruthenium based dyes 23 and 24 which are the conventional sensitizers used in DSSC, dye 5 has a strong absorption with extinction coefficient being almost 15 times higher.

Example 15

General Protocol for Preparing Solar Cells Containing a) Liquid Electrolyte and b) Polymer Gel Based Electrolyte The DSSCs are assembled as follows: A 30-nm-thick bulk $TiO_2$ blocking layer is formed on FTO (approx. 100 nm on glass or flexible substrate). A 10-30 μm-thick porous layer of semiconductor particles is screen printed on the blocking layer and sintered at 450° C. for half an hour. Dye molecules are adsorbed to the nanoporos particles via self-assembling out of a dye-solution. The dye-solution consists of a single dye or single dye and an additive, such as deoxycholic acid or a mixture of dye in different ratio or a mixture of dye in different ratio and an additive. The porous layer is filled with a) liquid electrolyte b) polymer gel electrolyte containing $I^-/I_3^-$ as redox couple (15 mM) by drop casting. A reflective platinum back electrode is attached with a distance of 6 μm from the porous layer.

The quality of the cells is evaluated by means of current density (J) and voltage (V) characteristics under illumination with light from a sulphur lamp (IKL Celsius, Light Drive 1000) with an intensity of 100 mW cm$^{-2}$. If not otherwise stated, the results are averages over three cells, each of 0.24 cm$^2$ active area.

Figure 10:
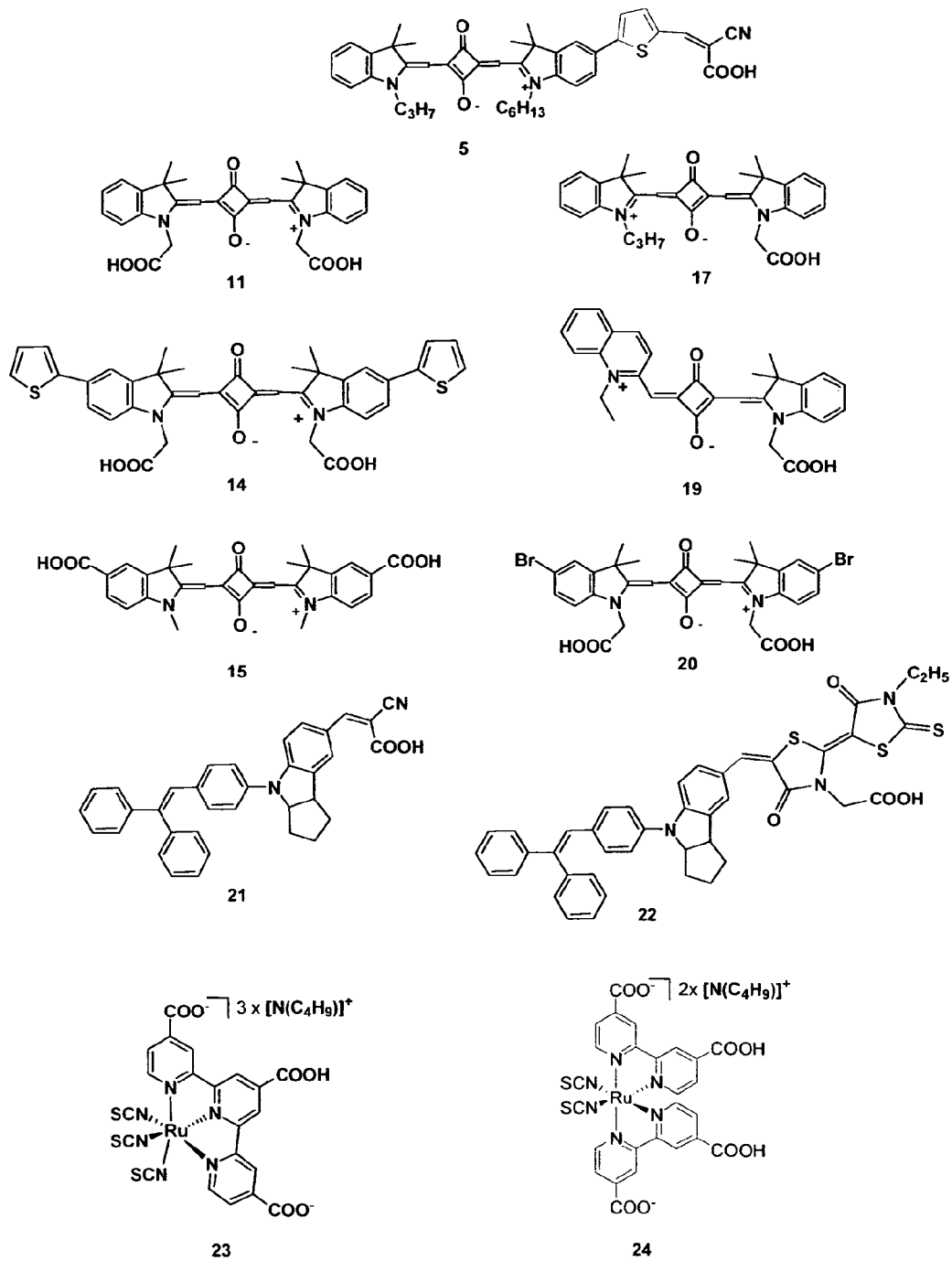
Figure 11:
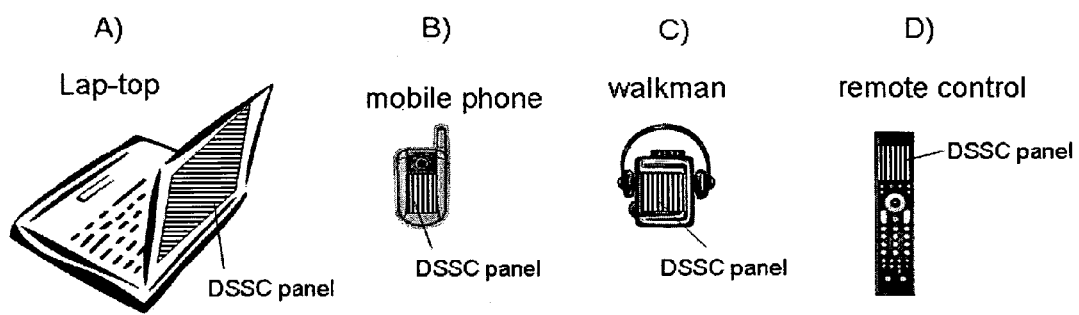

Measuring the Efficiency of DSSCs Containing One of the Sensitizer Dyes Produced by the Method of the Present Invention. The Respective Structure of the Dyes is Given in FIG. 10.

The efficiency of a photovoltaic device is calculated as follows:

$$\eta = P_{out}/P_{in} = FF \times (J_{SC} \times V_{OC})/(L \times A)$$

with $FF = V_{max} \times I_{max}/V_{oc} \times I_{sc}$

FF=fill factor
$V_{OC}$=open circuit voltage
$J_{SC}$=short current density
L=intensity of illumination=100 mW/cm$^2$
A=active area=0.24 cm$^2$
$V_{max}$=voltage at maximum power point
$J_{max}$=current at maximum power point An important parameter for judging the performance of a dye as sensitizer in DSSC is the IPCE curve. The IPCE curve reflects the photo-activity of the sensitizer dyes at different wavelengths (IPCE=incident photon to current efficiency).

For having better comparison by measuring the efficiency of DSSCs containing the sensitizer dyes of the present invention in most cases, as reference, a cell containing the commercial standard red dye (so called bisTBA-Ru535 or N719) or black dye (so called Ru620-1H3TBA or N749) is prepared under same conditions.

Example 16

Efficiency of DSSCs prepared by method described in Example 1a with sensitizer dye 5 and as comparison with sensitizer dye 17.

The two dyes belong to the same class of dyes, namely squarylium dyes. Both have only one anchor group, but sensitizer dye 5 has the anchoring group according claim 1. As claimed in Example 3, molecular modeling, due to the thiophene unit introduced at the core oft dye 5 a red shift in absorption from 630 nm to 660 nm is achieved.

| Sensitizer | $J_{SC}$ [mA/cm$^2$] | $V_{OC}$ [mV] | FF [%] | η [%] |
|---|---|---|---|---|
| 5[1] | 8.3 | 650 | 75 | 4.05 |
| 17[1] | 3.0 | 710 | 78 | 1.67 |

[1]TiO$_2$ dye-coating from 0.1 mM dye solution + with additive deoxycholic acid 20 mM.
[2]TiO$_2$ dye-coating from 0.3 mM dye solution + with additive deoxycholic acid 20 mM.

The efficiency of the DSSC prepared with sensitizer dye 5 shows has much higher efficiency as the dye 17 from the same class of organic dyes but without the anchoring group.

The photo-activity of sensitizer 5 is higher than of sensitizer 17 and extended in the longer wavelength region of the solar spectrum with the maximum at 690-700 nm (see FIG. 12b).

This is the highest efficiency of a DSSC ever reported for a device prepared by using an organic dye absorbing light in long wavelength range of solar spectrum >600 nm. All other organic dyes showing good performance in DSSC absorb light in the range of 300-550 nm.

The superiority of the sensitizer dye 5 with the anchoring group according claim 1 over other organic dyes is reflected by the fact that this sensitizer dye can be used in mixture with other sensitizer dye resulting in higher efficiency of the solar cell than using a single sensitizer dye. The inventors name this type of solar cell device in which more than one dye are used as sensitizer for harvesting the light Multiple-dyes sensitized solar cell (M-DSSC). Beside sensitizer dye 5, the mixture can contain one or more other dyes. Examples are given for mixture of sensitizer dye 5 with standard black dye 23 (Example 15), with one other organic dye such as 21 or 22 (Example 16 and 17), with two other dyes, such as 21 and 23 (Example 18), or 22 and 23 (Example 19).

Example 17

Efficiency of M-DSSC containing sensitizer dye 5 and the standard black dye 23 prepared by method described in Example 1a. For comparison also DSSCs prepared with the respective single sensitizer dye were prepared and measured.

| Sensitizer | $J_{SC}$ [mA/cm$^2$] | $V_{OC}$ [mV] | FF [%] | η [%] |
|---|---|---|---|---|
| 5[1] | 13.5 | 665 | 73 | 6.53 |
| 23[2] | 12.8 | 755 | 74 | 7.12 |
| Mixture 5 and 23[3] | 16.1 | 675 | 72 | 7.82 |

[1]TiO$_2$ dye-coating from 0.125 mM dye solution + with additive deoxycholic acid 12.5 mM.
[2]TiO$_2$ dye-coating from 0.375 mM dye solution + with additive deoxycholic acid 20 mM.
[3] TiO$_2$ dye-coating from a dyes mixture solution (dye 5 0.125 mM, +dye 23 0.375 mM+with additive deoxycholic acid 20 mM).

By optimizing dye-solution concentration of 5 from which the nanoporous TiO2-layer was coated the efficiency of the DSSC prepared with single dye 5 could be improved when comparing with results from example before.

By using a solution in which the dyes are mixed in ration 1:3 the efficiency DSSC is increased. This is mostly due to the increased short current density.

Usually, in the field of DSSC standard black dye 23 is preferably used instead standard red dye 24 when high photo-activity in the long wavelength region of solar spectrum is needed. By comparing the IPCE curves of 5 and standard black dye 23, it can be seen that dye 5 having anchoring group according claim 1 shows much higher photo-activity in the range of 550-750 nm than black dye 23.

Further, in the IPCE curves it can be seen that the incident-photon-conversion-efficiencies of the two dyes 5 and 23 behave in an additive way; therefore the dye mixture has better performance than the single dyes (see FIG. 12c).

This is the first time that such a phenomenon is realized.

Example 18

Efficiency of M-DSSC containing sensitizer dye 5 and the organic dye 21 prepared by method described in Example 1a. For comparison also DSSCs prepared with the respective single sensitizer dye were prepared and measured.

| Sensitizer | $J_{SC}$ [mA/cm$^2$] | $V_{OC}$ [mV] | FF [%] | η [%] |
|---|---|---|---|---|
| 5[1] | 13.5 | 665 | 73 | 6.53 |
| 21[2] | 14.8 | 685 | 72 | 7.32 |
| Mixture 5 and 21[3] | 21.0 | 655 | 70 | 9.61 |

[1]TiO$_2$ dye-coating from 0.125 mM dye solution + with additive deoxycholic acid 12.5 mM.
[2]TiO$_2$ dye-coating from 0.125 mM dye solution + with additive deoxycholic acid 12.5 mM.
[3]TiO$_2$ dye-coating from a dyes mixture solution (dye 5 0.125 mM, + dye 21 0.125 mM + with additive deoxy-cholic acid 20 mM).

Both dyes show high efficiencies. By using a solution in which the dyes are mixed in 1:1 ratio the efficiency of the DSSC devise increases. This is mostly due to the increased short current density.

By comparing the IPCE curves of 5 and dye 21, it can be seen that dye 5 is photo-active in the range of 550-750 nm where standard dyes 23 and 24 and organic dye 21 doesn't have any photo-activity (see FIG. 12d).

The IPCE curve of the dye mixture is a mirror of the added IPCE curve of the single dyes. This is the reason why the dye mixture performs better than the single dyes.

This is the first time that such a mixture of organic dye in DSSC is reported.

Example 19

Efficiency of M-DSSC containing sensitizer dye 5 and the organic dye 22 prepared by method described in Example 1a. For comparison also DSSCs prepared with the respective single sensitizer dye were prepared and measured.

| Sensitizer | $J_{SC}$ [mA/cm$^2$] | $V_{OC}$ [mV] | FF [%] | η [%] |
|---|---|---|---|---|
| 5[1] | 13.3 | 620 | 74 | 6.13 |
| 22[2] | 11.1 | 665 | 69 | 5.07 |
| Mixture 5 and 22[3] | 18.4 | 630 | 71 | 8.18 |

[1]TiO$_2$ dye-coating from 0.125 mM dye solution + with additive deoxycholic acid 12.5 mM.
[2]TiO$_2$ dye-coating from 0.125 mM dye solution + with additive deoxycholic acid 12.5 mM.
[3]TiO$_2$ dye-coating from a dyes mixture solution (dye 5 0.125 mM, + dye 22 0.125 mM + with additive deoxy-cholic acid 20 mM).

Both dyes show high efficiencies. By using a solution in which the dyes are mixed in 1:1 ratio the efficiency of the DSSC devise increases. This is due to the additive behavior of the individual short current density.

By comparing the IPCE curves of 5 and dye 22, it can be seen that dye 5 is photo-active in the range of 550-750 nm where standard dyes 23 and 24 and organic dye 21 doesn't have any photo-activity (see FIG. 12e).

The IPCE curve of the dye 22 is extended to the red when using the dyes mixture.

Example 20

Efficiency of M-DSSC prepared by method described in Example 1a and containing three sensitizer mixed: sensitizer dye 5, standard black dye 23 and organic dye 21. For comparison also DSSCs prepared with the respective single sensitizer dye were prepared and measured.

| Sensitizer | $J_{SC}$ [mA/cm$^2$] | $V_{OC}$ [mV] | FF [%] | η [%] |
|---|---|---|---|---|
| 5[1] | 13.5 | 665 | 73 | 6.53 |
| 23[2] | 12.8 | 755 | 74 | 7.12 |
| 21[1] | 14.8 | 685 | 72 | 7.32 |
| Mixture 5, 21 and 23[3] | 22.0 | 670 | 70 | 10.25 |

[1]TiO$_2$ dye-coating from 0.125 mM dye solution + with additive deoxycholic acid 12.5 mM.
[2]TiO$_2$ dye-coating from 0.125 mM dye solution + with additive deoxycholic acid 12.5 mM.
[3]TiO$_2$ dye-coating from a dyes mixture solution (dye 5 0.125 mM, + dye 22 0.125 mM + dye 23 0.375 mM with additive deoxycholic acid 20 mM).

The three dyes have similar efficiency as single sensitizer. By mixing the dyes higher efficiency of DSSC is achieved. By using a solution in which the dyes are mixed in 1:1 ratio the efficiency of the DSSC devise increases. The dyes are photoactive in different regions of solar spectrum. The IPCE curve of the mixture is extended to the red region due to effect of black dye, and is more intense in the range of 580-780 nm due to dye 5 (see FIG. 12f).

This is the first time that a DSSC made by employing a mixture of three dyes is reported.

Usually, when two or more dyes are mixed the gain that is achieved by addition of the harvested light by second dye is lost due to decrease of the performance of the first dye. To show this, three examples that the inventors investigated are in following disclosed.

In a previous patent application of MSL-Sony WO2005/024866—Tandem cell we disclose a possibility to avoid the loss mentioned above when using two dyes. [6]

In order to have an increase of DSSC efficiency, the device needs to be built in the "Tandem geometry". In this case the dyes are not mixed, they are coated on two nanoporous layers and used in the device in two separate compartments. For production, this is device assembly is not really practicable, because is a more complicated costly procedure.

Example 21

In this example, a mixture of standard black dye 23 and sensitizer dye 19 from the same class of squarylium dye and with only one anchor group as dye 5, but without the anchoring group according claim 1 is shown. The absorption maximum of dye 19 is in the same range as dye 5.

Efficiency of M-DSSC containing the organic sensitizer dye 23 and 19 prepared by method described in Example 1b. For comparison also DSSCs with the respective single sensitizer dye were prepared and measured. The dye-solution concentration employed for nanoporous TiO$_2$ coating are the in previous determined optimum concentrations.

| Sensitizer | $J_{SC}$ [mA/cm$^2$] | $V_{OC}$ [mV] | FF [%] | η [%] |
|---|---|---|---|---|
| 19[1] | 3.6 | 530 | 68 | 1.29 |
| 23[2] | 13.2 | 595 | 55 | 4.28 |
| Mixture 19 and 23[3] | 8.8 | 535 | 61 | 2.85 |

[1]TiO$_2$ dye-coating from 0.125 mM dye solution + with additive deoxycholic acid 20 mM.
[2]TiO$_2$ dye-coating from 0.375 mM dye solution + with additive deoxycholic acid 20 mM.
[3]TiO$_2$ dye-coating from a dyes mixture solution (dye 19 0.125 mM, + dye 23 0.375 mM + with additive de-oxycholic acid 20 mM).

Clearly to see from the data is that by mixing the dyes no higher efficiency of the DSSC device is achieved. This is mainly due to decreased in short current density of the standard sensitizer dye 23 by addition of 19.

This is confirmed by recording the IPCE curves. In this case, the black dye 23 alone has a much higher photo-activity when used as single dye than mixed with sensitizer dye 19. There is no additive behavior observable (see FIG. 12g).

Example 22

In this example, a mixture of standard red dye 24 and sensitizer dye 14 from the same class of squarylium dye and with thiophene moiety attached to the core, similar to dye 5, but without the anchoring group according claim 1 is shown.

Efficiency of M-DSSC containing the organic sensitizer dye 24 and 14 prepared by method described in Example 1b. For comparison also DSSCs with the respective single sensitizer dye were prepared and measured. The dye-solution concentration employed for nanoporous TiO$_2$ coating are the in previous determined optimum concentrations.

| Sensitizer | $J_{SC}$ [mA/cm$^2$] | $V_{OC}$ [mV] | FF [%] | η [%] |
|---|---|---|---|---|
| 14[1] | 8.9 | 675 | 67 | 4.04 |
| 24[2] | 20.4 | 685 | 64 | 8.92 |
| Mixture 14 and 24[3] | 14.1 | 655 | 55 | 4.36 |

[1]TiO$_2$ dye-coating from 0.125 mM dye solution + with additive deoxycholic acid 20 mM.
[2]TiO$_2$ dye-coating from 0.3 mM dye solution + no additive.
[3]TiO$_2$ dye-coating from a dyes mixture solution (dye 14 0.125 mM, + dye 24 0.3 mM + no additive).

Clearly to see from the data is that by mixing the dyes no higher efficiency of the DSSC device is achieved. This is mainly due to decreased in short current density of the standard sensitizer dye 24 by addition of 14.

This is confirmed by recording the IPCE curves. In this case, the red dye 24 alone has a much higher photo-activity when used as single dye than mixed with sensitizer dye 14. There is no additive behavior (see FIG. 12h).

Example 23

In this example, a mixture of standard red dye 24 and sensitizer dye 17 from the same class of squarylium dye and with one anchoring group, similar to dye 5, but without the anchoring group according claim 1 is shown.

Efficiency of M-DSSC containing the organic sensitizer dye 24 and 17 prepared by method described in Example 1b. For comparison also DSSCs with the respective single sensitizer dye were prepared and measured. The dye-solution concentration employed for nanoporous TiO$_2$ coating are the in previous determined optimum concentrations.

| Sensitizer | $J_{SC}$ [mA/cm$^2$] | $V_{OC}$ [mV] | FF [%] | η [%] |
|---|---|---|---|---|
| 17[1] | 5.5 | 615 | 69 | 2.30 |
| 24[2] | 24.1 | 700 | 44 | 7.33 |
| dyes mixture[3] | 20.1 | 695 | 52 | 7.32 |

[1]TiO$_2$ dye-coating from 0.3 mM dye solution + with additive deoxycholic acid 20 mM.
[2]TiO$_2$ dye-coating from 0.3 mM dye solution + no additive.
[3]TiO$_2$ dye-coating from a dyes mixture solution (dye 17 0.3 mM, + dye 24 0.3 mM + no additive).

By adding dye 17 to standard red dye 24 a decrease in efficiency and IPCE curve is clearly to see (see FIG. 12i).

[1] M. K. Nazeeruddin, A. Kay, I. Rodicio, R. Humphry-Baker, E. Müller, P. Liska, N. Vlachoppoulos, M. Grätzel, *J. Am. Chem. Soc.*, 1993, 115, 6382.
[2] Y. Tachibana, J. E. Moser, M. Grätzel, D. R. Klug, J. R. Durrant, *J. Phys. Chem.* 1996, 100, 20056.
[3] a) T. Horiuchi, H. Miura, S. Uchida, *Chem. Commun.* 2003, 3036; b) K. Sayama, S. Tsukagoshi, K. Hara, Y. Ohga, A. Shinpou, Y. Abe, S. Suga, H. Arakawa, *J. Phys. Chem. B*, 2002, 106, 1363; c) K. Ham, T. Kinoshita, K. Sayama, H. Sugihara, H. Arakawa, *Sol. Energy Mater. Sol. Cells.* 2000, 64, 115.
[4] a) K. G. Thomas, P. V. Kamat, *Acc Chem. Res.* 2003, 36, 888; b) K. Y. Law, Chem. Rev. 1993, 93, 449-486; c) Kim, Sung-Hoon; Han, Sun-Kyung, *High performance squarylium dyes for high-tech use.* Coloration Technology (2001), 117(2), 61-67. d) Chu, et al. *Benzpyrylium squarylium and croconylium dyes, and processes for their preparation and use*, US1999/065350; e) Satsuki, Makoto; Oga, Yasuyo; Shinpo, Akira; Suga, Sadaharu, *Squarylium indole cyanine dyes with good solubility in organic solvents, preparation thereof and light absorbers therefrom*, JP 2002/294094; f) Lin, Tong; Peng, Bi-Xian, *Synthesis and spectral characteristics of some highly soluble squarylium cyanine dyes*, Dyes and Pigments 1997, 35(4), 331-338.
[5] a) K. Hara, T. Sato, R Katoh, A. Furube, T. Yoshihara, M. Murai, M. Kurashige, S. Ito, A. Shinpo, S. Suga, H. Arakawa, *Adv. Funct. Mater.* 2005, 15, 246; b) K. Hara, Z. Wang, T. Sato, A. Furube, R. K Atoh, H. Sugihara, Y. Dan-oh, A. Shinpo, S. Suga, *J. Phys. Chem.* 2005, 109, 15476.
[6] WO 2005/024866

The invention claimed is:
1. A dye comprising an anchoring group in its molecular structure, wherein the anchoring group allows a covalent coupling of the dye to a surface, and wherein the anchoring group is represented by formula 1

(formula 1)

wherein
attachment of the anchoring group within the molecular structure of the dye is at the terminal carbon marked with an asterisk in formula 1;
G is selected from the group consisting of —COOH, —SO$_3$H, —PO$_3$H$_2$, —BO$_2$H$_2$, —SH, —OH, and —NH$_2$;
A is selected from the group consisting of H, —CN, —NO$_2$, —COOR, —COSR, —COR, —CSR, —NCS, —CF$_3$, —CONR$_2$, —OCF$_3$, and C$_6$H$_{5-m}$F$_m$, wherein m is 1 to 5, R being H or any straight or branched alkyl chain of formula —C$_n$H$_{2n+1}$, wherein n is 0 to 12, or any substituted or non-substituted phenyl or biphenyl;
and wherein
the dye is represented by formula 2

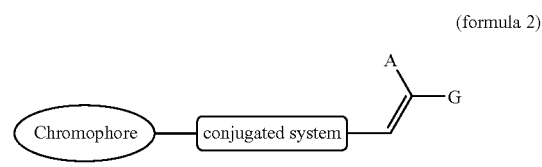

(formula 2)

or formula 4

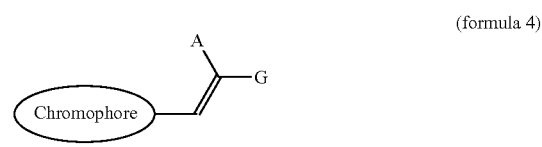

(formula 4)

wherein the chromophore is a squarylium dye derivative or a croconium dye derivative that absorbs visible light, IR light, or both visible and IR light, and the squarylium dye derivative or the croconium dye derivative has aromatic ring systems Ar$_1$ and Ar$_2$ attached to a squaric acid derivative or to a croconic acid derivative.

2. The dye according to claim 1, wherein the dye is represented by formula 2 and the conjugated system is represented by at least one moiety shown in formula 3

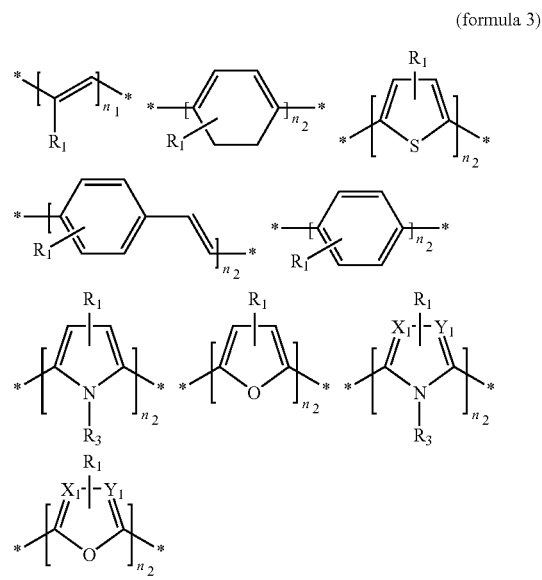

(formula 3)

wherein
$n_1$ and $n_2$ are each 0 to 12;
R$_3$ is selected from the group consisting of H, —(CH$_2$)$_n$CH$_3$, —(CH$_2$)$_n$—COOR, —(CH$_2$)$_n$—OR, —(CH$_2$)$_n$—SR, —(CH$_2$)$_n$—NR$_2$, and —((CH$_2$)$_p$—O)$_n$—CH$_3$, wherein p is 1 to 4 and n is 0 to 12;
R$_1$ is selected from the group of halogens consisting of Cl, Br, F, and I, or selected from the group consisting of NO$_2$, NH$_2$, CN, SO$_3$H, OH, H, —(CH$_2$)$_n$CH$_3$, —$(CH_2)_n$—COOR, —$(CH_2)_n$—OR, —$(CH_2)_n$—SR, —$(CH_2)_n$—$NR_2$, and —$((CH_2)_p$—$O)_n$—$CH_3$, wherein p is 1 to 4 and n is 0 to 12, R being H, any straight or branched alkyl chain of formula —$C_nH_{2n+1}$, wherein n is 0 to 12, or any substituted or non-substituted phenyl or biphenyl; and $X_1$ and $Y_1$, at each occurrence, are independently selected from the group consisting of O, S, and NR.

3. The dye according to claim 2, wherein said chromophore is represented by formula 5

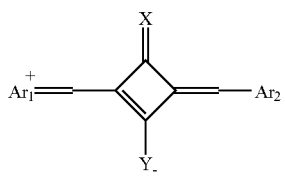

(formula 5)

or by formula 6

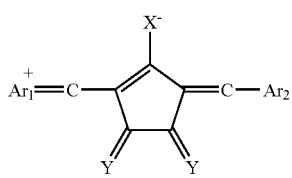

(formula 6)

wherein X and Y, at each occurrence, are independently selected from the group consisting of O, S, NR, and $C(CN)_2$, and wherein $Ar_1$ and $Ar_2$ are the same or different and, at each occurrence, are independently selected from the group consisting of aromatic and heteroaromatic systems as shown in formula 7, and any combination of the aromatic and heteroaromatic systems shown in formula 7, (formula 7)

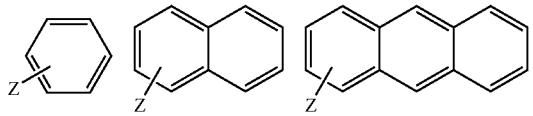

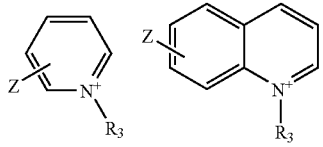

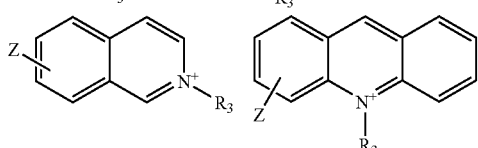

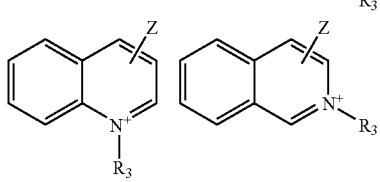

-continued

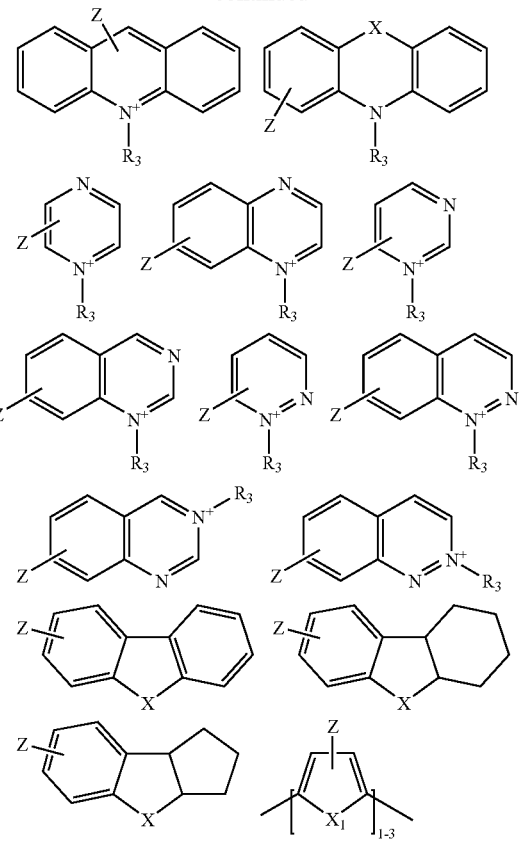

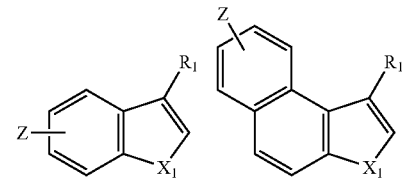

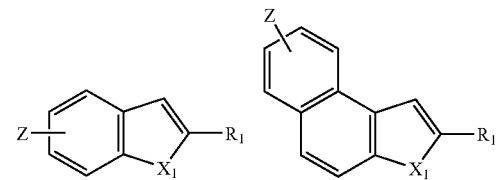

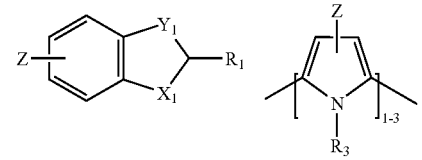

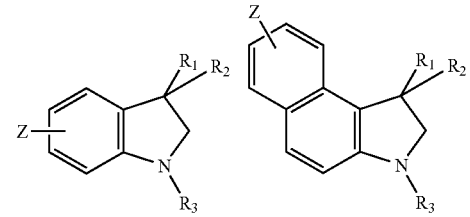

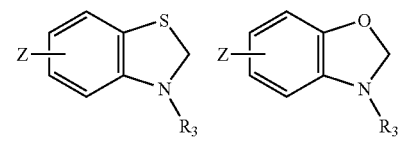

-continued

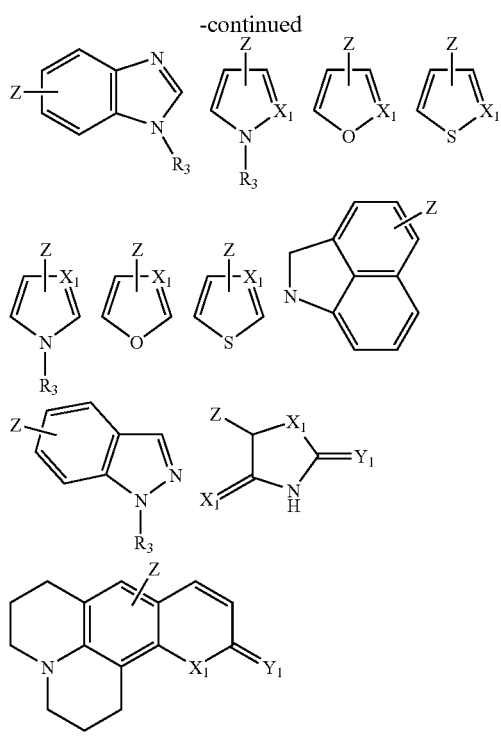

wherein
$R_1$ and $R_2$ are the same or different and are, at each occurrence, independently selected from the group as defined for R in claim 2,
$R_3$ is as defined in claim 2,
$X_1$ and $Y_1$ are the same or different and are, at each occurrence, independently a $CH_2$ group or selected from the group consisting of C, O, S, NR, and
Z is one or more moieties which, at each occurrence, is independently selected from the group consisting of Cl, Br, F, I, $NO_2$, $NH_2$, CN, $SO_3H$, OH, H, —$(CH_2)_nCH_3$, —$(CH_2)_n$—COOR, —$(CH_2)_n$—OR, —$(CH_2)_n$—$SR_2$, —$(CH_2)_n$—$NR_2$, —$((CH_2)_p$—O$)_n$—$CH_3$, an aromatic system, and a heteroaromatic system
wherein
p is 1 to 4, and
n is 0 to 12.

4. The dye according to claim 1, wherein the chromophore is a metal complex represented by formula 9

$$LL'M(X)_p \qquad \text{(formula 9)}$$

wherein
M is Ruthenium Ru, Osmium Os, or Iridium Ir;
X is independently selected from Cl, Br, I, CN, and —NCS;
p is an integer of 0 to 4; and
L and L' are organic heterocyclic ligands comprising nitrogen atoms which are linked by N-atoms to the respective metal M, and wherein either one of L and L' or both L and L' are linked to the anchoring group(s) or the conjugated system(s) by any of the C-atoms within the ligands.

5. The dye according to claim 4, wherein the ligands L and L' are independently, at each occurrence, mono- or polycyclic, condensed rings or such rings covalently bonded to each other.

6. The dye according to claim 4, wherein the ligands L and L' are independently, at each occurrence, selected from the group consisting of ligands of formula 10

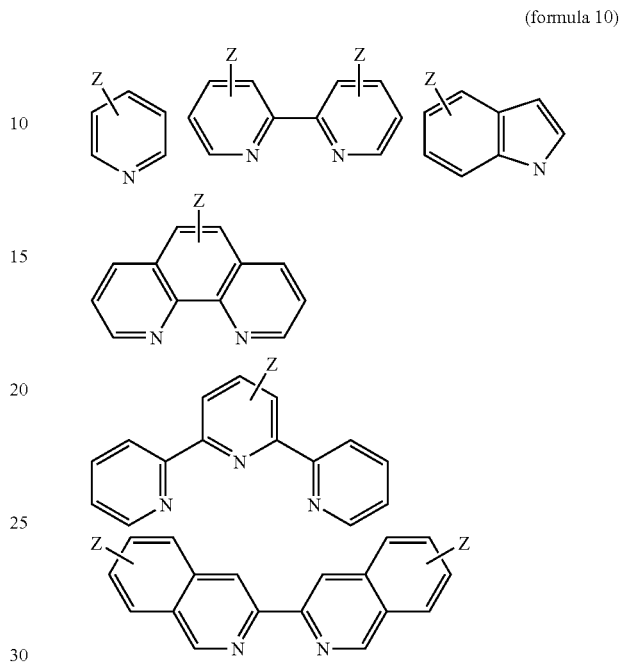

(formula 10)

wherein Z is one or more moieties which, at each occurrence, is independently selected from the group consisting of Cl, Br, F, I, $NO_2$, $NH_2$, CN, $SO_3H$, OH, H, —$(CH_2)_nCH_3$, —$(CH_2)_n$—COOR, —$(CH_2)_n$—OR, —$(CH_2)_n$—SR, —$(CH_2)_n$—$NR_2$, —$((CH_2)_p$—O$)_n$—$CH_3$, an aromatic system, and a heteroaromatic system, wherein p is 1 to 4, and n is 0 to 12.

7. The dye according to claim 1, wherein the chromophore is a metal complex represented by formula 11

$$L''M' \qquad \text{(formula 11)}$$

wherein
M' is Palladium Pd, Platinum Pt or Nickel Ni; and
L'' is an organic heterocyclic ligand comprising nitrogen atoms which are linked by N-atoms to the respective metal M' and to the anchoring group(s) or the conjugated system(s) by any of the C-atoms within the ligand.

8. The dye according to claim 7, wherein the ligand L'' is selected from the group consisting of ligands of formula 12

(formula 12)

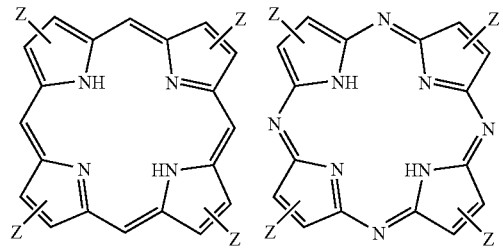

-continued

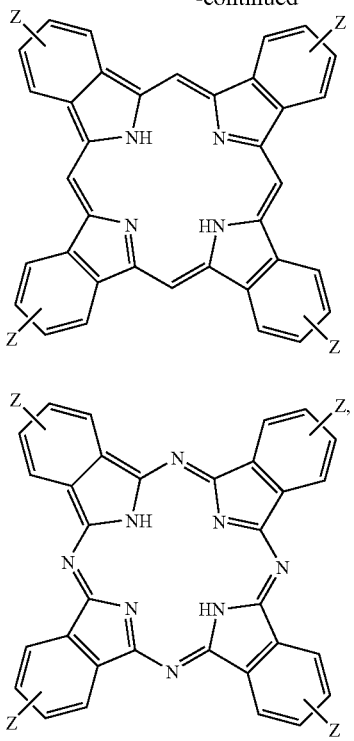

wherein Z is one or more moieties which, at each occurrence, is independently selected from the group consisting of Cl, Br, F, I, $NO_2$, $NH_2$, CN, $SO_3H$, OH, H, —$(CH_2)_nCH_3$, —$(CH_2)_n$—COOR, —$(CH_2)_n$—OR, —$(CH_2)_n$—SR, —$(CH_2)_n$—$NR_2$, —$((CH_2)_p$—O$)_n$—$CH_3$, an aromatic system, and a heteroaromatic system, wherein p is 1 to 4, and n is 0 to 12.

9. The dye according to claim 1, wherein the chromophore is represented by one of the structures shown in formula 15

(formula 15)

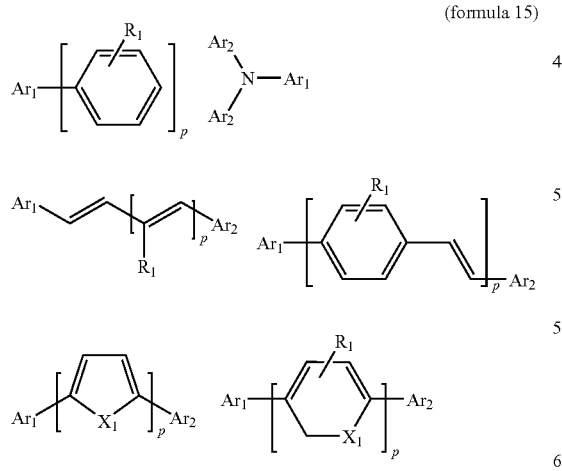

wherein
p is 0 to 4;
$Ar_1$ and $Ar_2$ are the same or different and, at each occurrence, are independently selected from the group consisting of aromatic and heteroaromatic systems as shown in formula 7, and any combination of the aromatic and heteroaromatic systems shown in formula 7, (formula 7)

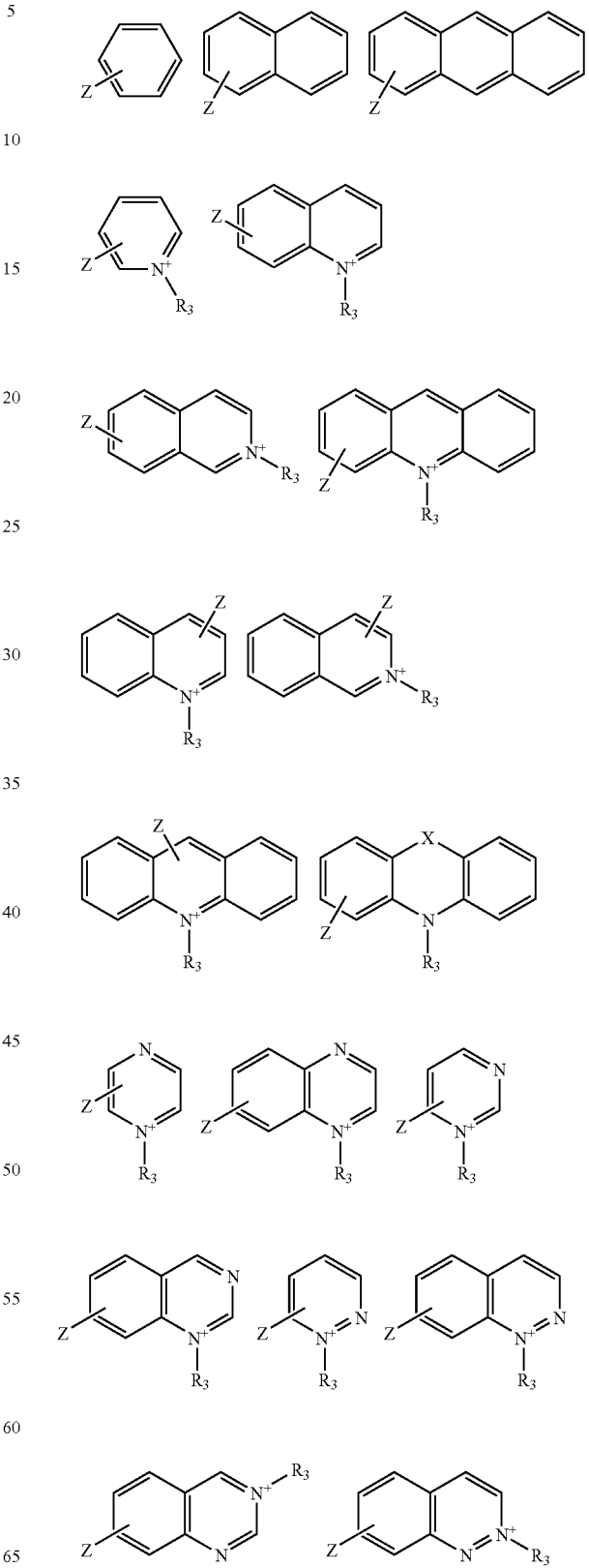

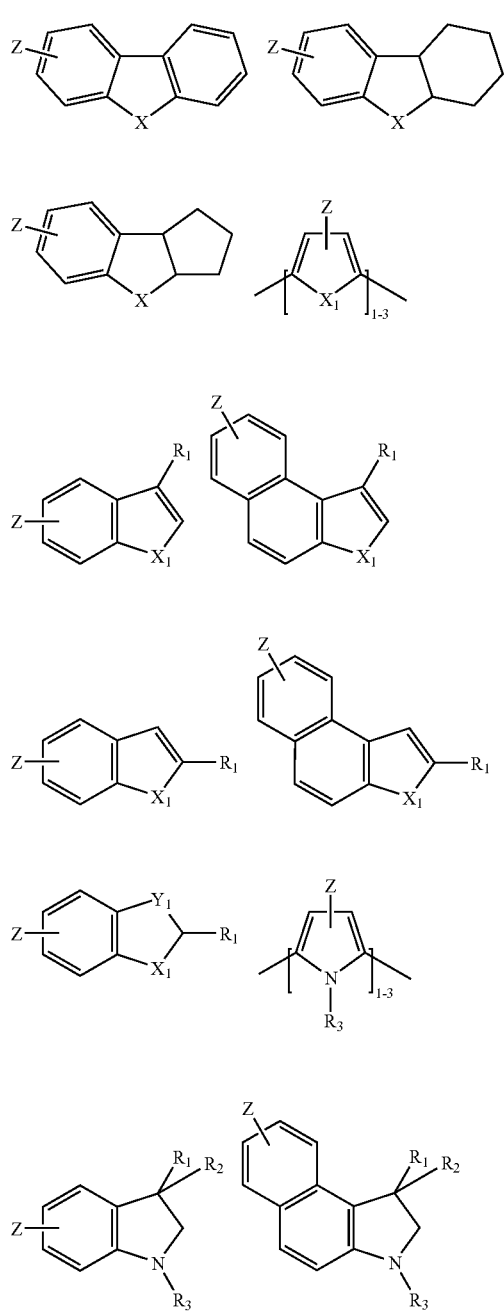
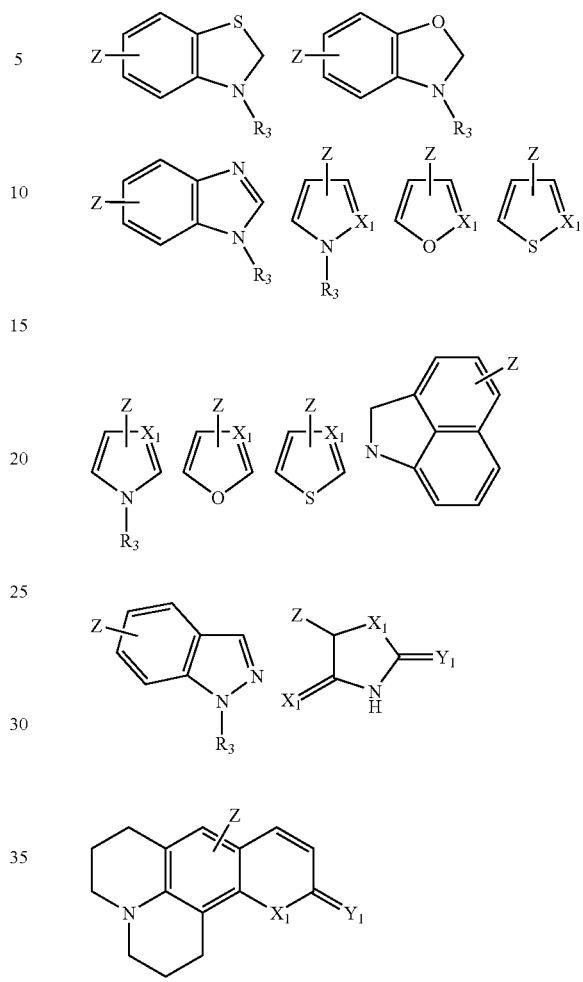

wherein
R₁ is selected from the group of halogens consisting of Cl, Br, F, and I, or selected from the group consisting of NO₂, NH₂, CN, SO₃H, OH, H, —(CH₂)ₙCH₃, —(CH₂)ₙ—COOR, —(CH₂)ₙ—OR, —(CH₂)ₙ—SR, —(CH₂)ₙ—NR₂, and —((CH₂)ₚ—O)ₙ—CH₃, wherein p is 1 to 4, R being H, any straight or branched alkyl chain of formula —CₙH₂ₙ₊₁, wherein n is 0 to 12, or any substituted or non-substituted phenyl or biphenyl; and
X₁ and Y₁, at each occurrence, are independently selected from the group consisting of CH₂, O, S, and NR.

10. The dye according to claim 1, represented by formula 16

(formula 16)

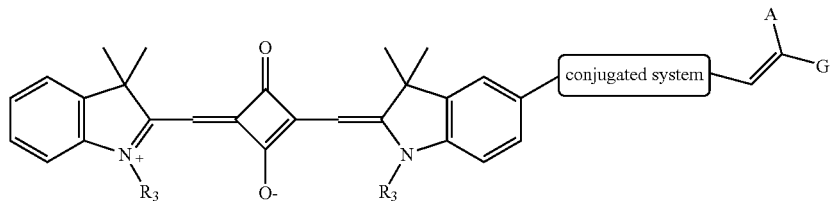

wherein the conjugated system is represented by at least one moiety shown in formula

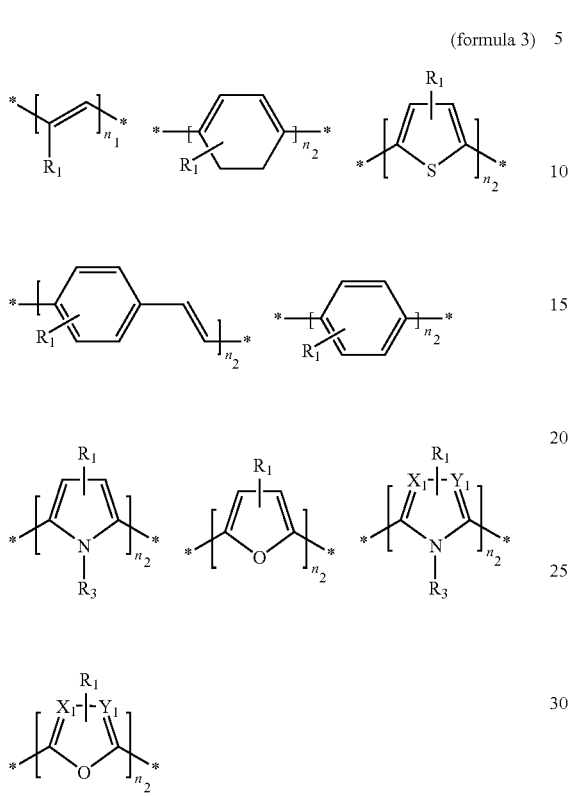

(formula 3)

wherein
$n_1$ and $n_2$ are each 0 to 12;
$R_3$ is selected from the group consisting of H, —$(CH_2)_n$CH$_3$, —$(CH_2)_n$—COOR, —$(CH_2)_n$—OR, —$(CH_2)_n$—SR, —$(CH_2)_n$—NR$_2$, and —$((CH_2)_p$—O$)_n$—CH$_3$, wherein p is 1 to 4 and n is 0 to 12;
$R_1$ is selected from the group of halogens consisting of Cl, Br, F, and I, or selected from the group consisting of NO$_2$, NH$_2$, CN, SO$_3$H, OH, H, —$(CH_2)_n$CH$_3$, —$(CH_2)_n$—COOR, —$(CH_2)_n$—OR, —$(CH_2)_n$—SR, —$(CH_2)_n$—NR$_2$, and —$((CH_2)_p$—O$)_n$—CH$_3$, wherein p is 1 to 4 and n is 0 to 12, R being H, any straight or branched alkyl chain of formula —$C_nH_{2n+1}$, wherein n is 0 to 12, or any substituted or non-substituted phenyl or biphenyl.

11. The dye according to claim 10, represented by formula 17

12. The dye according to claim 1 represented by formula 18

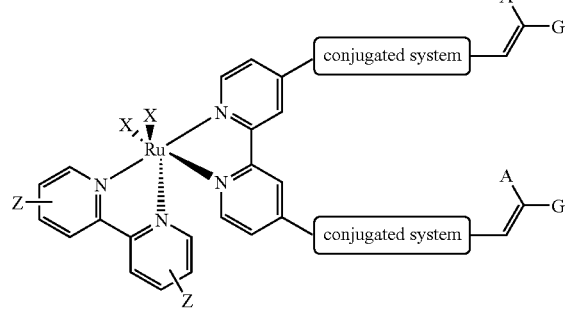

(formula 18)

wherein Z is one or more moieties which, at each occurrence, is independently selected from the group consisting of Cl, Br, F, I, NO$_2$, NH$_2$, CN, SO$_3$H, OH, H, —$(CH_2)_n$CH$_3$, —$(CH_2)_n$—COOR, —$(CH_2)_n$—OR, —$(CH_2)_n$—SR, —$(CH_2)_n$—NR$_2$, —$((CH_2)_p$—O$)_n$—CH$_3$, an aromatic system and a heteroaromatic system
wherein
p is 1 to 4,
n is 0 to 12,
and wherein the conjugated system is represented by at least one moiety shown in formula 3

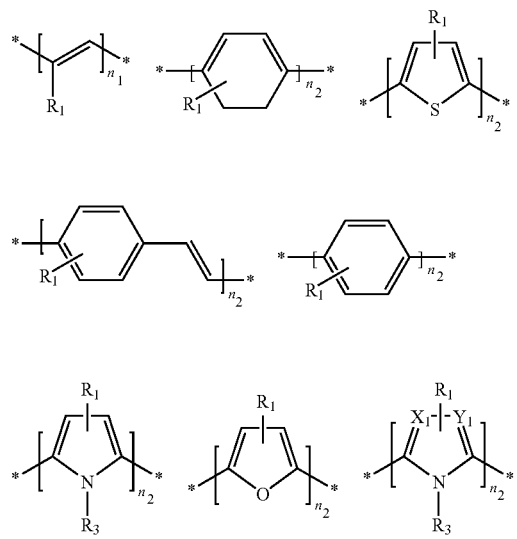

(formula 3)

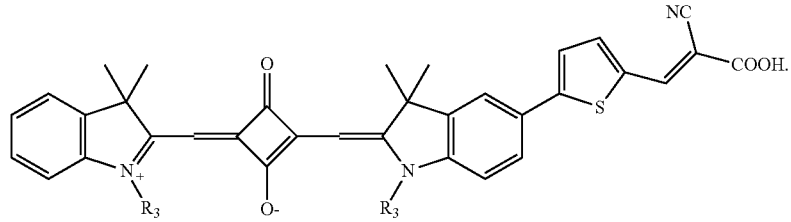

(formula 17)

-continued

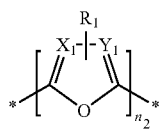

5 wherein $n_1$ and $n_2$ are each 0 to 12;

$R_3$ is selected from the group consisting of H, —$(CH_2)_n$CH$_3$, —$(CH_2)_n$—COOR, —$(CH_2)_n$—OR, —$(CH_2)_n$—SR, —$(CH_2)_n$—NR$_2$, and —$((CH_2)_p$—O$)_n$—CH$_3$, wherein p is 1 to 4 and n is 0 to 12;

$R_1$ is selected from the group of halogens consisting of Cl, Br, F, and I, or selected from the group consisting of NO$_2$, NH$_2$, CN, SO$_3$H, OH, H, —$(CH_2)_n$CH$_3$, —$(CH_2)_n$—COOR, —$(CH_2)_n$—OR, —$(CH_2)_n$—SR, —$(CH_2)_n$—NR$_2$, and —$((CH_2)_p$—O) —CH$_3$, wherein p is 1 to 4 and n is 0 to 12, R being H, any straight or branched alkyl chain of formula —$C_nH_{2n+1}$, wherein n is 0 to 12, or any substituted or non-substituted phenyl or biphenyl; and $X_1$ and $Y_1$, at each occurrence, are independently selected from the group consisting of O, S, and NR.

13. The dye according to claim 6 represented by formula 19

(formula 19)

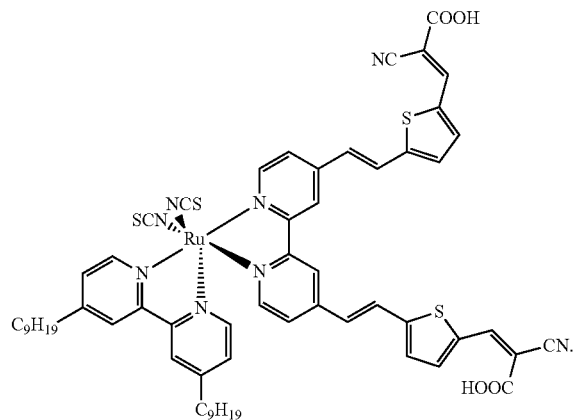

14. The dye according to claim 1 represented by formula 20

(formula 20)

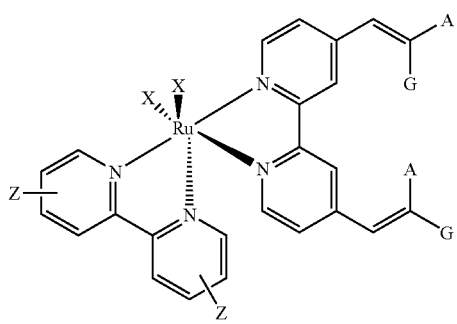

wherein Z is one or more moieties which, at each occurrence, is independently selected from the group consisting of Cl, Br, F, I, NO$_2$, NH$_2$, CN, SO$_3$H, OH, H, —$(CH_2)_n$CH$_3$, —$(CH_2)_n$—COOR, —$(CH_2)_n$—NR$_2$, —$((CH_2)_n$—NR$_2$, —$((CH_2)_p$—O$)_n$—CH$_3$, an aromatic system, and a heteroaromatic system wherein p is 1 to 4, and n is 0 to 12.

15. The dye according to claim 14 represented by formula 21

(formula 21)

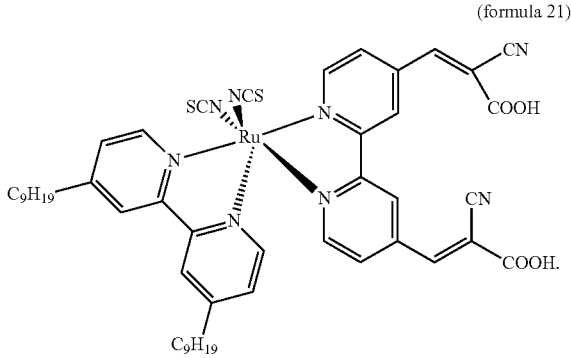

* * * * *